(12) United States Patent
Harada et al.

(10) Patent No.: US 8,390,691 B2
(45) Date of Patent: Mar. 5, 2013

(54) DEVICE AND METHOD FOR PROCESSING PHOTOGRAPHIC IMAGE DATA

(75) Inventors: Kouichi Harada, Kanagawa (JP);
Tomoo Mitsunaga, Kanagawa (JP);
Seiji Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 19 days.

(21) Appl. No.: 12/633,044

(22) Filed: Dec. 8, 2009

(65) Prior Publication Data

US 2010/0085460 A1  Apr. 8, 2010

Related U.S. Application Data

(63) Continuation of application No. 10/148,838, filed as application No. PCT/JP01/08721 on Oct. 3, 2001, now Pat. No. 7,719,573.

(30) Foreign Application Priority Data

| Oct. 3, 2000 | (JP) | 2000-303519 |
| Oct. 3, 2000 | (JP) | 2000-303520 |
| Oct. 6, 2000 | (JP) | 2000-307082 |

(51) Int. Cl.
*H04N 5/235* (2006.01)
*G03B 7/00* (2006.01)

(52) U.S. Cl. .................... 348/221.1; 348/362

(58) Field of Classification Search ........... 348/221.1, 348/220.1, 302–308, 311–324
See application file for complete search history.

(56) References Cited

U.S. PATENT DOCUMENTS

| 5,003,398 A | 3/1991 | Suzuki |
| 5,063,449 A | 11/1991 | Shibata et al. |
| 5,262,871 A * | 11/1993 | Wilder et al. ............ 348/307 |
| 5,416,611 A | 5/1995 | Tandon |
| 5,438,365 A * | 8/1995 | Yamashita et al. ........ 348/297 |
| 5,455,621 A | 10/1995 | Morimura |

(Continued)

FOREIGN PATENT DOCUMENTS

| EP | 0862321 A2 | 9/1998 |
| JP | 2-87785 | 3/1990 |

(Continued)

OTHER PUBLICATIONS

European Office Action for corresponding EP01972676.9-1241 issued on May 25, 2010.

*Primary Examiner* — Hung Lam
(74) *Attorney, Agent, or Firm* — K&L Gates LLP

(57) ABSTRACT

Disclosed herein is a photographing device that includes a number of light-receiving elements, a number of vertical transfer registers, a first drive-voltage applying electrode, and a second drive-voltage applying electrode. The light-receiving elements are arranged in a horizontal direction and a vertical direction. The vertical transfer registers transfers the electric charges accumulated in the light-receiving elements in the vertical direction. The first drive-voltage applying electrode is arranged parallel to the vertical transfer registers, for applying a drive voltage to a specific one of the vertical transfer registers. The second drive-voltage applying electrode is arranged perpendicular to the vertical transfer registers, for applying a second drive voltage to the vertical transfer registers at the same time. The electric charges accumulated in the light-receiving elements are transferred to the vertical transfer registers, due to the voltage output from the first drive-voltage applying electrode or the second drive-voltage applying electrode, or the voltages output from both electrodes. Therefore, the light-receiving elements can have different sensitivities, and the photographing device can photograph dynamic scenes in a broad dynamic range.

3 Claims, 42 Drawing Sheets

U.S. PATENT DOCUMENTS

| | | |
|---|---|---|
| 5,659,359 A | 8/1997 | Mochizuki et al. |
| 5,969,759 A * | 10/1999 | Morimoto ............... 348/311 |
| 6,141,049 A * | 10/2000 | Harada ................. 348/296 |
| 6,211,915 B1 | 4/2001 | Harada |
| 6,337,713 B1 * | 1/2002 | Sato ..................... 348/311 |
| 6,399,283 B1 | 6/2002 | Hoshi |
| 6,429,898 B1 * | 8/2002 | Shoda et al. ............ 348/316 |
| 6,507,365 B1 * | 1/2003 | Inoue et al. ............ 348/296 |
| 6,529,242 B1 | 3/2003 | Panicacci |
| 6,661,451 B1 | 12/2003 | Kijima et al. |
| 6,665,010 B1 * | 12/2003 | Morris et al. .......... 348/297 |
| 6,683,643 B1 | 1/2004 | Takayama et al. |
| 6,707,499 B1 | 3/2004 | Kung et al. |
| 6,765,617 B1 * | 7/2004 | Tangen et al. .......... 348/340 |
| 6,831,692 B1 | 12/2004 | Oda |
| 6,847,398 B1 | 1/2005 | Fossum |
| 6,882,366 B1 | 4/2005 | Kijima et al. |
| 6,930,716 B2 | 8/2005 | Yoshida |
| 6,970,195 B1 * | 11/2005 | Bidermann et al. ...... 348/308 |
| 7,030,920 B1 | 4/2006 | Hayashi et al. |
| 7,092,021 B2 | 8/2006 | Fossum et al. |
| 7,830,438 B2 * | 11/2010 | Fossum et al. .......... 348/296 |
| 2005/0083423 A1 * | 4/2005 | Nishi ................... 348/311 |
| 2005/0174452 A1 * | 8/2005 | Blerkom et al. ........ 348/294 |

FOREIGN PATENT DOCUMENTS

| | | |
|---|---|---|
| JP | 7-59012 | 3/1995 |
| JP | 9-191099 | 7/1997 |

* cited by examiner

| 0.043 | -0.661 | -0.661 | 0.043 |
| --- | --- | --- | --- |
| -0.661 | 10.28 | 10.28 | -0.661 |
| -0.661 | 10.28 | 10.28 | -0.661 |
| 0.043 | -0.661 | -0.661 | 0.043 |

FIG.34

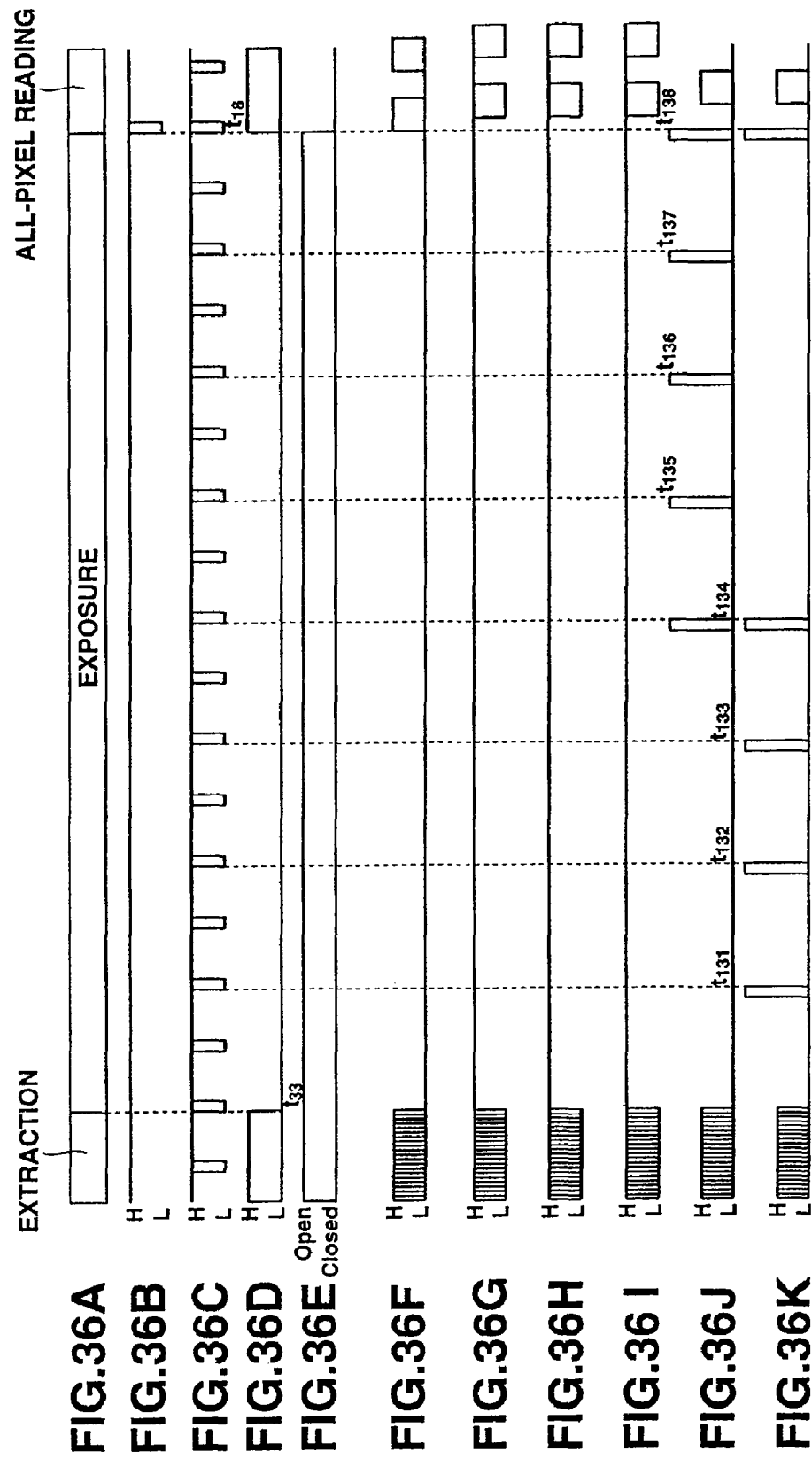

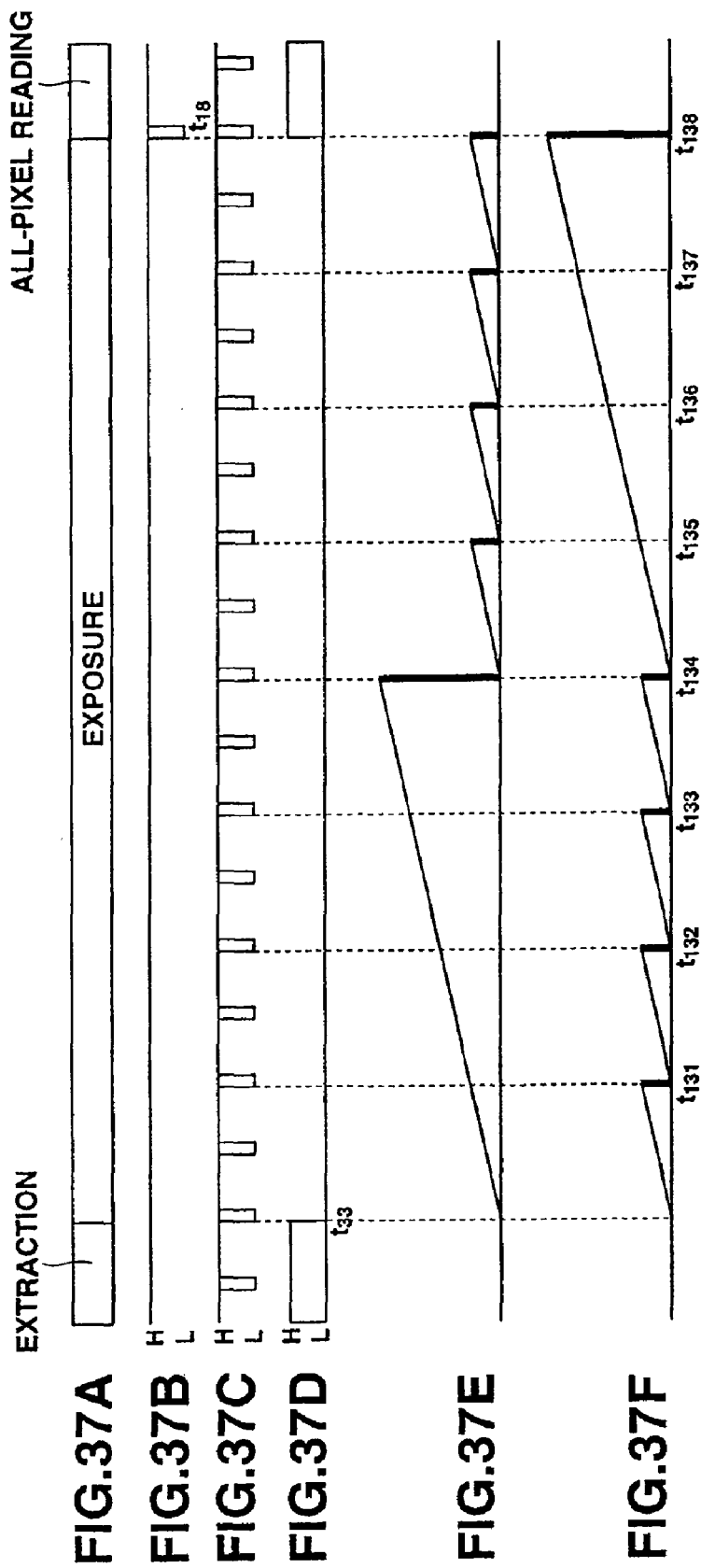

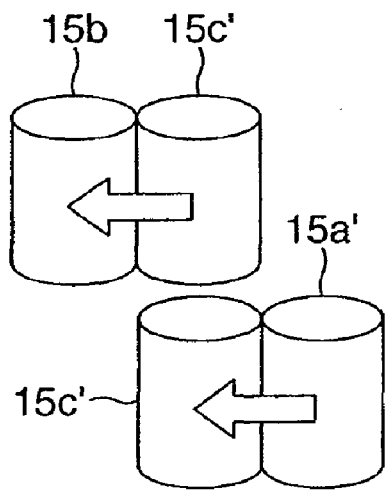
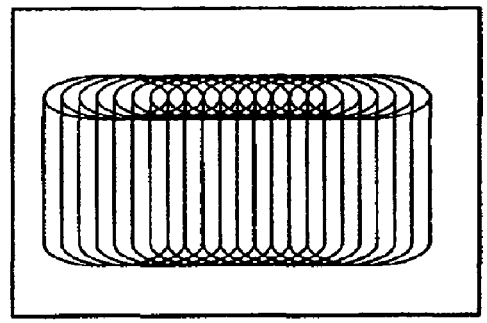
FIG.38A  FIG.38B
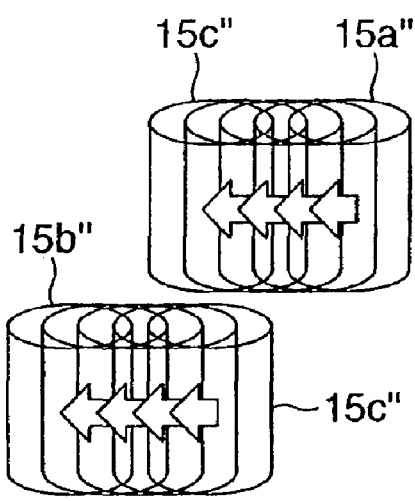
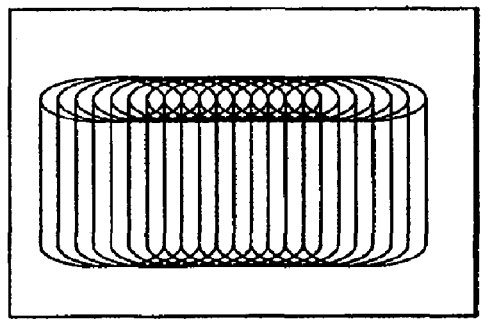
FIG.39A  FIG.39B

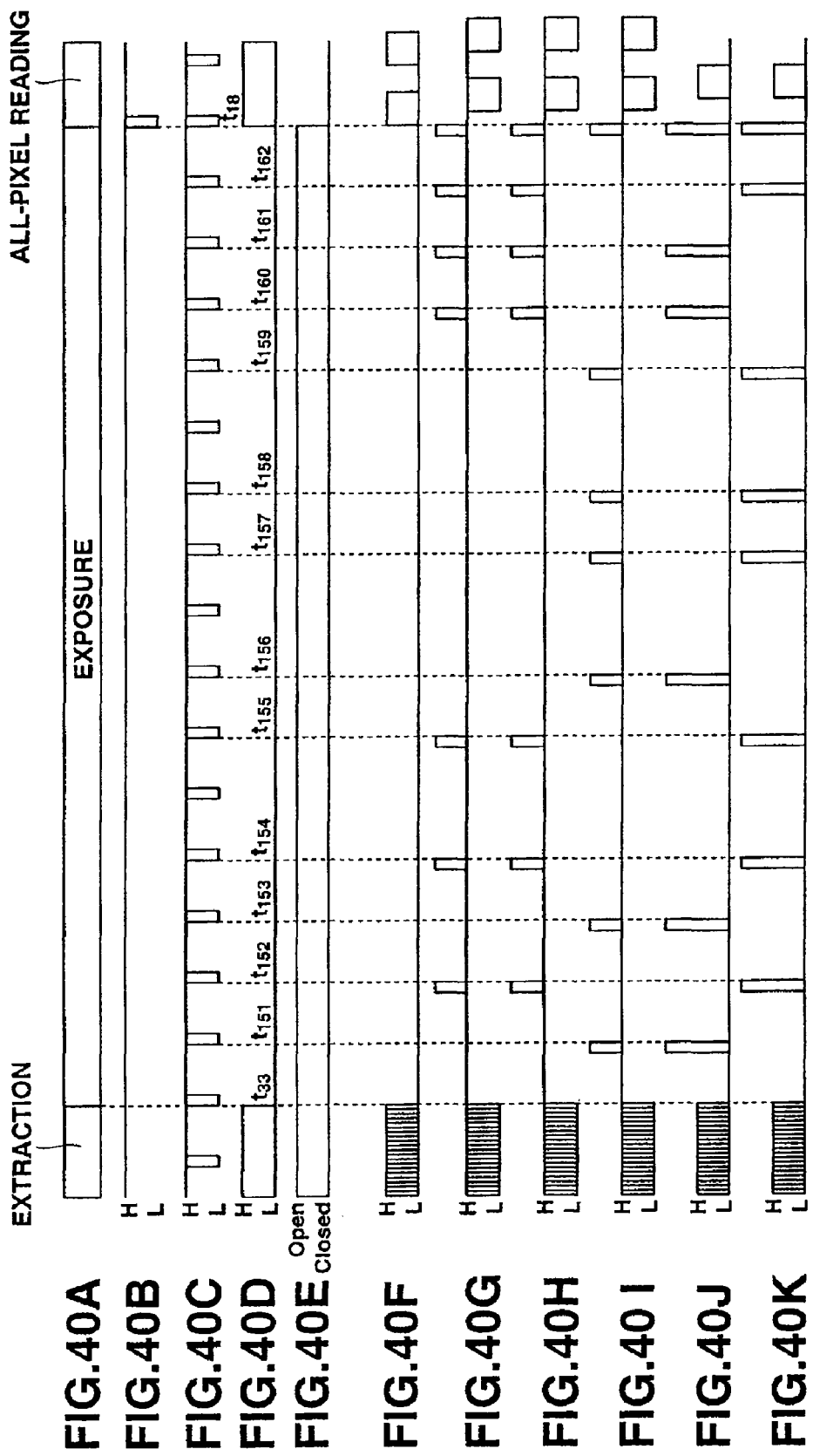

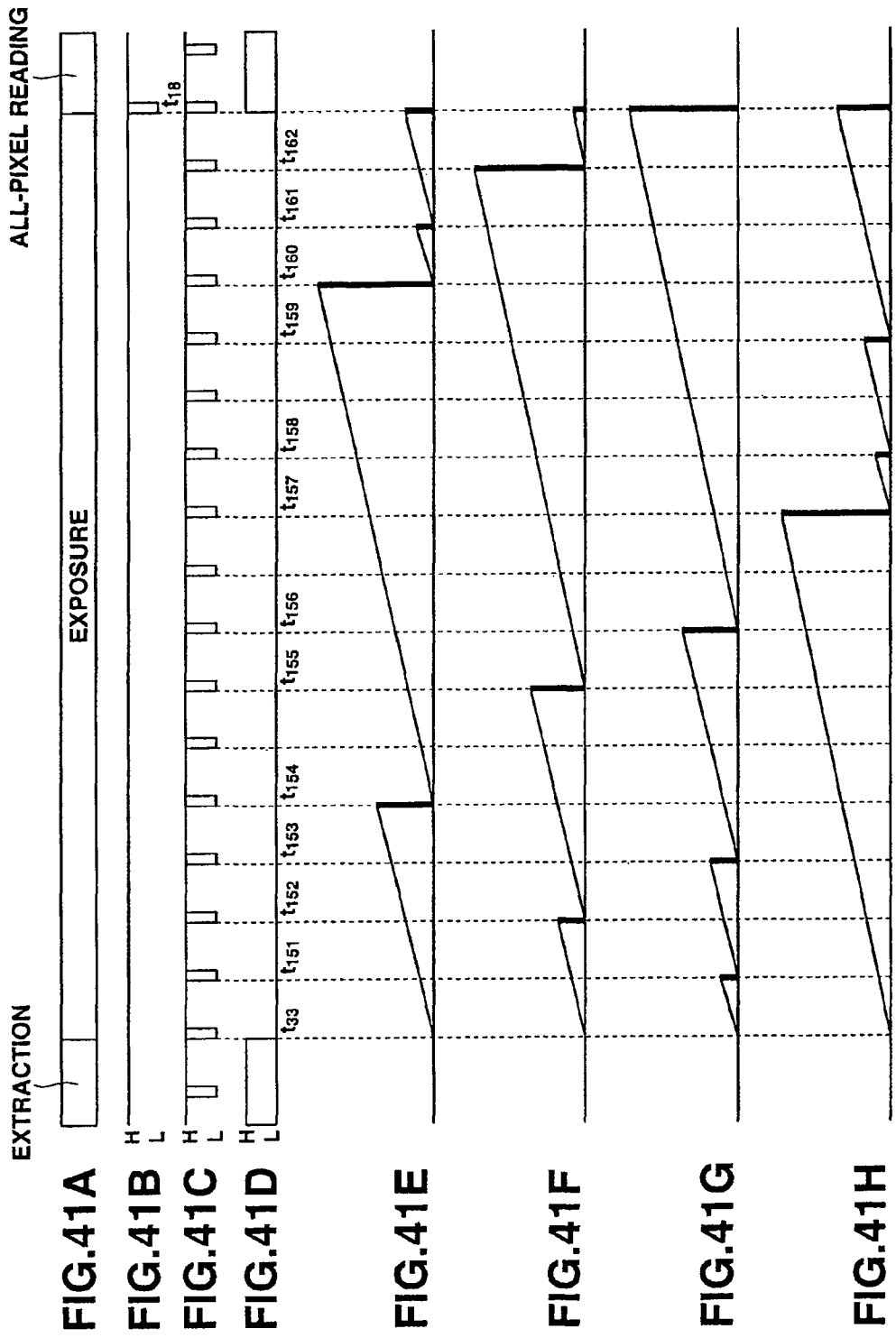

US 8,390,691 B2

DEVICE AND METHOD FOR PROCESSING PHOTOGRAPHIC IMAGE DATA

PRIORITY CLAIM

The present application is a continuation that claims priority to and the benefit of U.S. patent application Ser. No. 10/148,838, filed on Jun. 3, 2002, which is a 35 U.S.C. §371 filing based on PCT/JP01/08721 filed on Oct. 3, 2001, which claims priority and the benefit of Japanese Patent Application No. 2000-303519 filed in the Japanese Patent Office on Oct. 3, 2000, Japanese Patent Application No. 2000-303520 filed in the Japanese Patent Office on Oct. 3, 2000, and Japanese Patent Application No. 2000-307082 filed in the Japanese Patent Office on Oct. 6, 2000, the entire contents of which are incorporated herein by reference.

BACKGROUND

The present invention relates to a' photographing device and a photographing method. More particularly, the present invention relates to a photographing device and a photographing method, in which the dynamic range magnification can be changed as desired and which can reliably photograph dynamic scenes, too.

Photographing devices incorporating a CCD (Charged Coupled Device) image sensor are widely used.

A CCD image sensor is a solid-state photographing element. It finds use in various photographing devices such as video cameras and digital still cameras. Photographing devices, each including a CCD image sensor, are widely used in parts inspection apparatuses in FA (Factory Automation) and optical apparatuses in ME (Medical Electronics), such as electronic endoscopes.

FIG. 1 shows the electrical configuration of an interline-type CCD image sensor for use in conventional photographing devices.

The image sensor includes a first-phase power supply 1, a second-phase power supply 2, and a third-phase power supply 3. The power supplies supply transfer pulses (drive voltages) to vertical-transfer CCDs (vertical-transfer registers) 7a and 7b via first-phase electrodes 4a to 4d (hereinafter referred to as "first-phase electrodes 4," unless they need to be individually referred to), second-phase electrodes 5a to 5d, and third-phase electrodes 6a to 6d, respectively. The second-phase power supply 2 supplies a read pulse (drive voltage) to the vertical-transfer CCDs 7a and 7b, to read the charges accumulated in PDs (Photo Diodes) 8a to 8h.

PDs 8 convert light constituting an image into electric charges and accumulate the electric charges. The charges accumulated in the PDs 8 are read into the vertical-transfer CCDs 7a and 7b when the PDs 8 receive the read pulses from the second-phase power supply 2. Only eight PDs 8 are shown in FIG. 1, arranged in four rows and two columns, for the sake of explanation. In fact, however, PDs 8 are arranged in far more rows and columns.

The vertical-transfer CCDs 7a and 7b have three polysilicon electrodes for each PD 8. These electrodes function as a register that accumulates the electric charge read from the PD 8. The polysilicon electrodes are arranged on the vertical transfer CCD 9, forming register cells that are arranged in the vertical direction and connected to one another. The charges accumulated in the registers provided beneath the polysilicon electrodes are transferred, each from an upper register to the immediately lower register. The charges are thereby output to a horizontal-transfer CCD 9 that is connected to one end of each vertical transfer CCD 7. The vertical-transfer CCDs 7 reads the charges output from the PDs 8 and output them to the horizontal-transfer CCD 9, such that the charges may not mix with one another.

First-phase electrodes 4, second-phase electrodes 5, and third-phase electrodes 6 are provided, each extending in the horizontal direction as illustrated in FIG. 1. When the second-phase electrode 5a, for example, supplies a read pulse, the charges in the PDs 8a and 8e in the same row are read to the vertical-transfer CCDs 7a and 7b, respectively, at the same time. Thus, the charges in the PDs 8 are read to the vertical-transfer CCDs 7 at the same time, because the PDs 8 are connected one electrode that extends in the horizontal direction. The transfer pulses are supplied to the horizontal-transfer CCD 9 at the same time the charges are supplied to the vertical-transfer CCDs 7, for the first-phase electrodes 4a to 4d, the second-phase electrodes 5a to 5d and the third-phase electrodes 6a to 6d. These transfer pulses make the vertical-transfer CCDs 7a and 7b transfer the charges from the PDs 8 to the horizontal transfer CCD 9.

The horizontal transfer CCD 9 is driven by the transfer pulses supplied from drive power supplies 10a and 10b. The CCD 9 receives the charges read from the PDs 8 and transferred from the vertical-transfer CCDs 7a and 7b and outputs these electric charges to an output terminal 11.

Various methods have been proposed, each using a CCD image sensor of the type described above, photographing images by using PDs 8 of different sensitivities and combining the images, thereby to enhance the dynamic range.

The first of these methods is disclosed in Jpn. Pat. Appln. Laid-Open Publication 8-223491, Jpn. Pat. Appln. Laid-Open Publication 7-254965, Jpn. Pat. Appln. Laid-Open Publication 7-254966, Jpn. Pat. Appln. Laid-Open Publication 8340486, Jpn. Pat. Appln. Laid-Open Publication 10-069011, and U.S. Pat. No. 5,801,773. This method uses CCD image sensors arranged on the optical axes of incident light beams that pass through optical paths of different transmittances.

The second of the methods is disclosed in Jpn. Pat. Appln. Laid-Open Publication 8-331461, Jpn. Pat. Laid-Open Publication 7-254965, U.S. Pat. No. 5,420,635, U.S. Pat. No. 5,455,621, Jpn. Pat. Appln. Laid-Open Publication 6-141229, U.S. Pat. Nos. 5,801,773, 5,638,118, and 5,309,243. The method uses one CCD image sensor, which forms images of the same object at different times, each time for a different exposure time, and combines these images.

The third of these methods is disclosed in U.S. Pat. No. 5,789,737, Jpn. Pat. Appln. Laid-Open Publication 59-217358, and U.S. Pat. No. 5,420,635. This method uses one CCD image sensor that includes light-receiving elements having different sensitivities. The light-receiving elements convert light beams into electric signals, which are synthesized. To impart different sensitivities to the light-receiving elements, filters of different transmittances are bonded to the light-receiving elements.

The first method mentioned above requires a number of CCD image sensors and a complex optical system that splits one light beam into many light beams. The first method inevitably increases the size and manufacturing cost of the photographing device that adopts this method.

In the second method, one CCD image sensor generates data items about the same object at different sensitivities and different times, each time for a different exposure time. Therefore, the second method cannot photograph dynamic scenes (images) that change, in light intensity, from moment to moment.

The third method does not require a complex photographing device as the first method. Moreover, the third method can photograph dynamic scenes, unlike the second method. In the third method, however, the dynamic range magnification hardly can be adjusted in accordance with the use conditions, because each light-receiving element of the CCD image sensor has but a fixed sensitivity. It should be recalled that filters of different transmittances are bonded to the light-receiving elements, thereby imparting different sensitivities to the light-receiving elements.

Jpn. Pat. Appln. Laid-Open Publication 9-191099 discloses a method that may solve the problem that the fixed sensitivity of each light-receiving element makes it difficult to adjust the dynamic range magnification in accordance with the use conditions. In the method, signals are read from any selected column after the first accumulation period has elapsed, the CCD image sensor is then covered with an electronic shutter, and signals are read from another column during the second accumulation period. The method can indeed increase the dynamic range, but cannot photograph dynamic scenes which change, in light intensity, from moment to moment. This is because some time elapses between the first and second accumulation periods, since the electronic shutter discharges the photodiodes after the first accumulation period and before the second accumulation period. Consequently, the photographing time differs from column to column.

The method disclosed in Jpn. Pat. Appln. Laid-Open Publication 9-191099 has another problem. No freedom of designing the spatial pattern of sensitivity can be attained in the process of bonding the filters to the light-receiving elements. Consequently, the CCD image sensor cannot generate signals of three or more different types, each type generated for a different exposure time.

This problem is attributed to the following fact. The second-phase power supply 2 supplies read pulses via the second-phase electrodes 5. Charges are therefore read at the same time from the PDs 8 arranged in the horizontal direction (FIG. 1) into each vertical transfer CCD 7. The exposure time, i.e., the time for which each PD 8 of the CCD image sensor accumulates an electric charge until the charge is transferred from it, is the same for any horizontal line. The sensitivity of the PD 8 is determined by the exposure time. Hence, the PDs 8 arranged in the horizontal direction have the same sensitivity. This reduces the freedom of designing the spatial pattern of the PDs 8.

In the third method and the method disclosed in Jpn. Pat. Appln. Laid-Open Publication 9-191099, the light-receiving elements (PDs 8 shown in FIG. 1) of the CCD image sensor have information acquired at only one sensitivity, and the signals generated by the light-receiving elements are combined to provide an image of a broad dynamic range. The image thus provided has but a fraction of the resolution that the CCD image sensor can achieve.

SUMMARY

The present invention has been made in view of the foregoing. An object of the present invention is to provide a photographing device and a photographing method, in which the dynamic range magnification can be changed as desired and which can reliably photograph dynamic scenes, too.

Another object of the present invention is to provide a photographing device and a photographing method, in which freedom is ensured for the spatial pattern of sensitivity of the light-receiving elements (PDs) provided in the CCD image sensor, making it possible to photograph dynamic scenes reliably in a broad dynamic range.

Still another object of the present invention is to provide a photographing device and a photographing method, which can photograph images that change in light intensity every moment, like moving pictures, in a high dynamic range.

A photographing device according to the present invention includes reading parts for outputting the electric charges accumulated in light-receiving elements, and control parts for controlling the reading parts, causing the same to output the electric charges accumulated in the light-receiving elements, while the light-receiving elements are receiving light.

The control parts may control the reading parts, making the same output, at different times, the electric charges accumulated in adjacent ones of the light-receiving elements, while the light-receiving elements are receiving light.

Alternatively, the control parts may divide a period, during which the light-receiving elements are receiving light, into a number of equal sub-periods. In this case, the control parts control the reading parts during a sub-period, making the same output the electric charges accumulated in the light-receiving elements of a first group, at a first timing, and to repeatedly output the electric charges accumulated in the light-receiving elements of a second group which are adjacent to the elements of the first group, at a second timing different from the first timing.

The photographing device may further include vertical transfer parts for transferring the electric charges output from the reading parts, in a vertical direction. In this case, the control parts make the vertical transfer parts stop transferring the electric charges, and control the reading parts, making the same output, at a given timing, the electric charges accumulated in the light-receiving elements.

While the light-receiving elements are receiving light, the control parts may make the vertical transfer parts stop transferring the electric charges and may control the reading parts, making the same output, at different times, the electric charges accumulated in adjacent ones of the light-receiving elements.

The control parts may make the vertical transfer parts stop transferring the electric charges while the light-receiving elements are receiving light, may divide a period, during which the light-receiving elements are receive light, into a number of equal sub-periods, and may control the reading parts during a sub-period, making the same output the electric charges accumulated in the light-receiving elements of a first group, at a first timing, and to repeatedly output the electric charges accumulated in the light-receiving elements of a second group which are adjacent to the elements of the first group, at a second timing different from the first timing.

The photographing may further include discharging parts for discharging electric charges accumulated in all light-receiving elements. In this case, the control parts control the reading parts, making the same output the electric charges accumulated in the light-receiving elements, at a given timing while the light-receiving elements are receiving light. Further, the control parts control the discharging parts, making the same discharge the electric charges accumulated in all light-receiving elements, at a timing immediately thereafter. Alternatively, the control parts control the reading parts, making the same output the electric charges accumulated in the light-receiving elements at a given timing.

The control parts may control the reading parts, making the same output the electric charges accumulated in the light-receiving elements, at different times while the light-receiving elements are receiving light, and may control the discharging parts, making the same discharge electric charges accumulated in all light-receiving elements, at a timing immediately thereafter. Alternatively, the control parts may control the reading parts, making the reading parts output, at different times, the electric charges accumulated in adjacent ones the light-receiving elements.

The control parts may divide a period, during which the light-receiving elements are receiving light, into a number of equal sub-periods, may control the reading parts, making the same output, at a first timing, the electric charges accumulated in the light-receiving elements of a first group, and to repeatedly output the electric charges accumulated in the light-receiving elements of a second group which are adjacent to the elements of the first group, at a second timing different from the first timing, and may control the discharging parts, making the same discharge the electric charges accumulated in all light-receiving elements, at a timing immediately thereafter. Alternatively, the control parts may divide a period, during which the light-receiving elements are receiving light, into a number of equal sub-periods, control the reading parts, making the same output, at a first timing, the electric charges accumulated in the light-receiving elements of a first group, and to repeatedly output the electric charges accumulated in the light-receiving elements of a second group which are adjacent to the elements of the first group, at a second timing different from the first timing.

The photographing device according to the present invention may further include vertical transfer parts for transferring the electric charges output from the reading parts, in a vertical direction, and discharging parts for discharging electric charges accumulated in all light-receiving elements. In this case, the control parts make the vertical transfer parts stop transferring the electric charges while the light-receiving elements are receiving light, control the reading parts, making the same output, at a given timing, the electric charges accumulated in the light-emitting elements and control the discharging parts, making the same discharge the electric charges accumulated in all light-receiving elements, at a timing immediately thereafter. Alternatively, the control parts may make the vertical transfer parts stop transferring the electric charges while the light-receiving elements are receiving light, and may control the reading parts, making the same output the electric charges accumulated in the light-receiving elements, at a given timing.

The control parts may make the vertical transfer parts stop transferring the electric charges while the light-receiving elements are receiving light, may control the reading parts, making the same output, at different times, the electric charges accumulated in adjacent ones of the light-receiving elements, and may control the vertical transfer parts, making the same discharge the electric charges accumulated in all light-receiving elements, at a timing immediately thereafter. Alternatively, the control parts may make the vertical transfer parts stop transferring the electric charges while the light-receiving elements are receiving light, and may control the reading parts, making the same output, at different times, the electric charges accumulated in adjacent ones of the light-receiving elements.

The control parts may make the vertical transfer parts stop transferring the electric charges while the light-receiving elements are receiving light, may divide a period, during which the light-receiving elements are receiving light, into a number of equal sub-periods, and may control the reading parts during a sub-period, making the same output the electric charges accumulated in the light-receiving elements of a first group, at a first timing, and to repeatedly output the electric charges accumulated in the light-receiving elements of a second group which are adjacent to the elements of the first group, at a second timing different from the first timing. Further, the control parts may control the discharging parts, making the same discharge the electric charges accumulated in all light-receiving elements, at a timing immediately thereafter. Alternatively, the control parts may make the vertical transfer parts stop transferring the electric charges while the light-receiving elements are receiving light, may divide a period, during which the light-receiving elements are receiving light, into a number of equal sub-periods, and may control the reading parts during a sub-period, making the same output the electric charges accumulated in the light-receiving elements of a first group, at a first timing, and to repeatedly output the electric charges accumulated in the light-receiving elements of a second group which are adjacent to the elements of the first group, at a second timing different from the first timing.

The photographing method according to the present invention includes the steps of reading charges accumulated in the light-receiving elements, and controlling the reading step, thereby to output the electric charges accumulated in the light-receiving elements, at any given timing while the light-receiving elements are receiving light.

In the photographing device and the photographing method, both according to the present invention, the electric charges accumulated in the light-receiving elements are read at a given timing while the light-receiving elements are receiving light.

A photographing device according to the present invention includes a number of light-receiving elements arranged in a horizontal direction and a vertical direction, each configured to receive light and convert the light into an electric charge, a number of vertical transfer registers for transferring the electric charges accumulated in the light-receiving elements in the vertical direction, and a first drive-voltage applying electrode arranged parallel to the vertical transfer registers, for applying a drive voltage to a specific one of the vertical transfer registers.

This photographing device may further include a transfer gate for transferring the electric charges accumulated in the light-receiving elements to the vertical transfer registers. In this case, the first drive-voltage applying electrode applies a drive voltage to the transfer gate, making the same transfer the electric charges accumulated in the light-receiving elements to the vertical transfer registers.

The photographing device may further include a second drive-voltage applying electrode arranged perpendicular to the vertical transfer registers, for applying a second drive voltage to the vertical transfer registers at the same time. In this case, the vertical transfer registers transfer the electric charges accumulated in the light-receiving elements in the vertical direction when applied with a voltage output from the first drive-voltage applying electrode or the second drive-voltage applying electrode, or both.

The transfer gate may transfer the electric charges accumulated in the light-receiving elements to the vertical transfer registers when applied with a voltage output from the first drive-voltage applying electrode or the second drive-voltage applying electrode, or both.

The first and second drive-voltage applying electrodes may be provided on the transfer gate, perpendicular to a direction in which the electric charges are transferred.

The first and second drive-voltage applying electrodes may be provided on the transfer gate, parallel to a direction in which the electric charges are transferred.

In a photographing method according to the present invention, a drive voltage is applied from a drive-voltage applying electrode to a specified one of vertical transfer registers.

In the photographing apparatus and photographing method, described above, the electric charges accumulated in the light-receiving elements are applied to a specified one of the vertical transfer registers, by the first drive-voltage applying electrode that is arranged parallel to the vertical transfer registers that transfer, in the vertical direction, the electric charges accumulated in the light-receiving elements.

The photographing device according to the present invention includes a number of light-receiving elements configured to receive light and convert the light into an electric charge, reading parts for outputting the electric charges accumulated in the light-receiving elements, control parts for dividing a period, during which the light-receiving elements are receiving light, into sub-periods which are to be added in various combinations, and for controlling the reading parts, making the same output the electric charges accumulated in the light-receiving elements in each of the sub-periods.

The control parts may divide the period, during which the light-receiving elements are receiving light, into sub-periods which are combined in various orders, each order to a group of adjacent light-receiving elements, and may control the reading parts, making the same output the electric charges accumulated in the light-receiving elements, during each of the sub-periods.

This photographing device may further include vertical transfer parts for transferring, in a vertical direction, the electric charges output by the reading parts. In this case, the control parts control the vertical transfer parts, making the same stop transferring the electric charges, divide the period, during which the light-receiving elements are receiving light, into sub-periods which are to be added in various combinations, and control the reading parts, making the same output the electric charges accumulated in the light-receiving elements, during each of the sub-periods.

The control parts may control the vertical transfer parts, making the same stop transferring the electric charges, may divide the period, during which the light-receiving elements are receiving light, into sub-periods which are combined in various orders, and may control the reading parts, making the same output the electric charges accumulated in the light-receiving elements, during each of the sub-periods.

The photographing method according to the present invention includes the steps of reading the electric charges accumulated in the light-receiving elements, dividing a period, during which the light-receiving elements are receiving light, into sub-periods which are to be added in various combinations, and controlling the reading step, thereby to output the electric charges accumulated in the light-receiving elements, during each of the sub-periods.

In the photographing device and photographing method according to the present invention, a period, during which the light-receiving elements are receiving light is divided into sub-periods which are to be added in various combinations, and the electric charges accumulated in the light-receiving elements are controlled to be output during each of the sub-periods.

Additional features and advantages are described herein, and will be apparent from the following Detailed Description and the figures.

BRIEF DESCRIPTION OF THE FIGURES

FIG. 34 is a diagram showing an interpolation filter.

FIGS. 36A to 36K is a timing chart explaining how the CCD image sensor operates in the digital still camera according to the present invention.

FIGS. 37A to 37F is a timing chart explaining how the CCD image sensor operates in the digital still camera according to the invention.

FIGS. 38A and 38B shows a moving image of an object, which the CCD image sensor has photographed.

FIGS. 39A and 39B illustrates a moving image of an object, which the CCD image sensor has photographed.

FIG. 40A to 40K are a timing chart explaining the operation of the CCD image sensor incorporated in a digital still camera according to the present invention.

FIG. 41A to 41H are a timing chart explaining the operation of the CCD image sensor.

DETAILED DESCRIPTION

Figure 2:
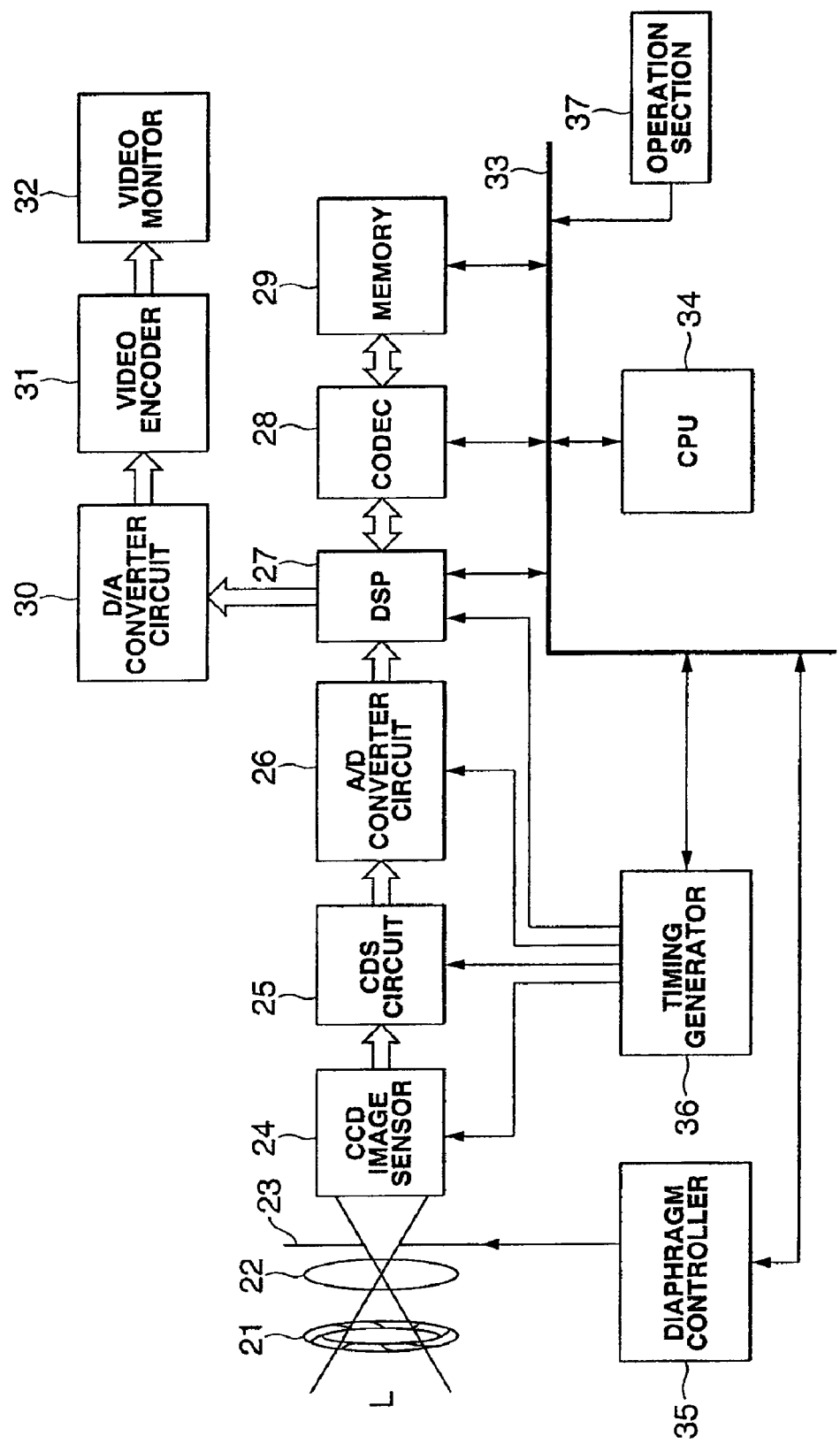
FIG. 2 is a block diagram of a digital still camera according to the present invention.

FIG. 2 is a block diagram of a digital still camera according to the present invention. The light L reflected from an object (not shown) passes through a shutter 21 and a lens 22. A diaphragm 23 adjusts the intensity of the light L to an appropriate value. The light L thus adjusted is applied to a CCD image sensor 24. The focal point of the lens 22 is adjusted so that the light L reflected from the object (not shown) may form an image on the CCD image sensor 24.

The CCD image sensor 24 includes a number of light-receiving elements (i.e., PDs 8 shown in FIG. 12, which will be later described) The CCD image sensor 24 performs photoelectric conversion on the light L applied to it via the lens 22 and the diaphragm 23. In other words, it converts an image of the object to an electric signal. The electric signal is supplied to a CDS (Correlated Double Sampling) circuit 25.

The CDS circuit 25 receives the electric signal from the CCD image sensor 24 and compares the signal with a reference signal. The CDS circuit 25 samples the difference between the signals compared and output the same, as an image signal, to an A/D (Analog/Digital) converter circuit 26. The A/D converter circuit 26 converts the analog signal supplied from the CDS circuit 25, to a digital signal. The digital signal is supplied to a DSP (Digital Signal Processor) 27.

The DSP 27 receives the signal output from the A/D converter circuit 26. It converts the signal to image data under the control of a CPU (Central Processing Unit) 34. The image data is supplied to a D/A (Digital/Analog) converter circuit 30 or a CODEC (Coder Decoder) 28. The DSP 27 can receive image data from the CODEC 28 and supply the same to the D/A converter circuit 30. The CODEC 28 receives the image data from the DSP 27 and encodes the image data, generating an image code. The image code is stored into a memory 29. The CODEC 28 reads the image code from the memory 29 and decodes the same into image data, which is output to the DSP 27.

The D/A converter circuit 30 receives the digital signal supplied from the DSP 27 and representing the image. The converter 30 converts the digital signal to an analog signal, which is supplied to a video encoder 31. The video encoder 31 converts the image data, or the analog signal supplied from the D/A converter circuit 30, to a video signal. This video signal is input to a video monitor 32, which displays the image represented by the video signal.

The CPU 34 controls the DSP 27, CODEC 28, memory 29, diaphragm controller 35 and timing generator 36, all connected to the bus 33 of the digital still camera.

The diaphragm controller 35 has a control value set by the CPU 34. The controller 35 controls the diaphragm 23 in accordance with the control value, imparting a desired brightness to the image represented by the digital signal supplied to the DSP 27. More specifically, the CPU 34 acquires samples several luminance values from the image data that the DSP 27 holds. The CPU 34 then finds an average of these luminance values and determines on the diaphragm 23, from the average luminance, such a control value as will impart the desired brightness to the image.

When controlled by the CPU 34, the timing generator 36 generates a timing pulse. The timing pulse is supplied to the CCD image sensor 24, CDS circuit 25, A/D converter circuit 26 and DSP 27 to drive these components. An operation section 37 is connected to the bus 33 and is manipulated to operate the digital still camera. The operation section 37 has the structure illustrated in FIG. 3.

Figure 3:
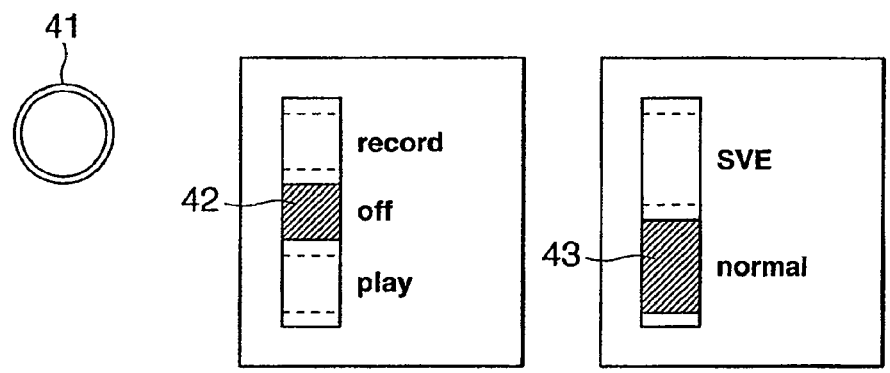
FIG. 3 is a plan view showing the operation section of the digital still camera shown in FIG. 2.

As FIG. 3 shows, the operation section 37 has a capture button 41 and an action mode switch 42. The capture button 41 is a push button, which the user depresses to take a still picture. The action-mode switch 42 is a changeover switch that can slide up and down. The switch 42 can take three positions, at which the words "record," "off" "play" are printed. When the switch 42 is set at any one of these positions, the digital still camera is set in the action mode designated by the position. In the case shown in FIG. 3, the action mode switch 42 is set at the "off" position. The action modes will be described later.

The operation section 37 further has an exposure mode switch 43. The switch 43 is provided to change the exposure mode. It can take two positions, at which the words "SVE" and "normal" are printed. (SVE stands for "Spatially Varying Exposure"). In the case shown in FIG. 3, the exposure mode switch 43 is set at the "normal" position. The exposure modes will be described later.

Figure 4:
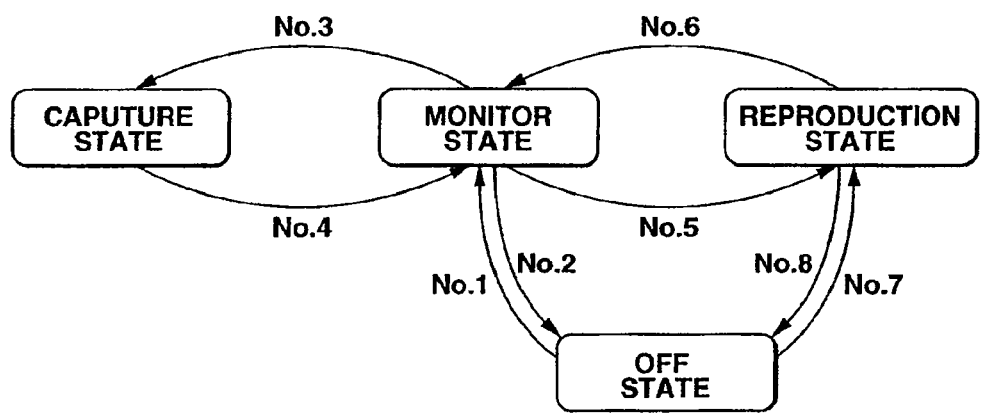
FIG. 4 is a diagram explaining the action mode of the digital still camera shown in FIG. 2.

The action modes of the digital still camera and how the camera operates in each action mode will be described, with reference to FIGS. 4 to 10. As long as the action mode switch 42 remains at the "off" position as is shown in FIG. 3, the camera assumes the "off" state that is illustrated in FIG. 4, which is a state transition diagram. Hence, the digital still camera does not operate at all.

Figure 5:
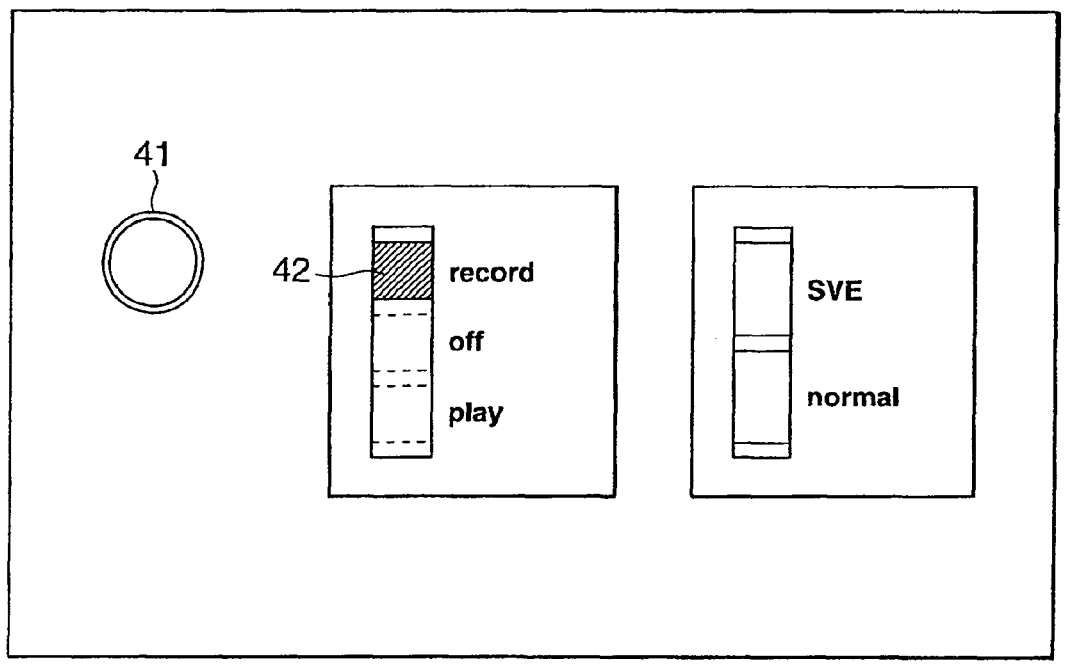
FIG. 5 is another plan view showing the operation section of the digital still camera shown in FIG. 2.

When the user slides the action mode switch 42 upwards, setting the switch 42 at the "record" position as shown in FIG. 5, the state of the camera changes from the "off" state to the "monitor" state as is illustrated at "No. 1" in FIG. 4.

Figure 6:
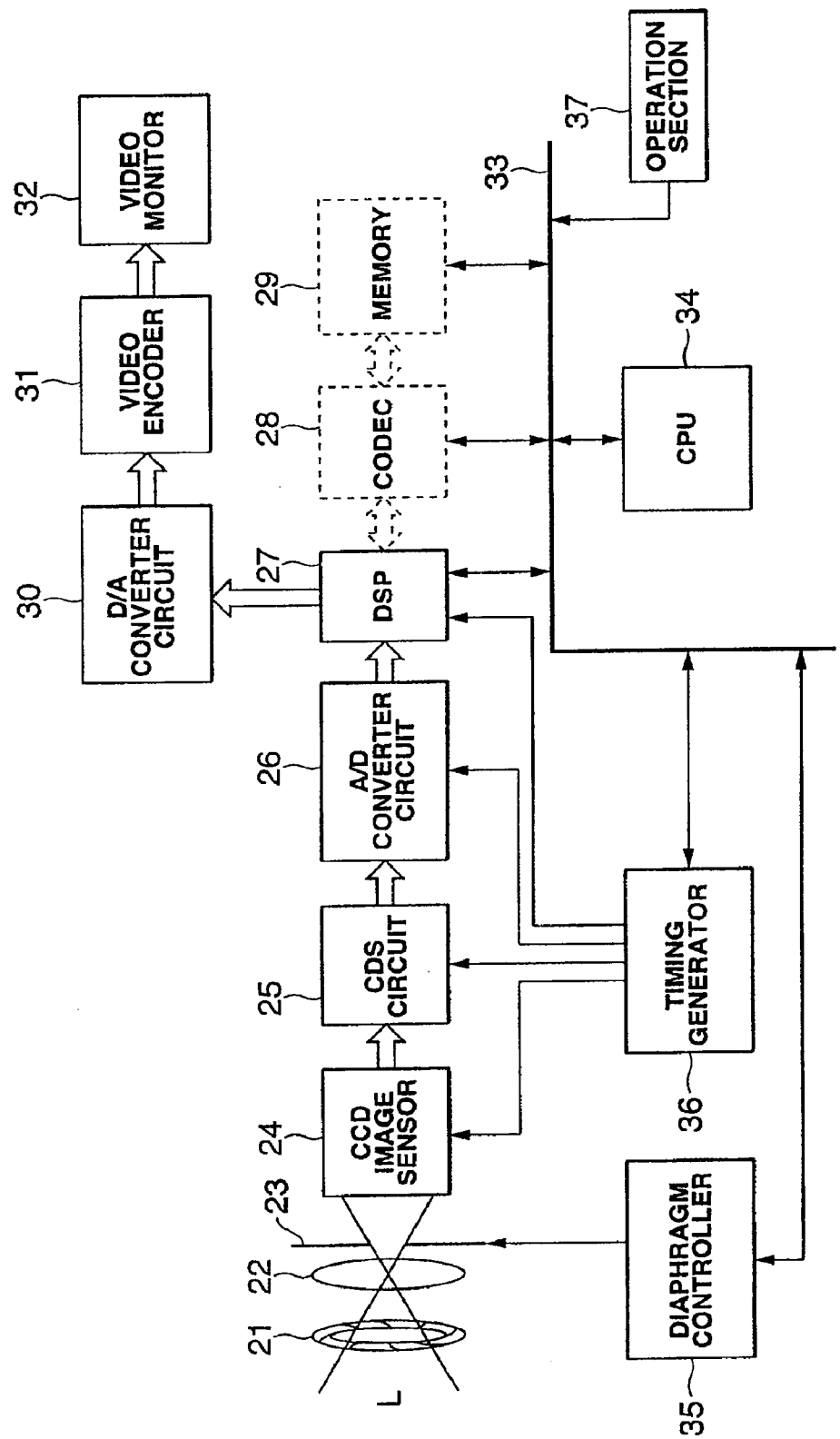
FIG. 6 is a block diagram of the digital still camera according to the present invention.

While the digital still camera stays in the "monitor" state, the CPU 34 controls the timing generator 36, which outputs a timing pulse for performing draft reading as shown in FIG. 6. In accordance with the timing pulse, the CCD image sensor 24, CDS circuit 25, A/D converter circuit 26 and DSP 27 cooperate, reading an image signal the light that has passed through the shutter 21, lens 22 and diaphragm 23, thus accomplishing the draft reading. The image signal is output to the D/A converter circuit 30. The converter 30 converts the input image data from the digital signal to the analog signal, which is supplied to the video encoder 31.

The video encoder 31 converts the analog signal to a video signal. The video signal is supplied to the video monitor 32, which displays the image represented by the video signal. When the user slides the action mode switch 42 back to the "off" position, the state of the camera changes from the "monitor state" to the "off state" as is illustrated at "No. 2" in FIG. 4.

The draft reading will be described later. In FIG. 6, the solid-line boxes indicate the circuits that operate while the digital still camera remains in the "monitor state." The broken-line boxes indicate the circuits that do not operate while the digital still camera stays in the "monitor state." The components operating and the components not operating will be indicated in the same way, in conjunction with the following description.

Figure 7:
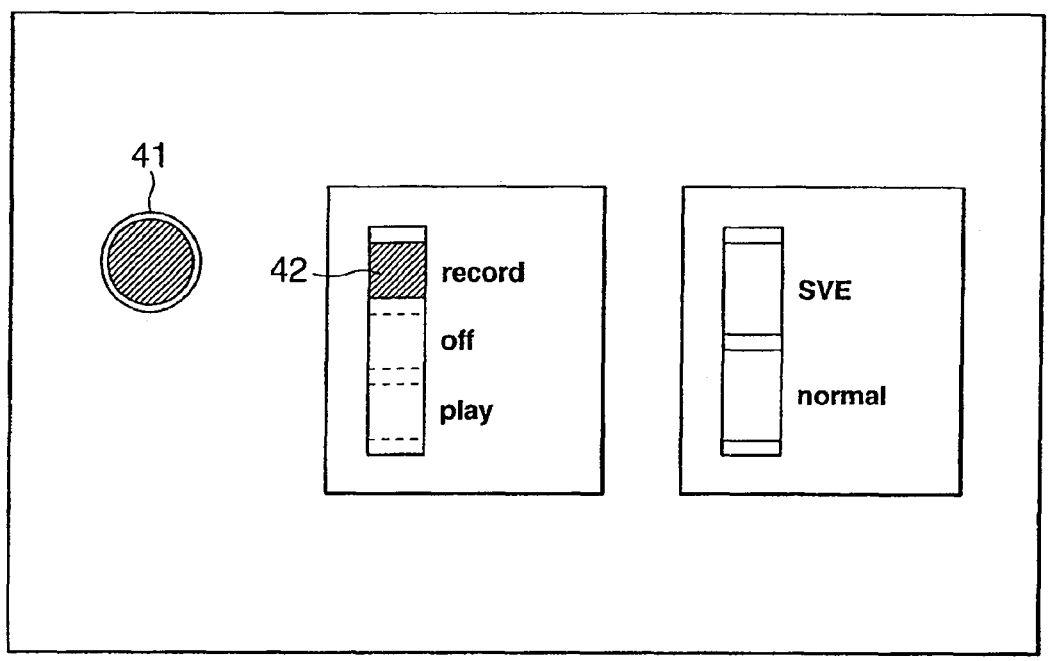
FIG. 7 is a plan view showing the operation section of the digital still camera shown in FIG. 2.

The user may push the capture button 41 as shown in FIG. 7 while the action mode switch 42 remains at the "record" position as shown in FIG. 7 and the camera therefore stays in the "monitor state" as shown in FIG. 4. In this case, the state of the camera changes from the "monitor state" to the "capture state" as is illustrated at "No. 3" in FIG. 4.

Figure 8:
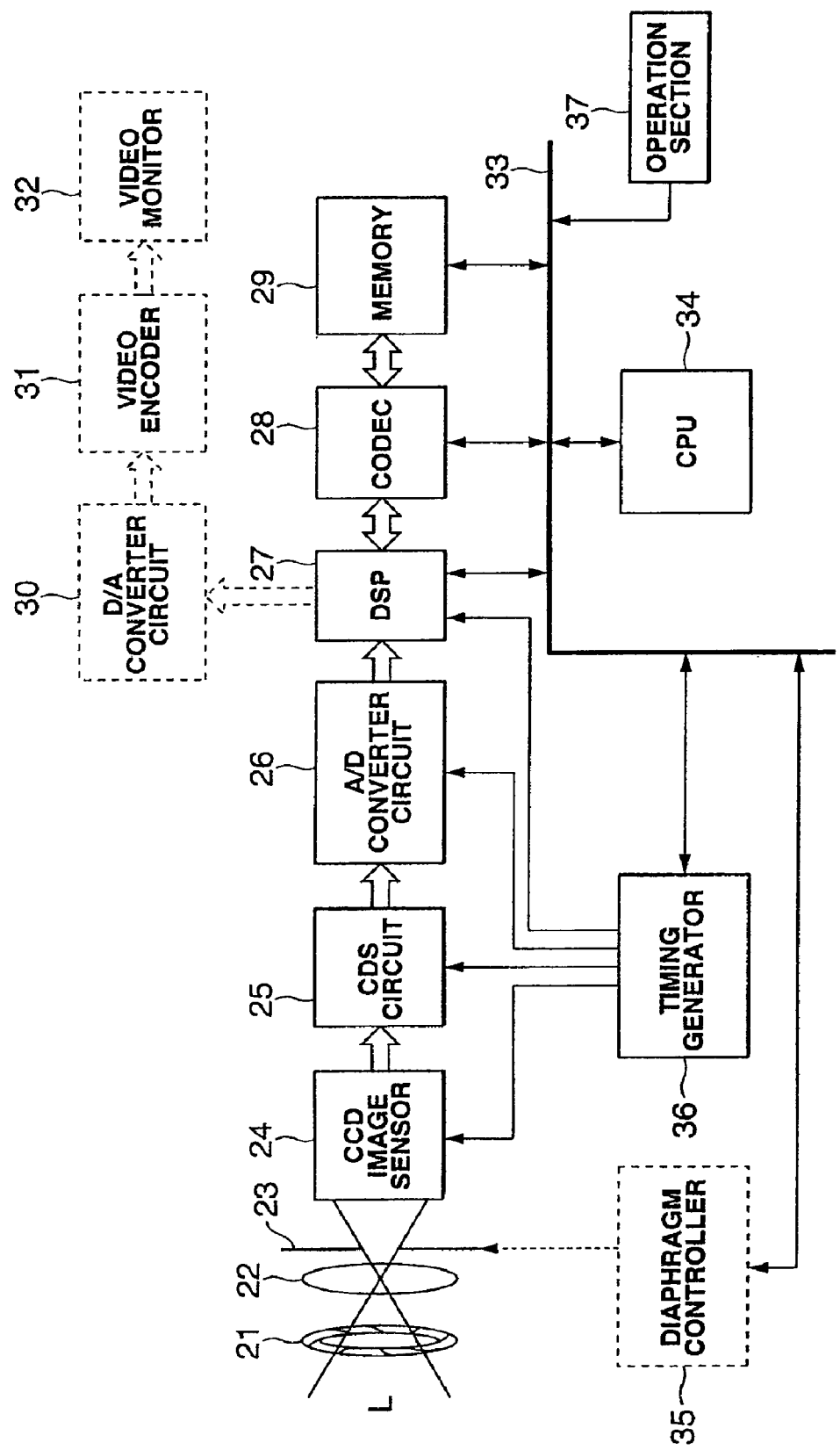
FIG. 8 is a block diagram of the digital still camera according to the present invention.

While the digital still camera is left in the "capture state," the CPU 34 controls the timing generator 36 as shown in FIG. 8, making the generator 36 output a timing pulse for reading all pixels. In accordance with this timing pulse, the CCD image sensor 24, CDS circuit 25, A/D converter circuit 26 and DSP 27 read all pixels for one frame of the image represented by the light L that has passed through the shutter 21, the lens 22 and the diaphragm 23. The DSP 27 performs gamma correction or the like on the one-frame image data, which is output to the CODEC 28. The CODEC 28 compresses and encodes the one-frame image data in a prescribed format. The image data thus encoded is stored into the memory 29. When the image data is stored into the memory 29, the digital still camera comes out of the "capture state." As shown at "No. 4" in FIG. 4, the camera goes back to the "monitor state."

Figure 9:
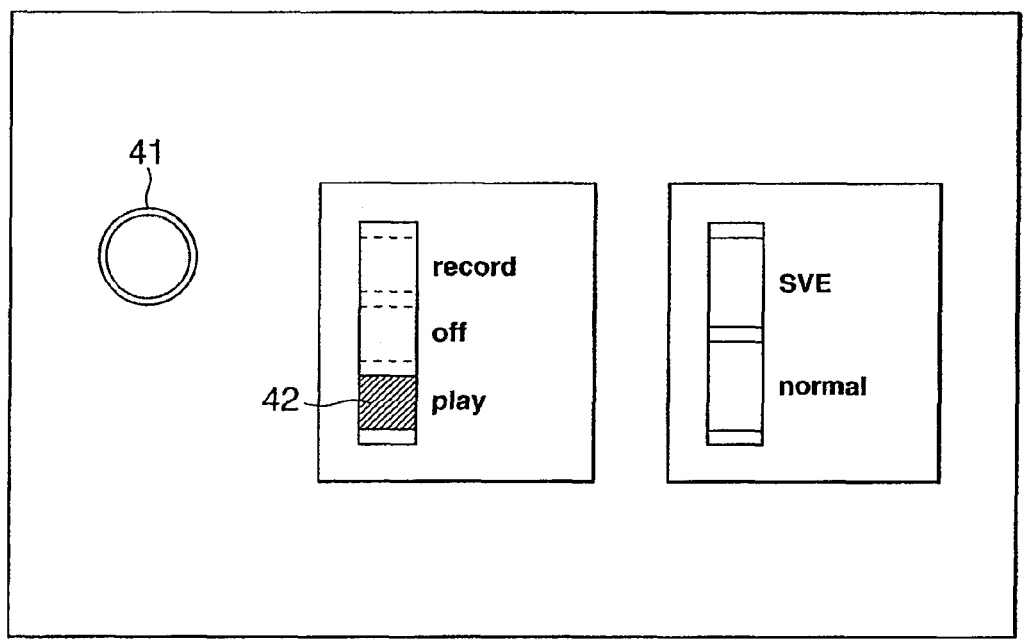
FIG. 9 is a plan view showing the operation section of the digital still camera shown in FIG. 2.

While the camera stays in the "monitor state," the user may operate the action mode switch 42, setting the switch 42 at the "play" position as shown in FIG. 9. If this is the case, the digital still camera goes from the "monitor state" to the "reproduction state" as indicated at "No. 5" in FIG. 4. While the camera stays in the "off state," the user may operate the action mode switch 42, setting the switch 42 at the "play" position. In this case, the digital still camera goes from the "off state" to the "reproduction state," too, as illustrated at "No. 7" in FIG. 4.

Figure 10:
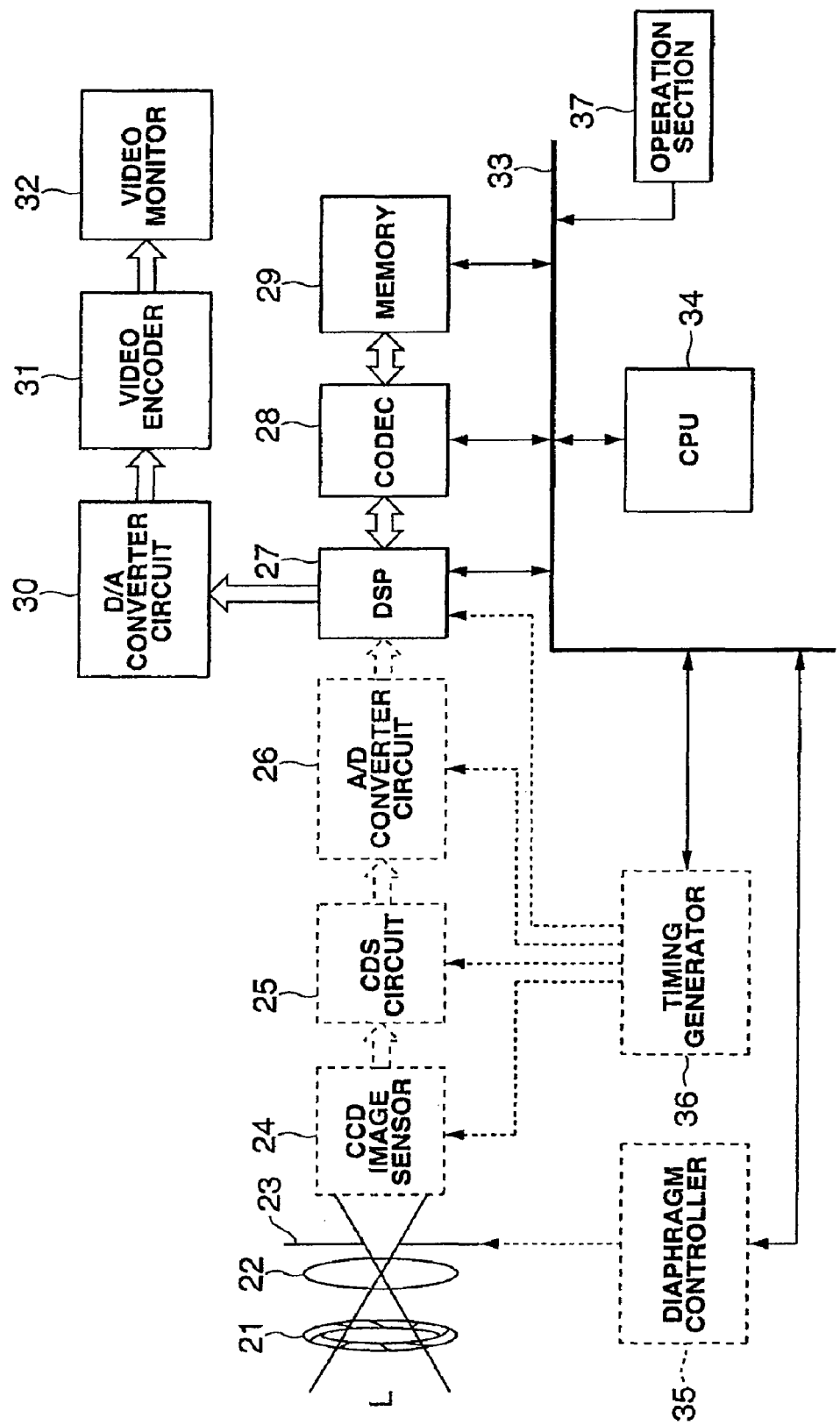
FIG. 10 is a block diagram of the digital still camera according to the present invention.

As long as the camera remains in the "reproduction state," the CPU 34 does not operate the timing generator 36 as shown in FIG. 10. Therefore, the CCD image sensor 24 outputs no electric signals. The CPU 34 controls the CODEC 28, making the CODEC 28 read the image data from the memory 29. The CODEC 28 decodes the image data, which is input to the DSP 27. Under the control of the CPU 34, the DSP 27 performs down-sampling on the image data output from the CODEC 28, changing the data to one that has the video-signal format. The image data thus processed is supplied to the D/A converter circuit 30. The D/A converter circuit 30 converts the image data to an analog signal, which is output to the video encoder 31. The video encoder 31 converts the analog signal to a video signal. The video signal is supplied to the video monitor 32. The video monitor 32 displays the image represented by the video signal.

If the user operates the action mode switch 42, setting the same at the "record" position, while the camera stays in the "reproduction state," the operating state of the camera changes from the "reproduction state" to the "monitor state" as shown at "No. 6" in FIG. 4. If the user sets the action mode switch 42 at the "off" position, the operating state of the camera changes from the "reproduction state" to the "off state" as is illustrated at "No. 8" in FIG. 4.

Figure 11:
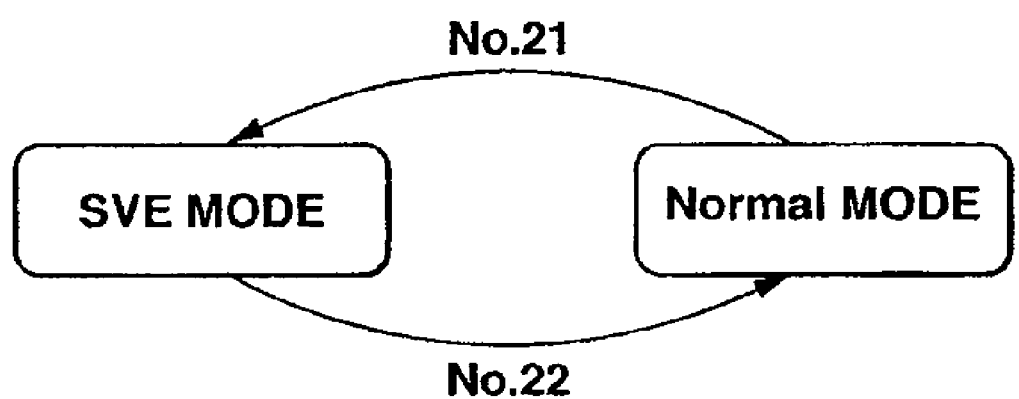
FIG. 11 is a diagram explaining the exposure mode of the digital still camera shown in FIG. 2.

The exposure mode will be explained with reference to FIG. 11. The exposure mode is set, independently of the action mode, to set the CCD image sensor 24 in specific exposure conditions while the digital still camera remains in the "capture sate." The exposure mode is either the "normal mode" or the "SVE mode." In the "normal mode," the same exposure time is set for all light-receiving elements (i.e., PDs 8 shown in FIG. 12 and described later). (That is, all light-receiving elements are set at the same sensitivity in the "normal mode.") In the "SVE mode," different exposure times are set for some groups of light-receiving elements.

Assume that the user operates the exposure mode switch 43, setting the same at the "normal" position as shown in FIG. 3. Then, the exposure mode is the "normal mode" shown in FIG. 11. If the user slides the exposure mode switch 43 upwards to the "SVE" position shown in FIG. 3, the exposure mode changes to the "SVE mode" as shown at "No. 21" in FIG. 11. If the user slides the exposure mode switch 43 downwards to the "normal" position shown in FIG. 3, the exposure mode changes from the "SVE mode" to the "normal mode" as is illustrated at "No. 22" in FIG. 11.

The electrodes of the CCD image sensor 24 will be described in detail with reference to FIG. 12. The components that correspond to the components of the conventional CCD image sensor are designated at the same reference numerals in FIG. 12 et seq., and will not be described in detail.

The first-phase electrodes 4 (indicated by rough broken lines) and the second-phase electrodes 5 (indicated by fine broken lines) are arranged, each extending in the horizontal direction. The second-phase electrodes 5 are connected to transfer gates 61. The first-phase electrode 4a and the second-phase electrode 5a, for example, extend in the horizontal direction, with the PDs 8a, 8e and 8i located between them. Similarly, the first-phase electrode 4b and the second-phase electrode 5b extend in the horizontal direction, with the PDs 8b, 8f and 8j located between them.

The third-phase electrodes 6 (indicated by solid lines) extend in the vertical direction and are connected to the transfer gates 61 provided for the PDs 8 that are arranged in columns. The third-phase electrode 6a, for example, is connected to the transfer gates 61a, 61b, 61c and 61d of the PDs 8e, 8f, 8g and 8h, respectively, which are arranged in one column. Each second-phase electrode 5 has projections at the parts where the electrode 5 intersects with the third-phase electrodes 6. The projections contact, in part, the transfer gates 61 (or are connected to the transfer gates 61).

Figure 12:
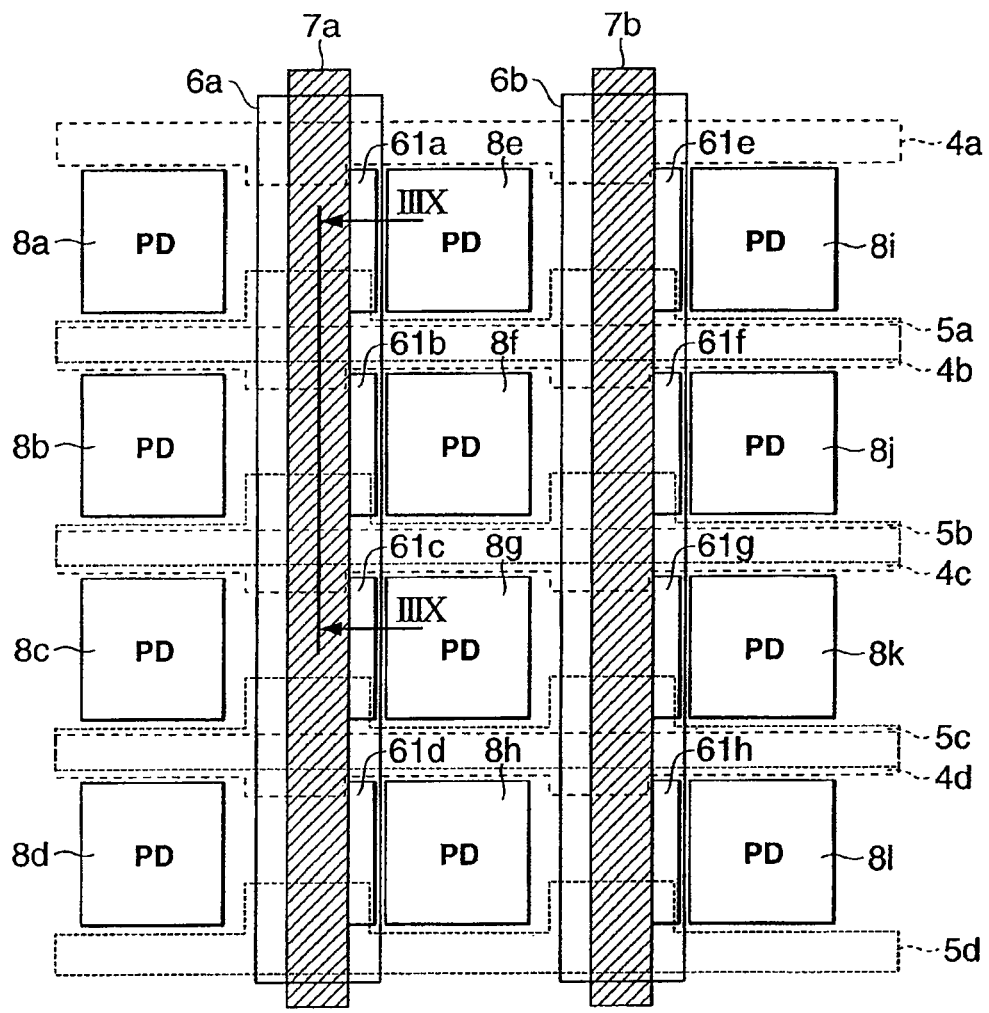
FIG. 12 is a plan view illustrating the electrodes provided in the CCD image sensor shown in FIG. 2.
Figure 13:
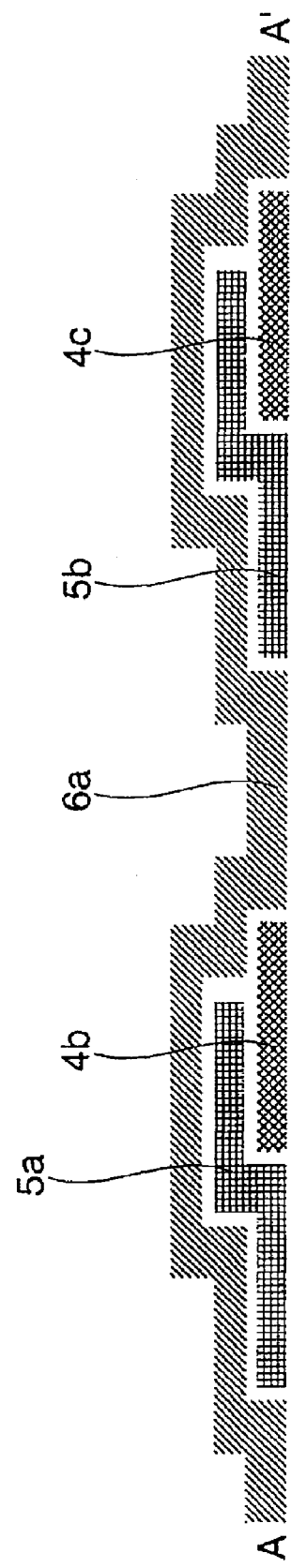
FIG. 13 is a sectional view taken along line IIIX-IIIX shown in FIG. 12.

FIG. 13 is a sectional view of the CCD image sensor 24, taken along line IIIX-IIIX shown in FIG. 12 and looked from the left in FIG. 12. As FIG. 13 shows, the second-phase electrodes 5 are shaped like a stair, as viewed sideways. Each second-phase electrode 5 includes two layers arranged in the vertical direction in FIG. 12. (or in the horizontal direction in FIG. 13). The two layers are positioned at different levels, forming a step at the junction between them. As FIG. 13 shows, a first-phase electrode 4 lies below the second layer of the second-phase electrode 5. The third-phase electrode 6, or the uppermost layer, is provided, covering the first-phase electrode 4 and the second-phase electrode 5.

The transfer gates 61 supply the electric charges accumulated in the PDs 8 to the vertical-transfer CCDs 7 when they receive a read pulse from the second-phase electrodes 5 or the third-phase electrodes 6. As FIG. 12 shows, one second-phase electrode 5 and one third-phase electrode 6 (which extend parallel to each other and which arranged in the horizontal direction in FIG. 12) contact each transfer gate 61 and are spaced part in the direction perpendicular to the plane of junction between the transfer gate 61 and one PD 8. Therefore, each transfer gate 61 transfers an electric charge from the PD 8 to the vertical-transfer CCD 7 when it receives a read pulse from either the second-phase electrode 5 or the third-phase electrode 6. The CCD image sensor 24, in which the charges are output from the PDs 8 to the vertical-transfer CCDs 7 when a read pulse is supplied from the second-phase electrodes 5 or the third-phase electrodes 6, shall be hereinafter referred to as "OR-type CCD image sensor."

Figure 14:
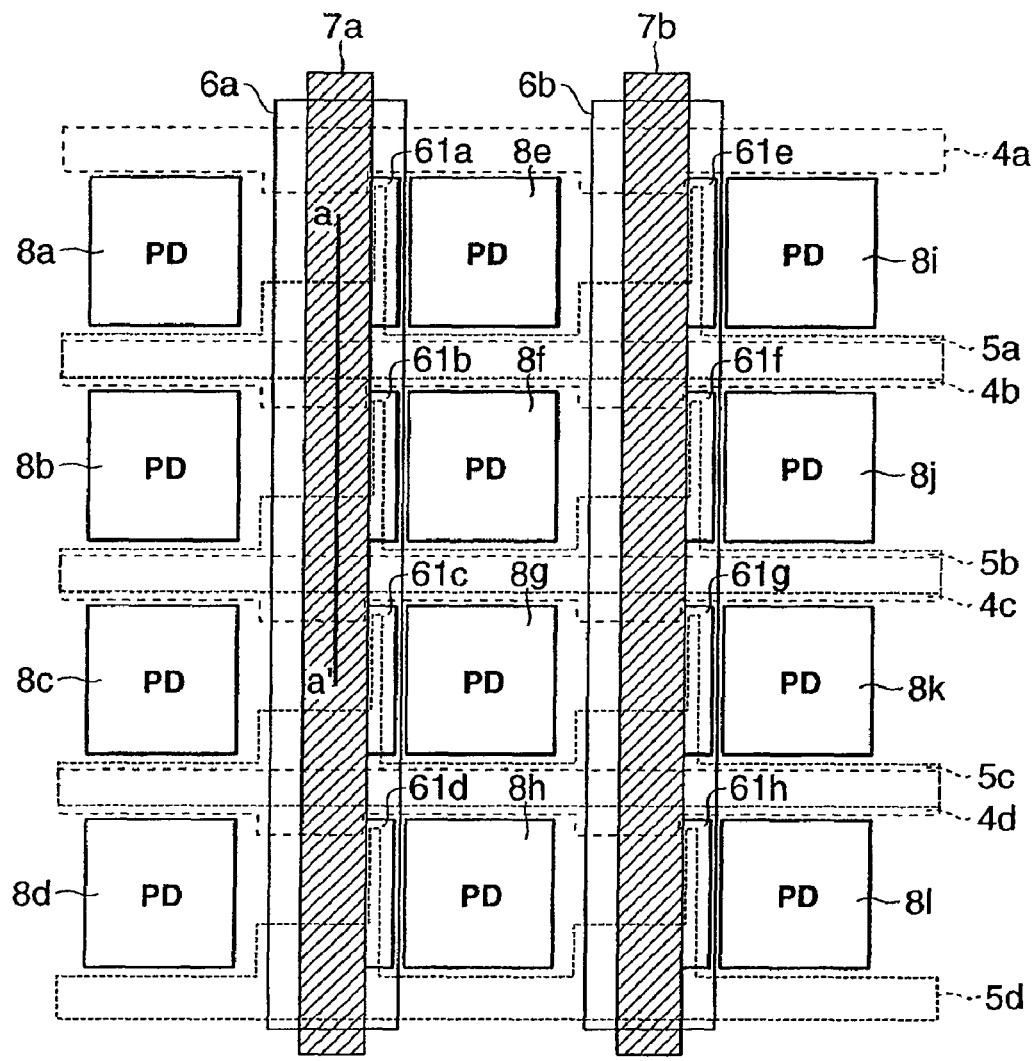
FIGS. 14 to 16 are plan views illustrating the electrode arrangement of the CCD image sensor shown in FIG. 2.

One second-phase electrode 5 and one third-phase electrode 6 may contact each transfer gate 61 and may be spaced part, as shown in FIG. 14, in the direction parallel to the plane of junction between the transfer gate 61 and one PD 8 (or in the direction, such as the vertical direction in FIG. 14, which is perpendicular to the direction of transferring the charges from the PDs 8). In this case, each transfer gate 61 transfers an electric charge from the PD 8 to the vertical-transfer CCD 7 when it receives read pulses from both the second-phase electrode 5 and the third-phase electrode 6. The CCD image sensor, in which the charges are output from the PDs 8 to the vertical-transfer CCDs 7 when read pulses are output from the second-phase electrodes 5 and the third-phase electrodes 6, shall be hereinafter referred to as "AND-type CCD image sensor."

Draft reading and all-pixel reading performed on the CCD image sensor 24 will be described. As indicated above, charges can be read from the PDs 8 provided in the CCD image sensor 24 in two methods; i.e., draft reading and all-pixel reading. In the all-pixel reading, all PDs 8 of the CCD image sensor 24 receive light and the charges accumulated in all PDs 8 are output from the CCD image sensor 24. In the draft reading, the charges accumulated in some of the PDs 8 are output from the CCD image sensor 24.

Figure 1:
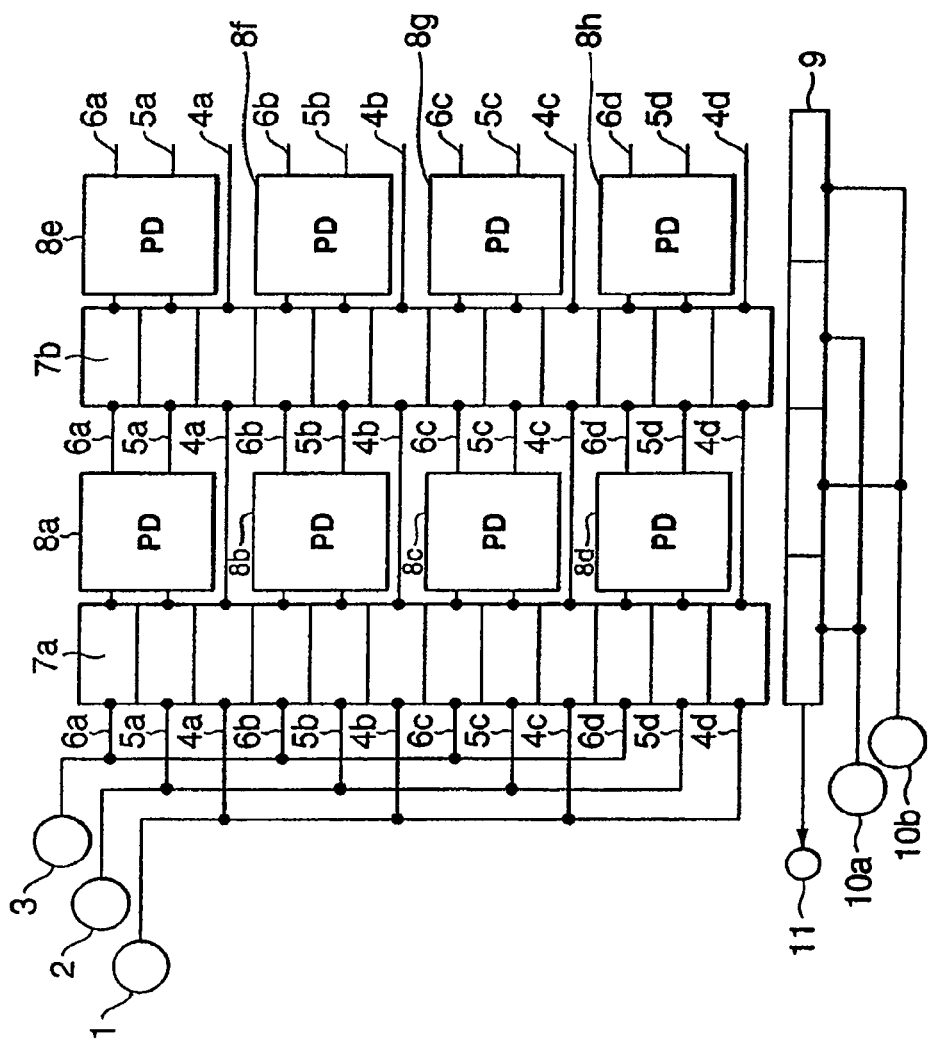
FIG. 1 is a diagram showing the electric circuit incorporated in a conventional CCD image sensor.
Figure 15:
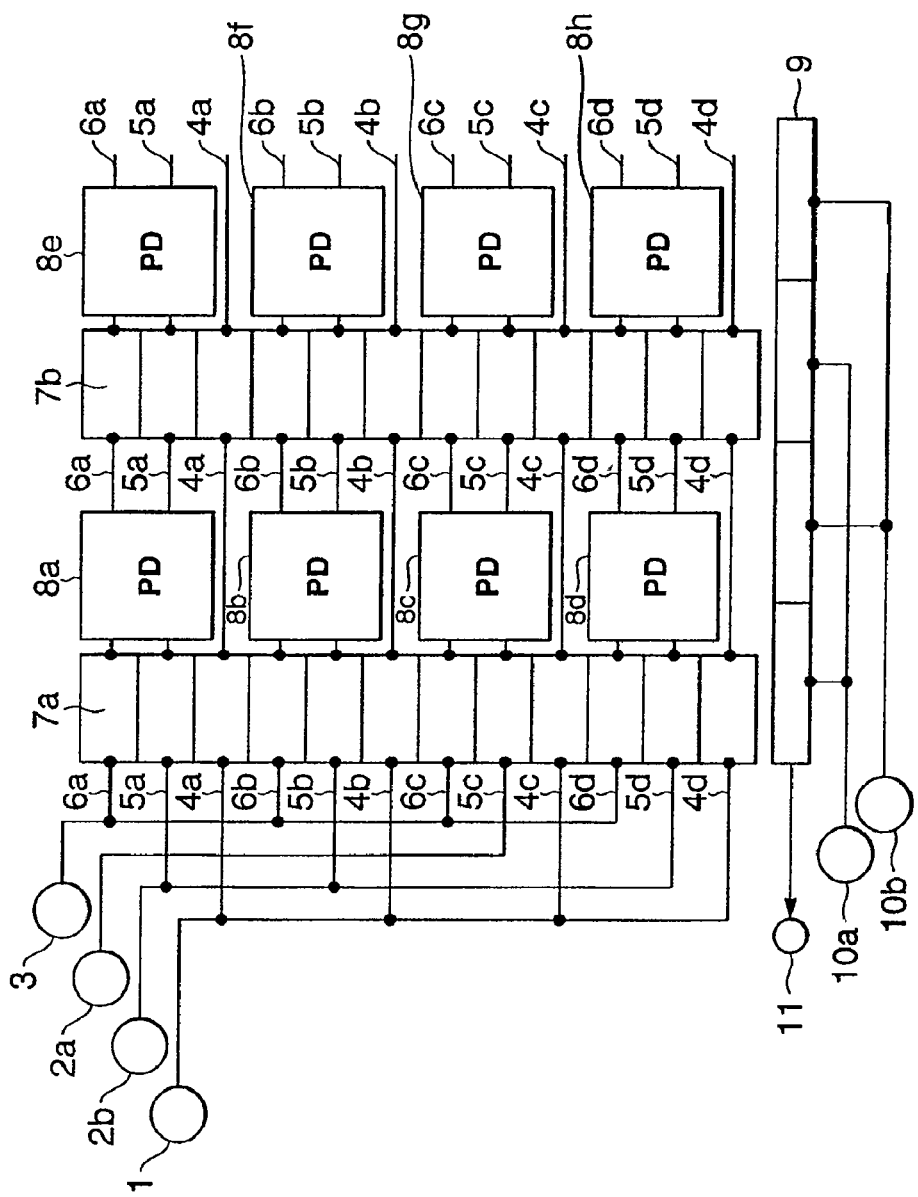

FIG. 15 depicts the electrical configuration that the CCD image sensor 24 assumes when it performs the draft reading. This electrical configuration is basically similar to the configuration illustrated in FIG. 1. Nonetheless, it differs in that the second-phase power supply 2 includes two power supplies 2a and 2b. The first second-phase power supply 2a is connected to the second-phase electrode 5c. The second second-phase power supply 2b is connected to the second-phase electrodes 5a, 5b and 5d. That is, the second second-phase power supply 2b is connected to as three times as many second-phase electrodes 5 as the first second-phase power supply 2a is. In practice, the second-phase power supply 2 is a single power supply, not including two power supplies 2a and 2b as shown in FIG. 12. Thus, the power supply 2 supplies a read pulse to the second-phase electrode 5c at a time, and to the second-phase electrodes 5a, 5b and 5d at another time.

Assume that the CCD image sensor 24 is an OR-type one (FIG. 12). In this case, when the second-phase power supply 2a (connected to the second-phase electrode 5c) outputs a read pulse, only the PDs 8c and 8g output charges because they are provided on the line connected to the second-phase electrode 5c. In other words, charges are output from the PDs 8 that constitute a one-fourth of the CCD image sensor 24. Hence, the charge transfer speed of the vertical-transfer CCDs 7 can increase four times. This achieves a high-speed operation of the CCD image sensor 24.

The draft reading is the mode applied while the digital still camera stays in the "monitor state." While the camera remains in the "monitor state," the video monitor 32 displays the image of the object photographed by the CCD image sensor 24 (the image data is not recorded at all). The video monitor 32 can display the image quickly, though the image displayed has but a poor quality because it is represented by the charges output from one of every four PDs 8 incorporated in the CCD image sensor 24.

Assume that the CCD image sensor 24 is an AND-type one (FIG. 14). In this case, too, when the second-phase power supply 2a (connected to the second-phase electrode 5c) outputs a read pulse, only the PDs 8c and 8g output charges, whereby draft reading is carried out.

All-pixel reading will be explained. The all-pixel reading is performed in one way if the exposure mode is normal mode, and in another way if the exposure mode is SVE mode. If the exposure mode is "normal," the all-pixel reading will be effected in the same manner as in the conventional CCD image sensor. That is, the charges accumulated in all PDs 8 of the CCD image sensor 24 during a specific exposure time are read out while the digital still camera remains in the above-mentioned "capture state."

If the exposure mode is SVE mode, the all-pixel reading is performed by reading charges from groups of PDs 8 provided in the CCD image sensor 24, in various patterns. The charges read from the PDs 8 of each group depend on the time for which the PDs 8 have been exposed to light.

Figure 16:
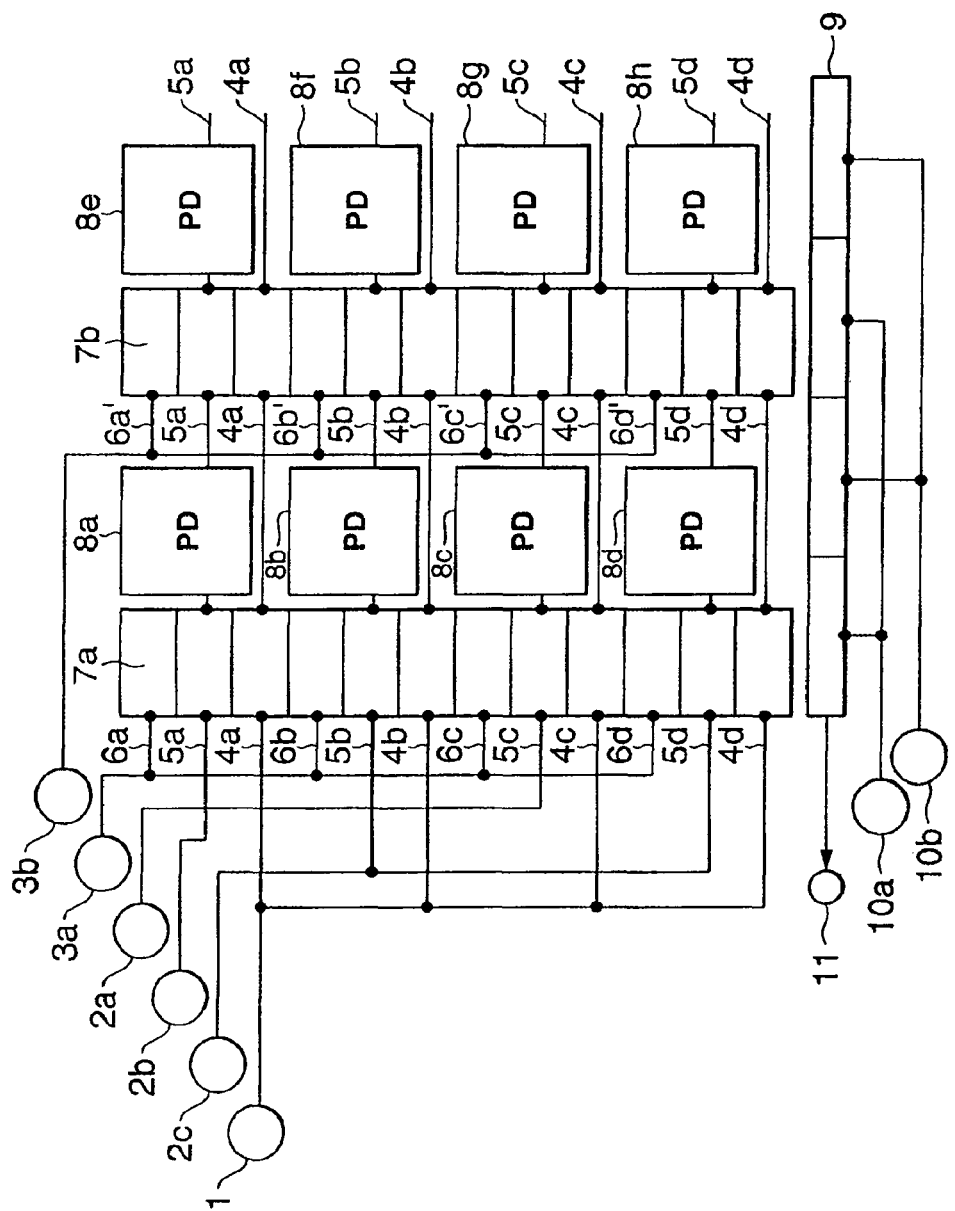

FIG. 16 depicts the electrical configuration that the CCD image sensor 24 assumes when the exposure mode is SVE mode. This electrical configuration is basically similar to the configuration illustrated in FIG. 1. It differs in that the second-phase power supply 2 includes three power supplies 2a, 2b and 2c and that the third-phase power supply 3 includes two power supplies 3a and 3b.

As shown in FIG. 16, the first second-phase power supply 2a is connected to the second-phase electrode 5c, and the second second-phase power supply 2b is connected to the second-phase electrodes 5a, and the third second-phase power supply 2c is connected to the second-phase electrodes 5b and 5d. The first third power supply 3a is connected to the third-phase electrodes 6a, 6b, 6c and 6d, and the second third-phase power supply 3b is connected to the third-phase electrodes 6a', 6b', 6c' and 6d' arranged in a column adjacent to the column constituted by the third-phase electrodes 6a, 6b, 6c and 6d that are connected to the first third-phase power supply 3a.

Since the second-phase power supplies 2a and 2b are connected to the electrodes as specified above, the PDs 8 connected to the second-phase power supplies 2 can be controlled at every other row. Since the third-phase power supplies 3 are connected to the electrodes as specified above, the PDs 8 connected to the third-phase power supplies 3 can be controlled at every other column. Thus, the exposure time is varied in some patterns, each for the PDs 8 of one group. This makes it possible to output charges from the PDs 8 to the vertical-transfer CCDs 7.

FIGS. 15 and 16 are diagrams showing two electrical configurations that the CCD image sensor 24 may have. These electrical configurations are defined by the electrode arrangement of FIG. 12 or the electrode arrangement of FIG. 14. The combination of control voltages applied to the electrodes shown in FIG. 12 or FIG. 14 is changed to provide the configuration of FIG. 15 or the configuration of FIG. 16.

Figure 17:
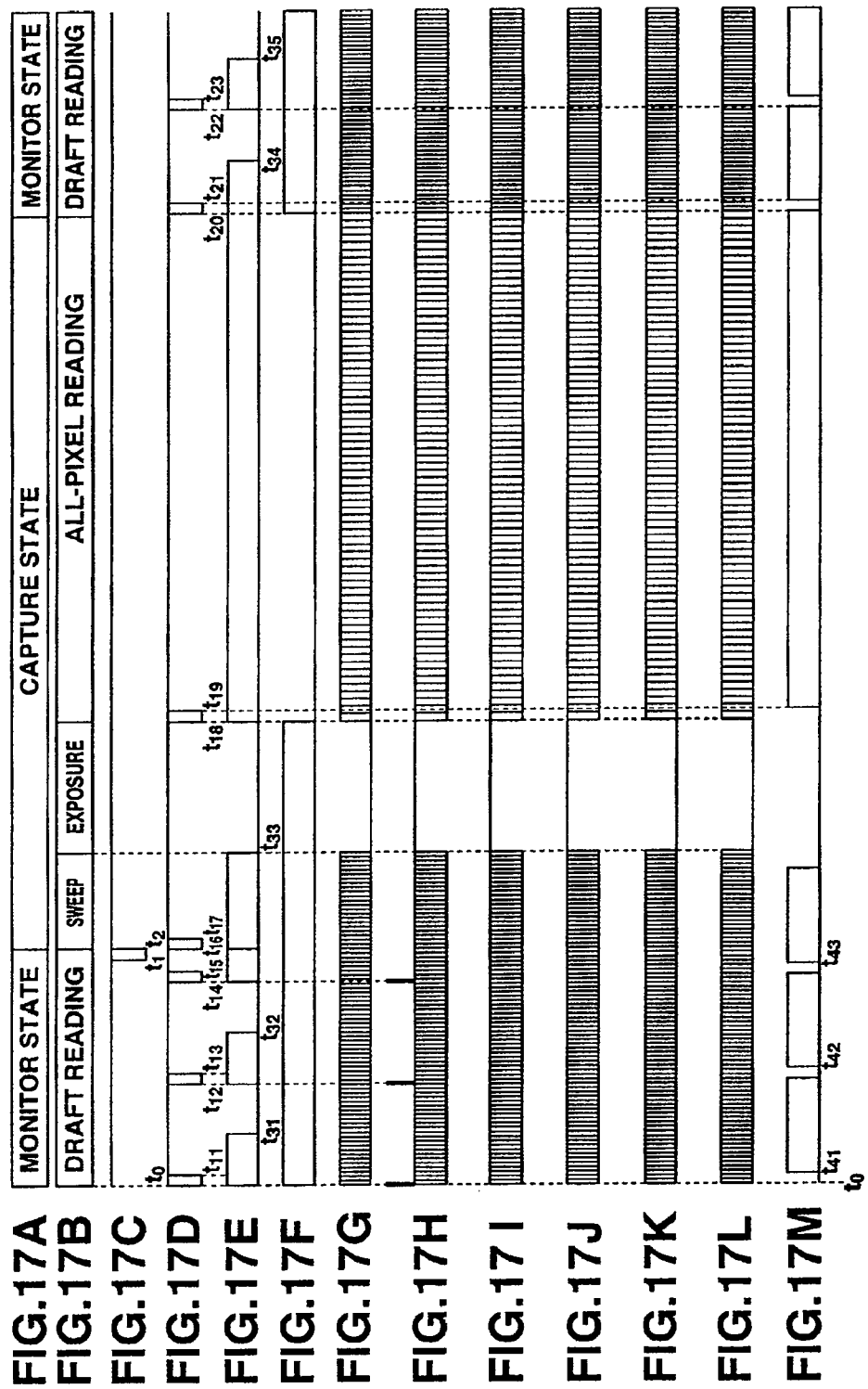
FIGS. 17A to 17M are a timing chart explaining the operation of the CCD image sensor depicted in FIG. 2.

With reference to the flowchart of FIG. 17, it will be described how the CCD image sensor 24 operates when the user pushes the capture button 41 while the action mode switch 42 and the exposure mode switch 43 are set at the "record" position and the "normal" position, respectively.

FIG. 17A illustrates the condition that corresponds to FIG. 4. FIG. 17B depicts the operation of the CCD image sensor 24. FIG. 17C shows the timing of pushing the capture button 41. FIG. 17D shows the vertical sync pulse output from the timing generator 36. FIG. 17E shows a substrate-voltage control signal (i.e., reset pulse). The control signal remains at high level while the reset pulse is being applied. FIG. 17F depicts the timing of opening and closing the shutter 21. The timing signal is at high level while the shutter 21 remains opened; it is at low level while the shutter 21 remains closed. FIGS. 17G to 17L illustrate the read pulses and transfer pulses output from the first-phase power supply 1, the second-phase power supplies 2a, 2b and 2c and the third-phase power supplies 3a and 3b. Of these pulses, those at levels higher than a reference level (i.e., signals at high level) are read pulses, and the others at level lower than the reference level (i.e., signals at low level) are transfer pluses. FIG. 17M shows the timing of outputting the image data from the CCD image sensor 24.

When the user operates the action mode switch 42, setting the same at the "record" position at time to, the digital still camera is set into the "monitor state" illustrated in FIG. 4. The draft reading starts at the same time. The timing generator 36 generates vertical sync pulses at time to, time $t_{12}$ and time $t_{14}$, as shown in FIG. 17D. This timing of generating the vertical sync pulses corresponds to one frame of the image data, which is read in. As FIGS. 17G to 17L show, the first-phase power supply 1, second-phase power supplies 2a, 2b and 2c and third-phase power supplies 3a and 3b output transfer pulses. As FIGS. 17E and 17H show, a substrate-voltage control signal is output from the timing generator 36, and a read pulse is output from the second-phase electrode 2a. More precisely, the read pulse is output immediately before the vertical sync pulse. While the substrate-voltage control signal is being output, or during the period between time to and time $t_{31}$, the charge generated by any PD 8 is applied to the substrate and is not accumulated in the PD 8. That is, the charge accumulated is reset. The substrate-voltage control signal controls the PD 8, making the same accumulate the charge for a specific time for each frame of the image that has been photographed.

Figure 18:
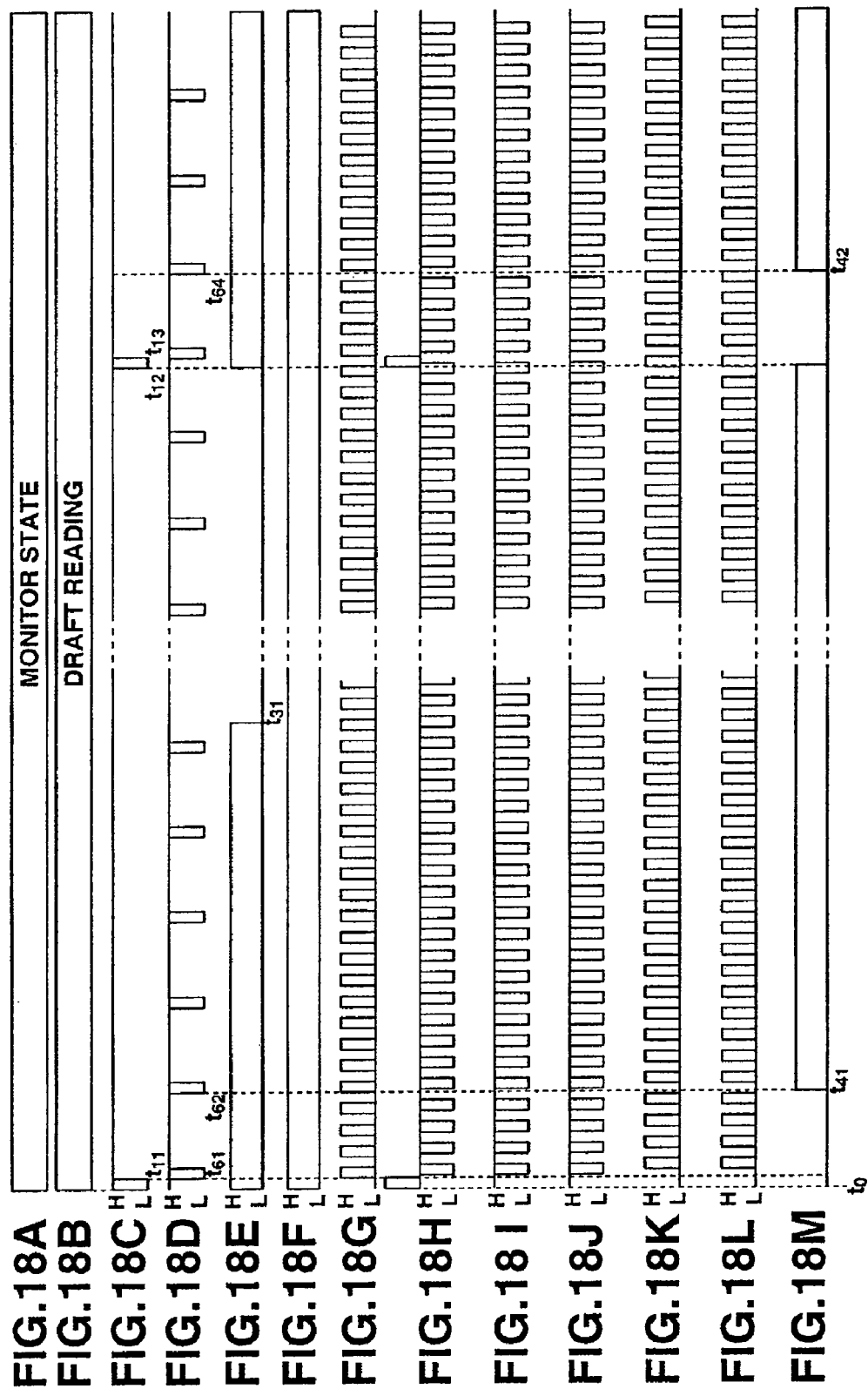
FIGS. 18A to 18M are a timing chart explaining the operation of the CCD image sensor shown in FIG. 2.

FIG. 18 is a timing chart, or a magnified chart representing the "monitor state" shown in FIG. 17A. FIG. 18A depicts the state of the digital still camera, which corresponds to FIG. 4. FIG. 18B shows the operation that the CCD image sensor 24 performs. FIG. 18C illustrates the vertical sync pulse the timing generator 36 has generated. FIG. 18D shows the horizontal sync pulse the timing generator 36 has generated. FIG. 18E shows a substrate-voltage control signal. FIG. 18F depicts the timing of opening and closing the shutter 21. FIGS. 18G to 18L show the read pulses and transfer pulses output from the first-phase power supply 1, the second-phase power supplies 2a, 2b and 2c and the third-phase power supplies 3a and 3b. FIG. 18M illustrates the timing of outputting the image data from the CCD image sensor 24.

As FIG. 18D shows, the horizontal sync pulses are output immediately after the vertical sync pulses are output (or, at time $t_{11}$, for example). They are output in the number four times less as all horizontal lines for one frame (the interval of vertical synchronization). In the period from time $t_{11}$ to $t_{62}$, for example, four transfer pulses are output from each electrode. In the draft reading, the CCD image sensor 24 assumes the configuration shown in FIG. 15. Therefore, charges are output from every fourth PD 8 of the CCD image sensor 24 when a read pulse is supplied at time $t_{11}$.

In the draft reading, the charge-reading pulse is supplied to only the second-phase electrode 2a in synchronism with the vertical sync pulse, as is illustrated in FIG. 18H. Namely, the CCD image sensor 24 takes the electrical configuration of FIG. 15. Thus, the charge-reading pulse is supplied at time $t_{11}$. When the read pulse is so supplied, the PDs 8 on every fourth horizontal line of the CCD image sensor 24 output charges to the vertical-transfer CCDs 7. The horizontal sync pulse that controls the horizontal-transfer CCD 9 are output immediately after the vertical sync pulse from time $t_{11}$, for example, for every fourth horizontal line during one-frame period. The charge transfer pulse of each phase, which drives a vertical-transfer CCD 7, is output four times during one interval of the horizontal sync pulse.

The CCD image sensor 24 starts outputting signals immediately after charges are output from the PDs 8 on the first horizontal line, for example at time $t_{41}$ (=time $t_{62}$), as is illustrated in FIG. 18M. The sensor 24 stops outputting signals immediately before the next vertical-transfer pulse is generated (for example, at time $t_{12}$). More specifically, the charge output from a PD 8 and reduced to a quarter in the vertical direction is first transferred for four lines and immediately transferred at high speed. This sequence of process is repeated as many times as the horizontal sync pulses (¼ of all horizontal lines). As a result, one-frame image data, representing ¼ of the original pixels, is output during the period from $t_{41}$ to $t_{12}$. This process is repeated, too.

Figure 19:
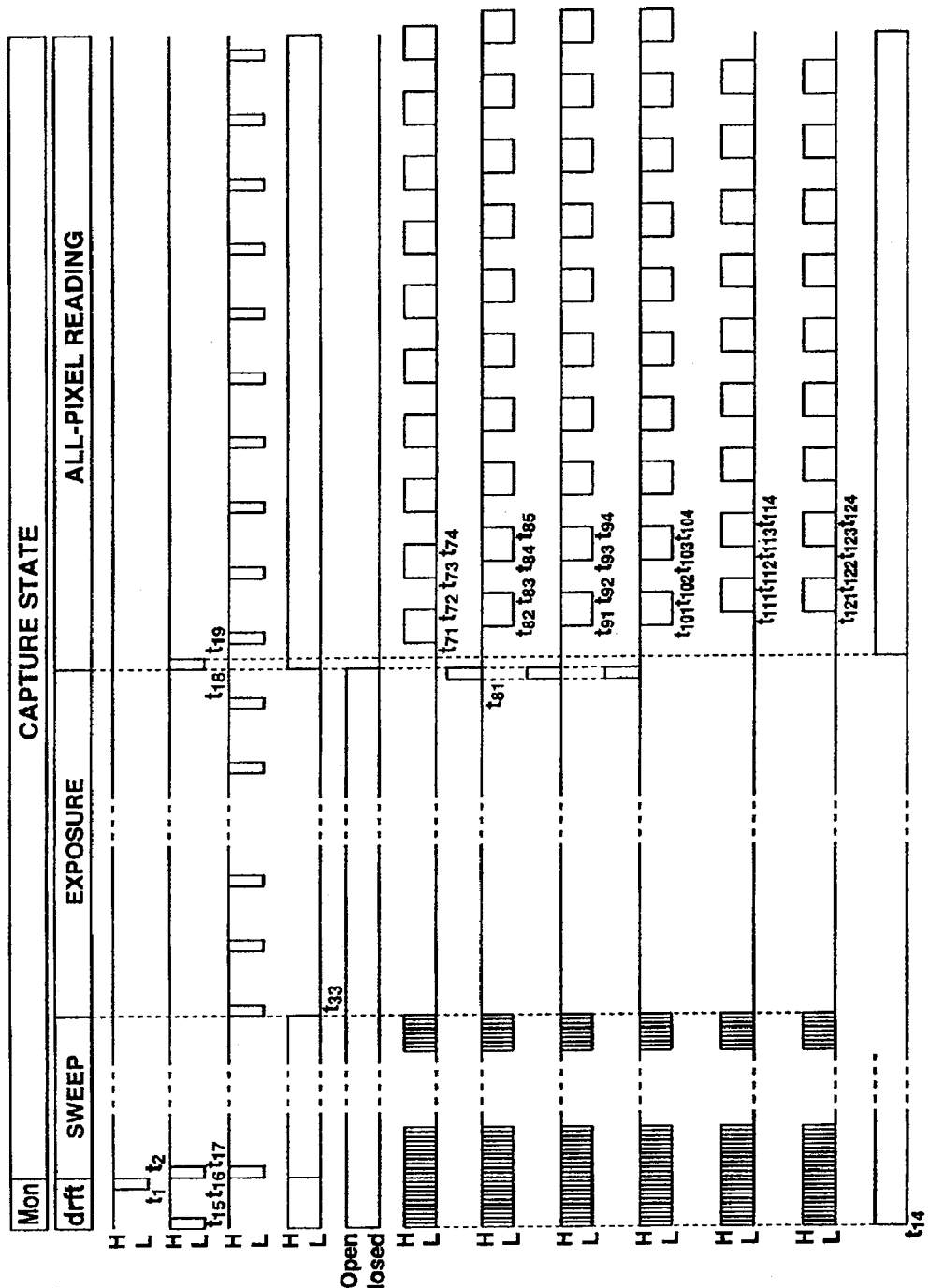
FIGS. 19A to 19N are a timing chart explaining the operation of the CCD image sensor illustrated in FIG. 2.

FIG. 19 is a timing chart, or a magnified chart representing the "capture state" shown in FIG. 17A. FIG. 19A depicts the state of the digital still camera, which corresponds to FIG. 4. FIG. 19B shows the operation that the CCD image sensor 24 performs. FIG. 19C illustrates the timing at which the capture button 41 is depressed. FIG. 19D shows the vertical sync pulse the timing generator 36 has generated. FIG. 19E shows the horizontal sync pulse the timing generator 36 has generated. FIG. 19F depicts a substrate-voltage control signal. FIG. 19G shows the timing of opening and closing the shutter 21. FIGS. 19H to 19M show the read pulses and transfer pulses output from the first-phase power supply 1, the second-phase power supplies 2a, 2b and 2c and the third-phase power supplies 3a and 3b. FIG. 19N illustrates the timing of outputting the image data from the CCD image sensor 24.

As seen from FIG. 19C, the camera starts assuming the "capture state" at the trailing edge of the pulse that indicates the capture button 41 has been pushed. While the camera stays in the "capture state," "charge sweep," "exposure process," and "all-pixel reading" are performed in the order they are mentioned. The "charge sweep" is the process of sweeping charges accumulated in the PDs 8 and the charges accumulated in the vertical-transfer CCDs 7 and horizontal-transfer CCD 9 (i.e., the charges transferred during the draft reading). As FIG. 19F shows, the substrate-voltage control signal is applied during the period from time $t_{16}$ (=$t_2$) to time $t_{33}$. The charges are thereby released from the PDs 8. All charges being transferred in the vertical-transfer CCDs 7 and the horizontal-transfer CCD 9 are extracted as is illustrated in FIGS. 19H to 19M.

As FIG. 19F shows, the "exposure process" starts at time t33 when the "charge sweep" ends. The substrate-voltage control signal falls to low level at this time, and the PDs 8 start accumulating charges. The timing generator 36 is controlled to stop supplying pulses to the CCD image sensor 24. Hence, the first-phase power supply 1, second-power supplies 2a, 2b and 2c and third-phase power supplies 3a and 3b do not output read pulses or transfer pulses. The vertical-transfer CCDs 7 therefore stops transferring charges. (The vertical-transfer CCDs 7 accumulate no charge because they have been discharged during the "charge sweep.") As FIG. 19G shows, the "exposure process" continues until the shutter is closed at a prescribed time.

The "all-pixel reading" starts when the shutter is closed, as is illustrated in FIG. 19G. If the CCD image sensor 24 is an OR-type one, the second-phase electrodes 2a, 2b and 2c supply read pulses to all PDs 8 at the same time, at time $t_{81}$ when the shutter is closed. If the CCD image sensor 24 is an AND-type one, the third-phase electrodes 3a and 3b supply read pulses, too. Upon receipt of these read pulses, the PDs 8 outputs the charges they have accumulated to the vertical-transfer CCDs 7. The PDs 8 accumulate no new charges because the substrate-voltage control signal rises to high level.

From time $t_{18}$ when the shutter is closed, the first-phase power supply 1, second-phase power supplies 2a, 2b and 2c and third-phase power supplies 3a and 3b output as many transfer pulses as the horizontal lines of PDs 8. The charges output from the PDs 8 to the vertical-transfer CCDs 7 are thereby transferred to the horizontal-transfer CCD 9. Note that the transfer pulse output from the first-phase electrode 1 rises at time $t_{71}$ as shown in FIG. 19H, the transfer pulses output from the second-phase electrodes 2a, 2b and 2c fall at time $t_{82}$ (=time $t_{91}$=time $t_{101}$) as shown in FIGS. 19I, 19J and 19K. The pulses output from the third-phase electrodes 3a and 3b rise at time $t_{111}$ (=time $t_{121}$) as shown in FIG. 19L and FIG. 19M. The pulses rise and fall so in order to transfer charges in the vertical-transfer CCDs 7. The CCD image sensor 24 starts outputting the image data at time $t_{122}$ immediately after the shutter is closed, as is illustrated in FIG. 19N.

Assume that the capture button 41 is pushed while the action mode switch 42 and the exposure mode switch 43 are set at the "record" position and the "SVE" position, respectively. How the CCD image sensor 24 operates in this condition will be described below.

The CCD image sensor 24 operates basically in the same way as when the exposure mode switch 43 is set at the "normal" position. Thus, the exposure process that is performed while the sensor 24 assumes the SVE exposure mode will be described.

How the CCD image sensor 24 effects the exposure process if it is an OR-type image sensor will be described with reference to FIG. 20. FIG. 20A shows the operation the CCD image sensor 24 performs. FIG. 20B shows the vertical sync pulse output from the timing generator 36. FIG. 20C shows the horizontal sync pulse output from the timing generator 36. FIG. 20D depicts a substrate-voltage control signal. FIG. 20E shows the timing of closing and opening the shutter 21. FIG. 20F to 20K depict the read pulses and transfer pulses output from the first-phase power supply 1, the second-phase power supplies 2a, 2b and 2c and the third-phase power supplies 3a and 3b. The following description is based on the assumption that, for brevity of explanation, the exposure process lasts for a period that corresponds to 16 horizontal-transfer pulses and each PD 8 accumulates an electric charge of 1Q during one interval of a horizontal-transfer pulse. It is also assumed that the light applied to the PDs 8 does not change in intensity.

When the exposure process starts at time $t_{33}$, all PDs 8 start accumulating charges. FIG. 21 shows how the charge in each PD 8 changes with time. FIG. 21A shows the operation that the CCD image sensor 24 performs. FIG. 21B depicts the vertical sync pulse output from the timing generator 36. FIG. 21C depicts the horizontal sync pulse output from the timing generator 36. FIG. 21D illustrates a substrate-voltage control signal. FIGS. 21E to 21H show the electric charges that the PDs 8a, 8b, 8e and 8f (arranged forming the upper 2×2 matrix, shown in FIG. 16) accumulate. The thick solid lines shown in FIG. 20 indicate the charges to be output to the vertical-transfer CCDs 7.

As can be understood from FIGS. 20I and 20J, the second-phase power supply 2c and the third-phase power supply 3a may output read pulses at time $t_{151}$, immediately before the substrate-voltage control signal rises to high level. If this is the case, the PDs 8b, 8d, 8f and 8h, which are connected to the second-phase electrodes 5b and 5d, output charges, and the PDs 8a to 8d, which are connected to the third-phase electrodes 6a to 6d, output charges. Hence, the vertical-transfer CCDs 7 read charges of 1Q from the PDs 8a, 8b and 8E Since no transfer pulses are output at this time, the charges output from the PDs 8a, 8b and 8f are accumulated on the vertical-transfer CCDs 7. In this case, the charges output from the PD 8a, 8b, 8e and 8f are accumulated in the vertical-transfer CCDs 7, having values 1Q, 1Q, OQ and 1Q, respectively.

Immediately thereafter, a substrate-voltage control signal is applied at time $t_{131}$ as shown in FIG. 21D. As a result, the charges are released from the PDs 8 as illustrated in FIGS. 21E to 21H. Thus, the PDs 8 accumulate no charges at all.

Then, the PDs 8 start accumulating charges at time $t_{132}$, as is shown in FIG. 21E to 21H.

As FIGS. 20G and 20H show, the seventh horizontal sync pulse is output at time $t_{133}$. Immediately before time $t_{133}$, a charge of 6Q is accumulated in each PD 8, as is illustrated in FIGS. 21E to 21H. At this time, the second-phase power supplies 2a and 2b output read pulses. The PDs 8a and 8e, which are connected to the second-phase electrodes 2a and 2b, therefore output charges of 6Q to the vertical-transfer CCDs 7, as is illustrated in FIGS. 21E and 21G. At time $t_{141}$, the charge of 1Q, accumulated in the vertical-transfer CCD 7, has not been transferred yet. This charge (1Q) is added to the charge of 6Q, whereby a charge of 7Q is accumulated. Thus, at time $t_{141}$, the charges output from the PDs 8a, 8b, 8e and 8f and having values of 7Q, 1Q, 6Q and 1Q, respectively, are accumulated in the vertical-transfer CCDs 7.

Immediately thereafter, or at time $t_{133}$, the pulse of the substrate-voltage control signal is supplied as shown in FIG. 20D. Then, all PDs 8 cease to accumulate electrical charges. At time $t_{134}$ when pulses cease to exist in the substrate-voltage control signal, the PDs 8 start accumulating charges again, as is shown in FIG. 21H.

At time $t_{135}$, or immediately before the exposure process is terminated, each PD 8 accumulates a charge of 9Q. If the third-phase power supply 3a outputs a read pulse at this time, the charges of 9Q are output from the PDs 8a and 8b that are connected to the third-phase electrodes 6a and 6b. In this case, the vertical-transfer CCDs 7 accumulate the charges output from the PDs 8a, 8b, 8e and 8f, or 16Q, 10Q, 6Q and 1Q, respectively.

Different exposure times, or different sensitivities, therefore can be imparted to the adjacent four PDs 8, arranged in the form of a 2×2 matrix. More precisely, the four PDs 8a, 8b, 8e and 8f can be set at four different exposure times, 16, 10, 6 and 1, respectively. Not only the PDs 8a, 8b, 8e and 8f, but also the PDs 8c, 8d, 8g and 8h accumulate different charges. Hence, four different exposure times (four different sensitivities) can be set in any 2×2 block of photodiodes. The four different exposure times (sensitivities) can, of course, be changed by changing the timing of outputting read pulses from the electrodes. Moreover, this pattern can be altered by changing the timing at which the substrate-voltage control signal is applied.

In the above description, an exposure time corresponds to 16 horizontal sync pulses. Nonetheless, the exposure time may be lengthened, and the read pulses and the substrate-voltage control signal may be repeatedly supplied in such a pattern as shown in FIG. 20. As described above, the pulses of the substrate-voltage control signal are input immediately after the read pulses are supplied. Nevertheless, only the read pulses and the substrate-voltage control signal need to be supplied in the present invention.

Figure 22:
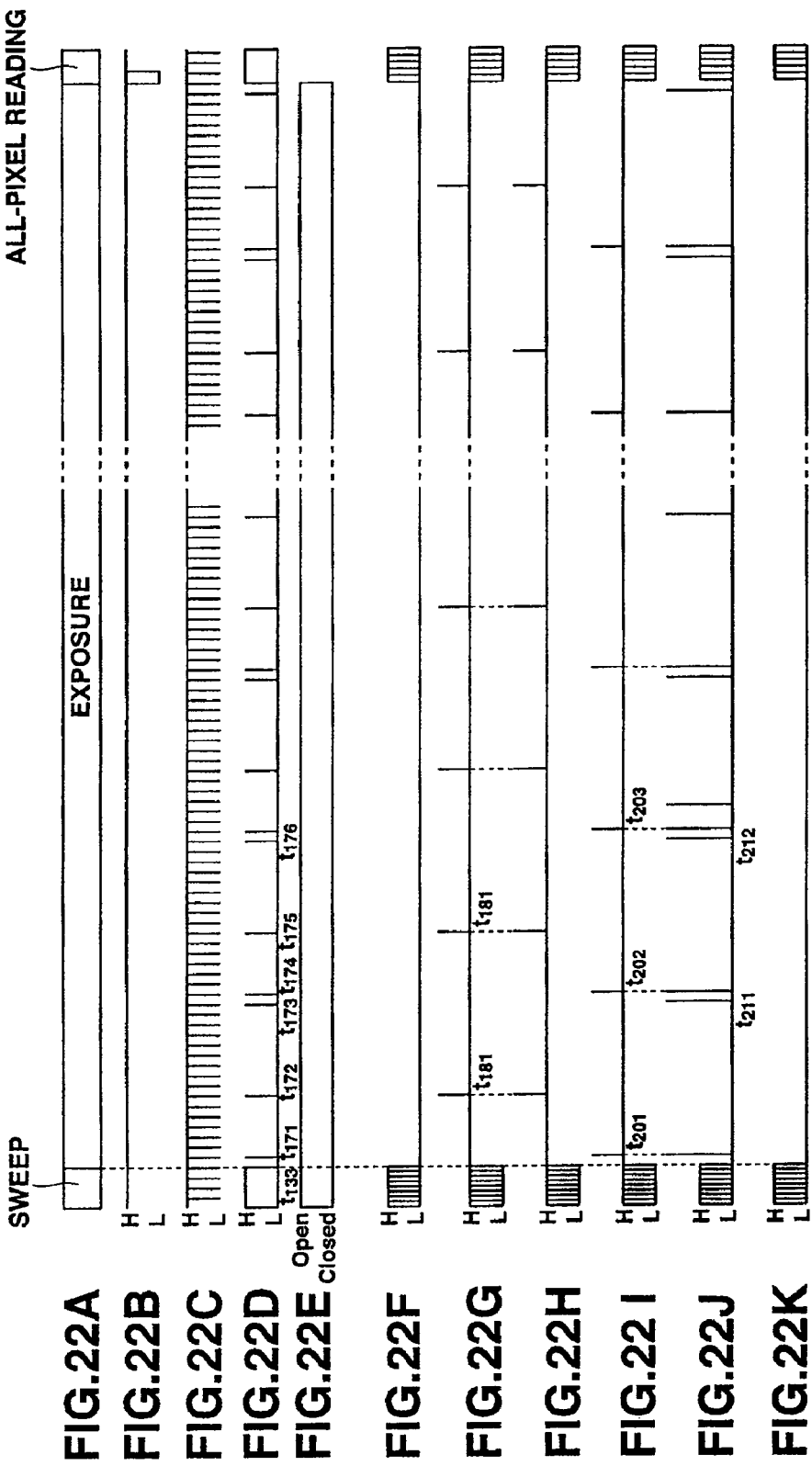
FIGS. 22A to 22K are a timing chart explaining the operation of the CCD image sensor depicted in FIG. 2.

As FIG. 22 shows, the frequency of the horizontal sync pulses may be increased, thus shortening the intervals of the horizontal sync pulses. In this case, the pattern of read pulses and substrate-voltage control signal, shown in FIG. 20, may be compressed in time and may be repeated several times within the exposure time.

Figure 20:
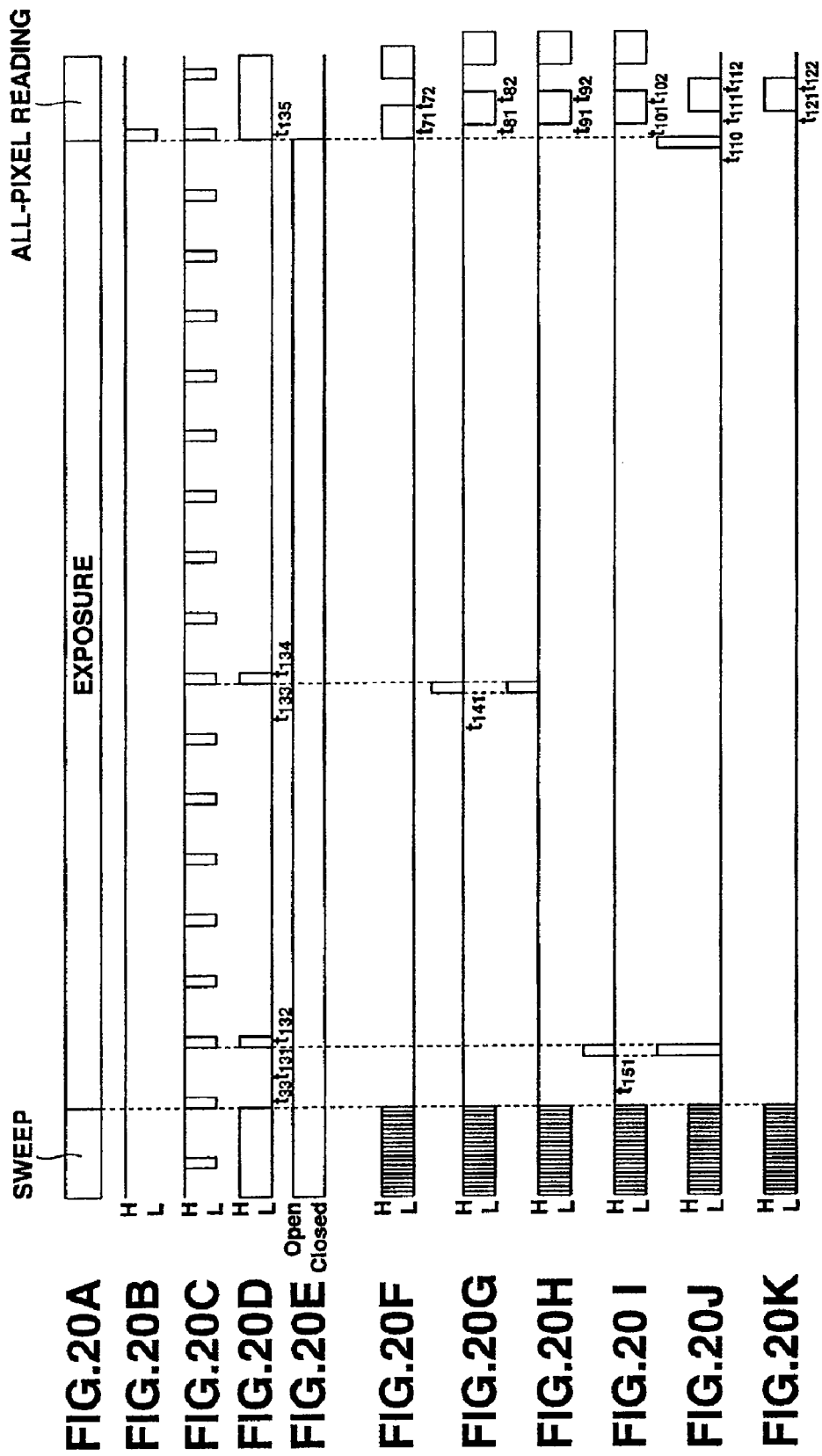
FIGS. 20A to 20K are a timing chart explaining the operation of the CCD image sensor shown in FIG. 2.
Figure 21:
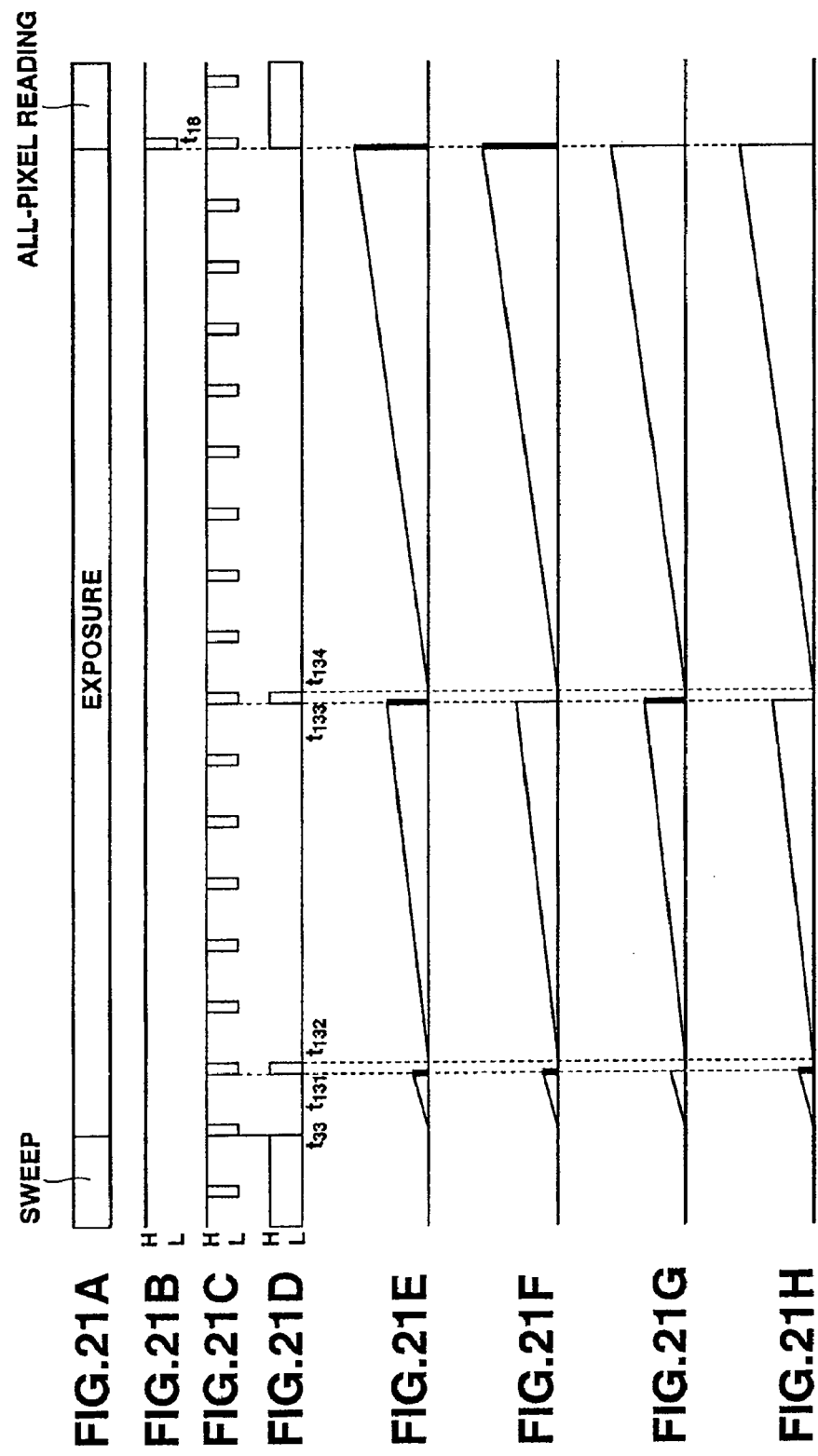
FIGS. 21A to 21H are a timing chart explaining the operation of the CCD image sensor illustrated in FIG. 2.

The read pulses at time $t_{151}$, which are shown in FIGS. 20I and 203, respectively, correspond to the read pulses at time $t_{201}$, $t_{202}$ and $t_{203}$ that are shown in FIGS. 22I and 22J. The pulses of the substrate-voltage control signal, which are shown in FIG. 20D and which are generated at time $t_{131}$ and time $t_{133}$ correspond to the pulses at time $t_{171}$ time $t_{172}$, time $t_{174}$, and time $t_{175}$, which are shown in FIG. 22D. The read pulse at time tic, shown in FIGS. 20G and 20H, corresponds to the read pulses shown in FIGS. 22G and 22H. As seen from the timing charts of FIGS. 20 and 22, the CCD image sensor 24 can be controlled at different timings If the CCD image sensor 24 is controlled in the timing shown in FIG. 22, the charge output from each PD 8 can be more dispersed and more readily detected than in the case where the sensor 24 is controlled in the timing illustrated in FIG. 20. The exposure time (sensitivity) of each PD 8 is the same in both cases.

How the exposure process is performed in the SVE mode if the CCD image sensor 42 is an AND-type one will be described, with reference to the timing chart of FIG. 23. FIG. 23A shows the operation the CCD image sensor 24 performs. FIG. 23B depicts the vertical sync pulses output from the timing generator 36. FIG. 23C shows the horizontal sync pulses output from the timing generator 36. FIG. 23D illustrates a substrate-voltage control signal. FIG. 23E represents the timing of opening and closing the shutter 21. FIG. 23F to 23K depict the read pulses and transfer pulses output from the first-phase power supply 1, the second-phase power supplies 2a, 2b and 2c and the third-phase power supplies 3a and 3b.

When the exposure process is initiated at time $t_{33}$, all the PDs 8 start accumulating charges. FIG. 24 illustrates how each PD 8 accumulates an electric charge. FIG. 24A depicts the operation the CCD image sensor carries out. FIG. 24B shows the vertical sync pulses output from the timing generator 36. FIG. 24C depicts the horizontal sync pulses output from the timing generator 36. FIG. 24D illustrates a substrate-voltage control signal. FIG. 24E to 24H show the charges accumulated in the PDs 8a, 8b, 8e and 8E As seen from FIGS. 23I and 23J, the PD 8b connected to the second-phase electrodes 5b and the third-phase electrodes 6b outputs a charge when the second-phase power supply 2c and the third-phase power supply 3a output read pulses at time $t_{231}$, or immediately before the first horizontal sync pulse is output. Therefore, the PD 8b supplies a charge of 1Q to the vertical-transfer CCDs 7 as is illustrated in FIG. 24F. In this case, the charges output from the PDs 8a, 8b, 8e and 8f, i.e., 0Q, 1Q, 0Q and 0Q, are applied to the vertical-transfer CCDs 7.

As a result, the PD 8b outputs a charge and no longer accumulates any charge. Nonetheless, it starts accumulating a charge again, immediately after time $t_{231}$.

As FIGS. 24E, 24G and 24H show, charges of 3Q are accumulated in the PDs 8a, 8e and 8f at time $t_{221}$, or immediately before the third horizontal sync pulse is output as shown in FIGS. 23G, 23H and 23K. If the second-phase power supplies 2a and 2b and the third-phase power supply 3b output read pulses at this time, the PD 8e connected to the second-phase electrode 5a and third-phase electrodes 6a' outputs charges of 3Q to the vertical-transfer CCDs 7 as is illustrated in FIG. 24G. In this case, the charges output from the PDs 8a, 8b, 8e and 8f, i.e., 0Q, 1Q, 3Q and 0Q, are applied to the vertical-transfer CCDs 7 at time $t_{221}$.

Further, as FIGS. 24E and 24H, charges of 8Q are accumulated in the PDs 8a and 8f at time $t_{222}$, or immediately before the ninth horizontal sync pulse is output as shown in FIGS. 23G, 23H and 23J. If the second-phase power supplies 2a and 2b and the third-phase power supply 3a output read pulses at this time, the PD 8a connected to the second-phase electrode 5a and third-phase electrodes 6a outputs charges of 8Q to the vertical-transfer CCDs 7 as is illustrated in FIG. 24E. In this case, the charges output from the PDs 8a, 8b, 8e and 8f, i.e., 8Q, 1Q, 3Q and 0Q, are applied to the vertical-transfer CCDs 7 at time $t_{222}$.

As FIG. 24H shows, the PD 8f accumulates a charge of 16Q at time $t_{233}$, or immediately before the exposure process ends as is illustrated in FIGS. 23I and 23K. If the second-phase power supply 2c and the third-phase power supply 3b output read pulses, the PD 8f connected to the second-phase electrode 5b and third-phase electrode 3b outputs a charge of 16Q. In this case, the charges output from the PDs 8a, 8b, 8e and 8f, i.e., 8Q, 1Q, 3Q and 16Q, are applied to the vertical-transfer CCDs 7 at time $t_{233}$.

During the exposure process, no charges are transferred from the vertical-transfer CCDs 7 as described above. Hence, the charges output from the PDs 8 are accumulated in the vertical-transfer CCDs 7. Thus, the adjacent PDs 8 can be set at different exposure times, i.e., different sensitivities. More specifically, the PDs 8a, 8b, 8e and 8f can be set at four different exposure times; 8, 1, 3 and 16, respectively. The charges in the PDs 8a, 8b, 8e and 8f change has been described with reference to FIG. 24. Similar changes in charge take place in the PDs 8c, 8d, 8g and 8h, too. Thus, the exposure time (sensitivities) can be changed in a 2×2 matrix of PDs 8 in four patterns. Each pattern of changing the exposure time (sensitivities) can be varied by changing the timing of supplying read pulses from the electrodes.

In the above description, an exposure time corresponds to 16 horizontal sync pulses. Nonetheless, the exposure time may be lengthened, and the read pulses may be repeatedly supplied in such a pattern as shown in FIG. 23. As described above, the sensitivities of the PDs 8 are controlled by read pulses only.

Instead, the sensitivities may be controlled by a combination of read pulses and a substrate-voltage control signal.

Figure 23:
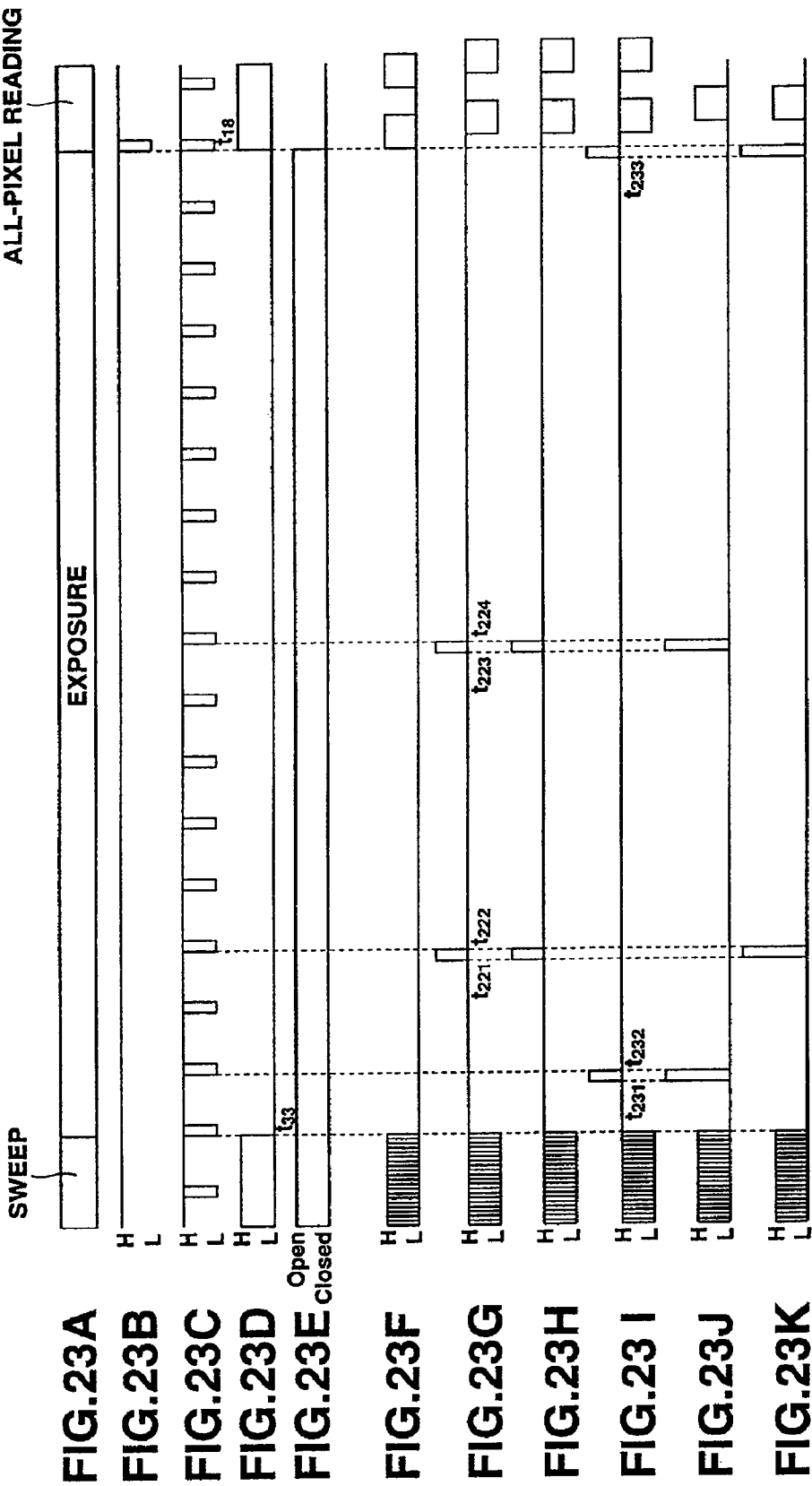
FIGS. 23A to 23K are a timing chart explaining the operation of the CCD image sensor illustrated in FIG. 2.
Figure 24:
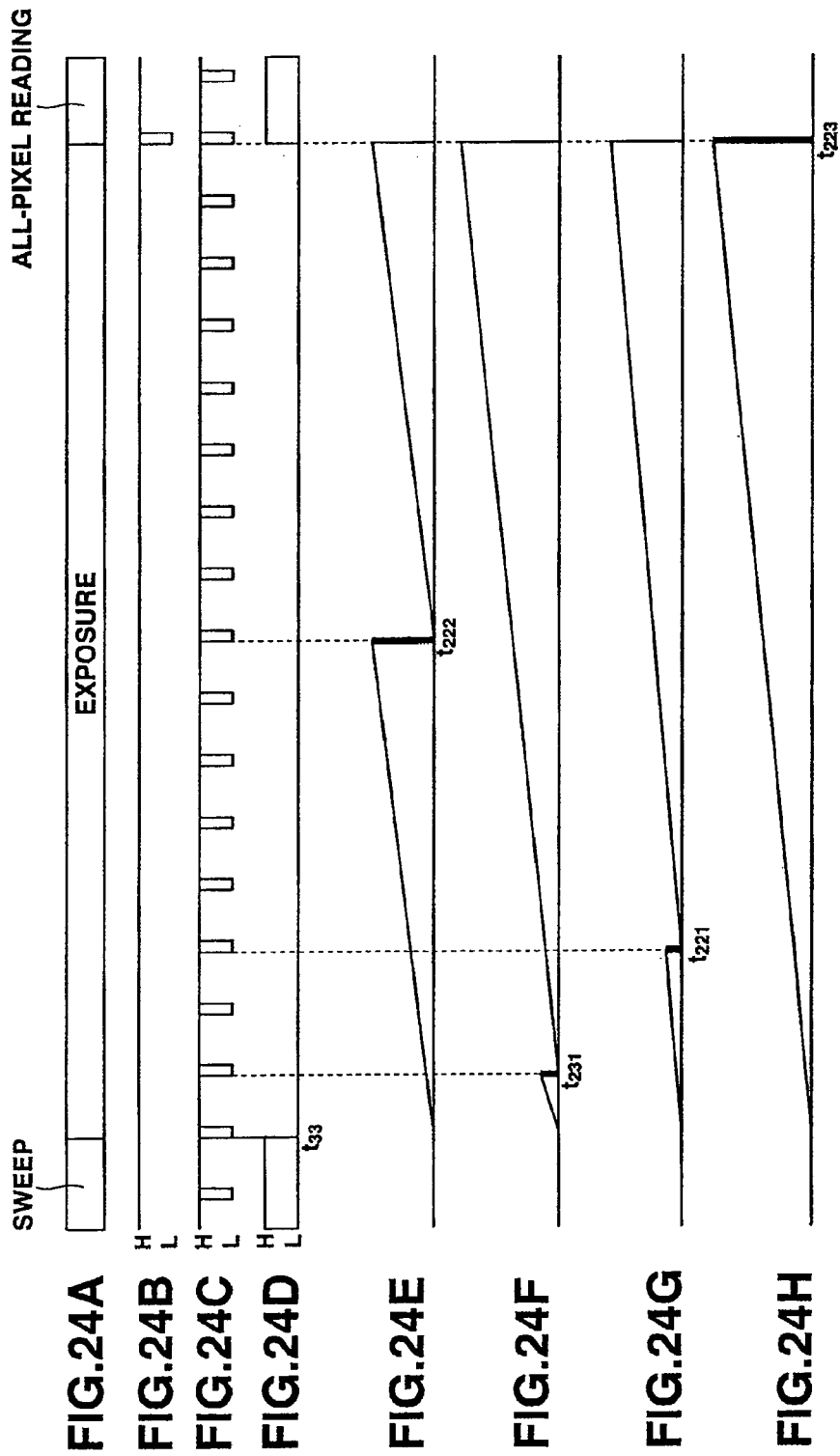
FIGS. 24A to 24H are a timing chart explaining the operation of the CCD image sensor shown in FIG. 2.
Figure 25:
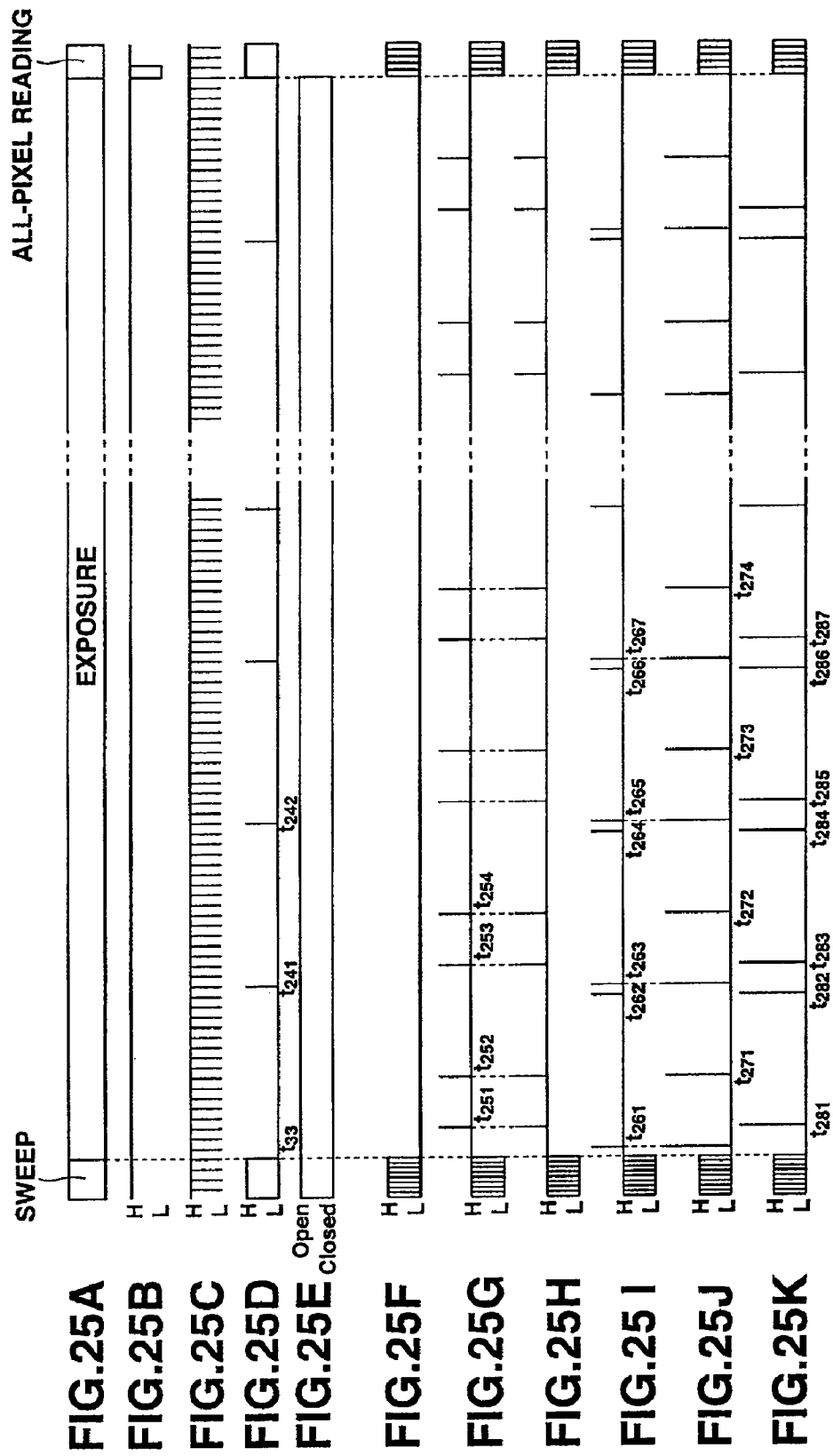
FIGS. 25A to 25K are a timing chart explaining the operation of the CCD image sensor depicted in FIG. 2.

Moreover, as FIG. 25 shows, the frequency of the horizontal sync pulse may be increased, thus compressing the read pulses and the substrate-voltage control signal several times within the same exposure time as is illustrated in FIG. 23.

That is, the read pulses at time $t_{231}$ shown in FIGS. 23I and 23J correspond to the read pulses at time $t_{261}$, time $t_{263}$, time $t_{265}$ and time $t_{267}$ shown in FIGS. 25I and 25J. The read pulses at time $t_{221}$ shown in FIGS. 23G, 23H and 23K correspond to the read pulse at time $t_{251}$, (=$t_{281}$) and time $t_{253}$ $t_{283}$) shown in FIGS. 25G, 25H and 25K. The read pulses at time $t_{223}$ shown in FIGS. 23G, 23H and 23J correspond to the read pulse at time $t_{252}$, (=$t_{271}$) and time $t_{254}$ $t_{272}$) shown in FIGS. 25G, 25H and 25J. As can be understood from the timing charts of FIGS. 23 and 25, the CCD image sensor 24 may be controlled in the timing shown in FIG. 25. If so, the charge output from each PD 8 can be more dispersed and more readily detected than in the case where the sensor 24 is controlled in the timing illustrated in FIG. 23. The exposure time (sensitivity) of each PD 8 is the same in both cases.

As indicated above, the sensitivity pattern of the adjacent PDs 8 can be electronically changed in various ways by combining the read pulses and the substrate-voltage control signal, no matter whether the CCD image sensor 24 is of OR type or AND type Particularly in this embodiment, three second-phase power supplies and two third-phase power supplies are used to control the PDs 8, thereby setting four different sensitivity patterns for each 2×2 matrix of PDs 8. Nonetheless, more second-phase power supplies and more third-phase power supplies may be used to set more sensitivity patterns for the PDs 8.

How the DSP 27 processes the image signals generated by the CCD image sensor 24 will be described. To facilitate the understanding of the DSP 27, it will be explained how the position of each pixel input to the DSP 27 is expressed in terms of coordinates, with reference to FIG. 26.

Figure 26:
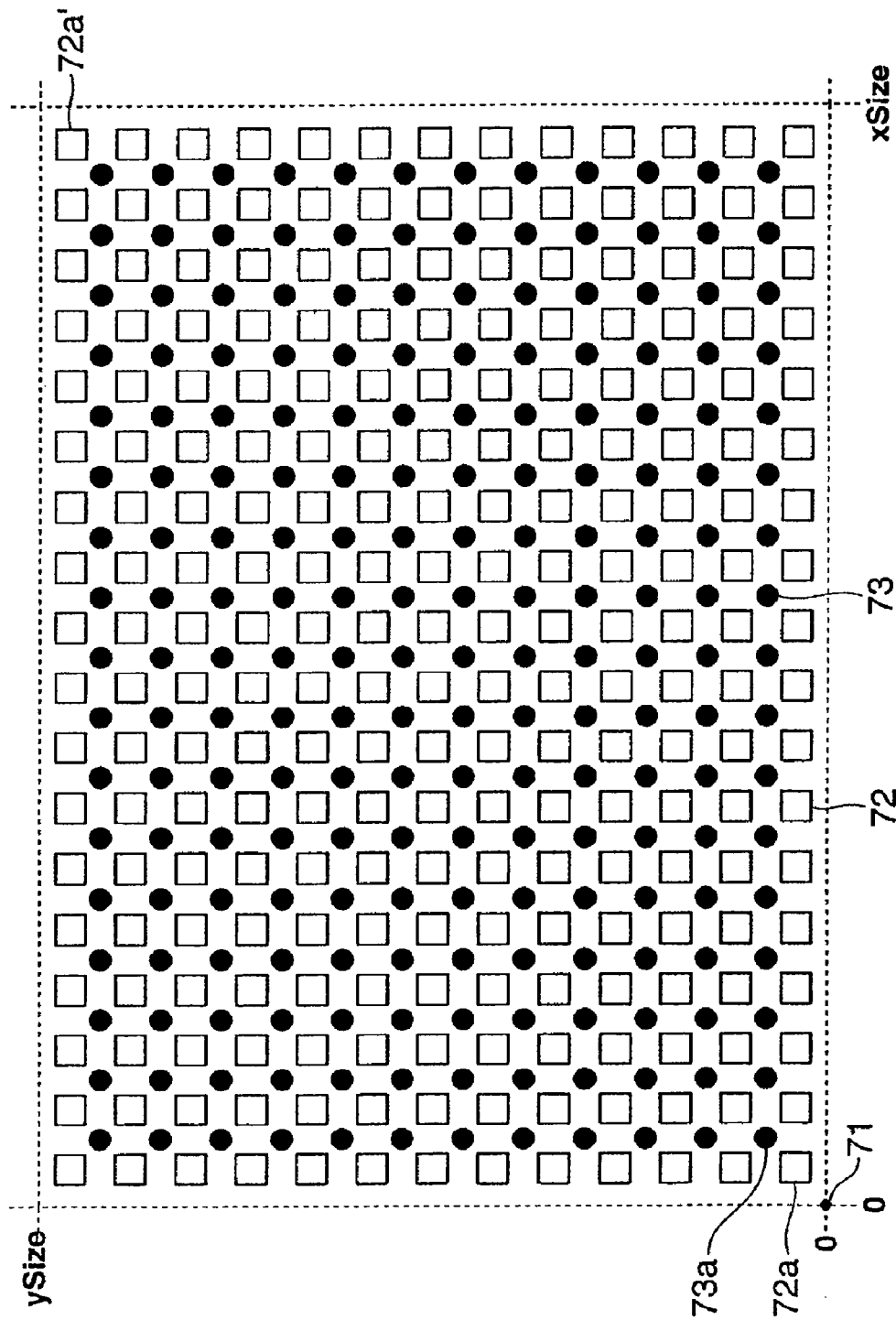
FIG. 26 is a diagram representing the pixel matrix and intermediate pixel matrix of an image photographed by the digital still camera of FIG. 2.

In FIG. 26, the origin 71 is at the lower-left corner of the matrix, and the coordinates (xSize, ySize) are at the upper-right corner. The coordinate xSize represents the width of the image, while the coordinate ySize represents the height of the image. In FIG. 26, the squares indicate the pixels, which display the image photographed by the PDs 8. The height and width of each pixel are units of coordinates. The center of the pixel 72a at the lower-left corner is therefore represented by coordinates (0.5, 0.5). Similarly, the center of the pixel 72a' at the upper-right corner is represented by coordinates (xSize−0.5, ySize−0.5).

In FIG. 26, the black dots indicate intermediate pixels 73. The position of the intermediate pixel 73a at the lower-left corner is represented by coordinates (1, 1). Each intermediate pixel 73 is virtual pixel that lies among four adjacent pixels (squares) that correspond to four data items generated by four PDs 8. The data items corresponding to the intermediate pixels are generated as will be described later.

Figure 27:
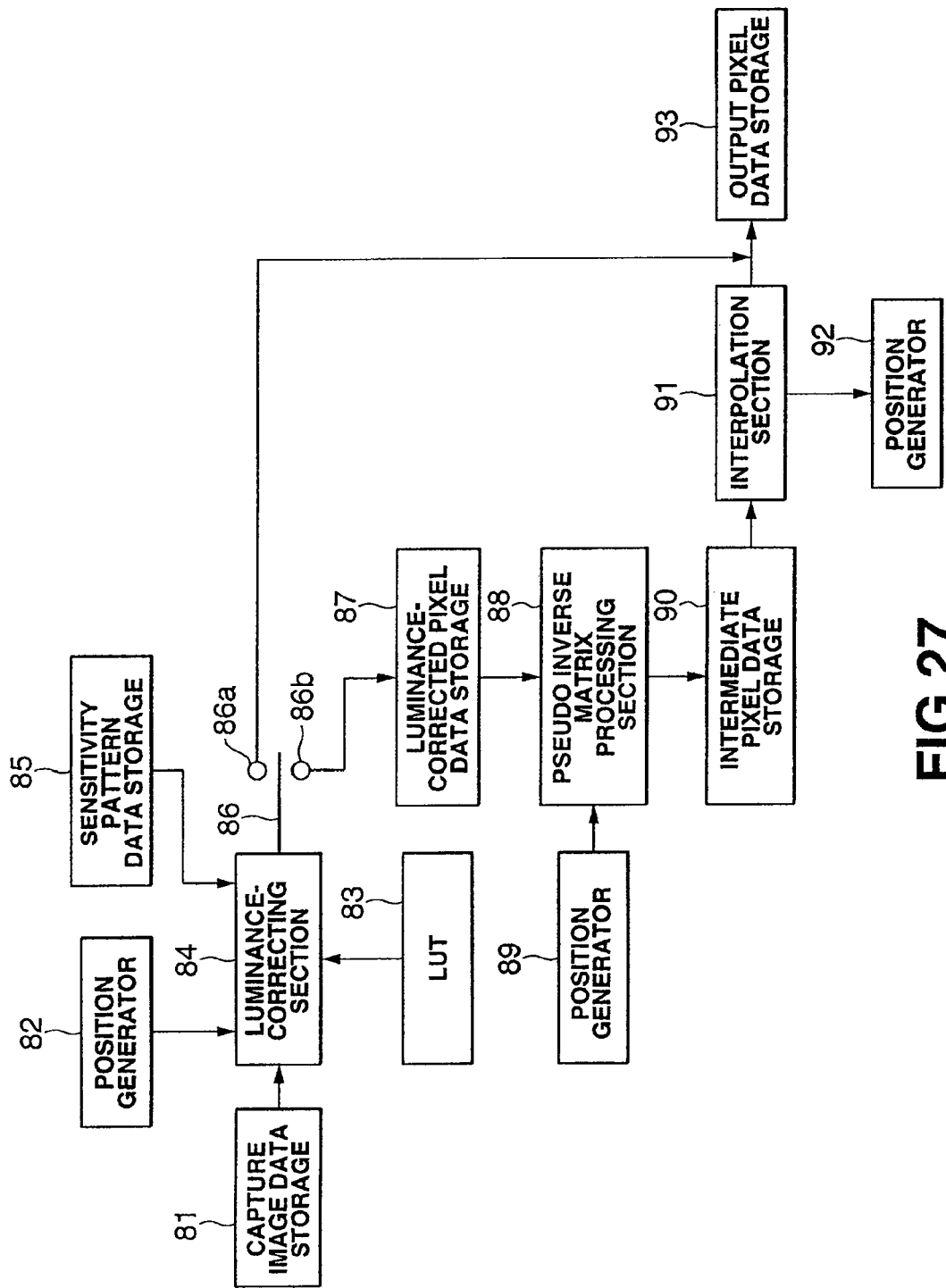
FIG. 27 is a block diagram of the DSP incorporated in the digital still camera illustrated in FIG. 2.

The DSP 27 incorporated in the photographing device according to the present invention will be descried in detail, with reference to FIG. 27.

In the DSP 27, a capture image data storage 81 stores the pixel data Ic generated by the CCD image sensor 24 and processed by the CDS circuit 25 and the A/D converter circuit 26. A position generator 82 incorporates counters that count x- and y-axis coordinates of the pixel data Ic read into the DSP 27. The position generator 82 can therefore generate data items that represent the positions of pixels. A LUT (Look-up Table) 83 stores data that is used to achieve gamma correction of the pixel data Ic stored in the capture image data storage 81. The LUT 83 stores other data, too. The other data is used to accomplish gamma correction on images photographed in the SVE mode, in accordance with the exposure times set for the PDs 8.

A luminance-correcting section 84 reads the pixel data Ic stored in the capture image data storage 81. The section 84 refers to the LUT 83 and generates pixel data Io (x, y) or pixel data (Im (x, y)) from the pixel position (x, y) corresponding to the pixel data Ic. The section 84 outputs the pixel data Io (x, y) to an output pixel data storage 93 in the normal mode, or the pixel data Im (x, y) to a luminance-corrected pixel data storage 87 in the SVE mode, through a switch 86 that is controlled in association with the exposure mode switch 43.

Figure 28:
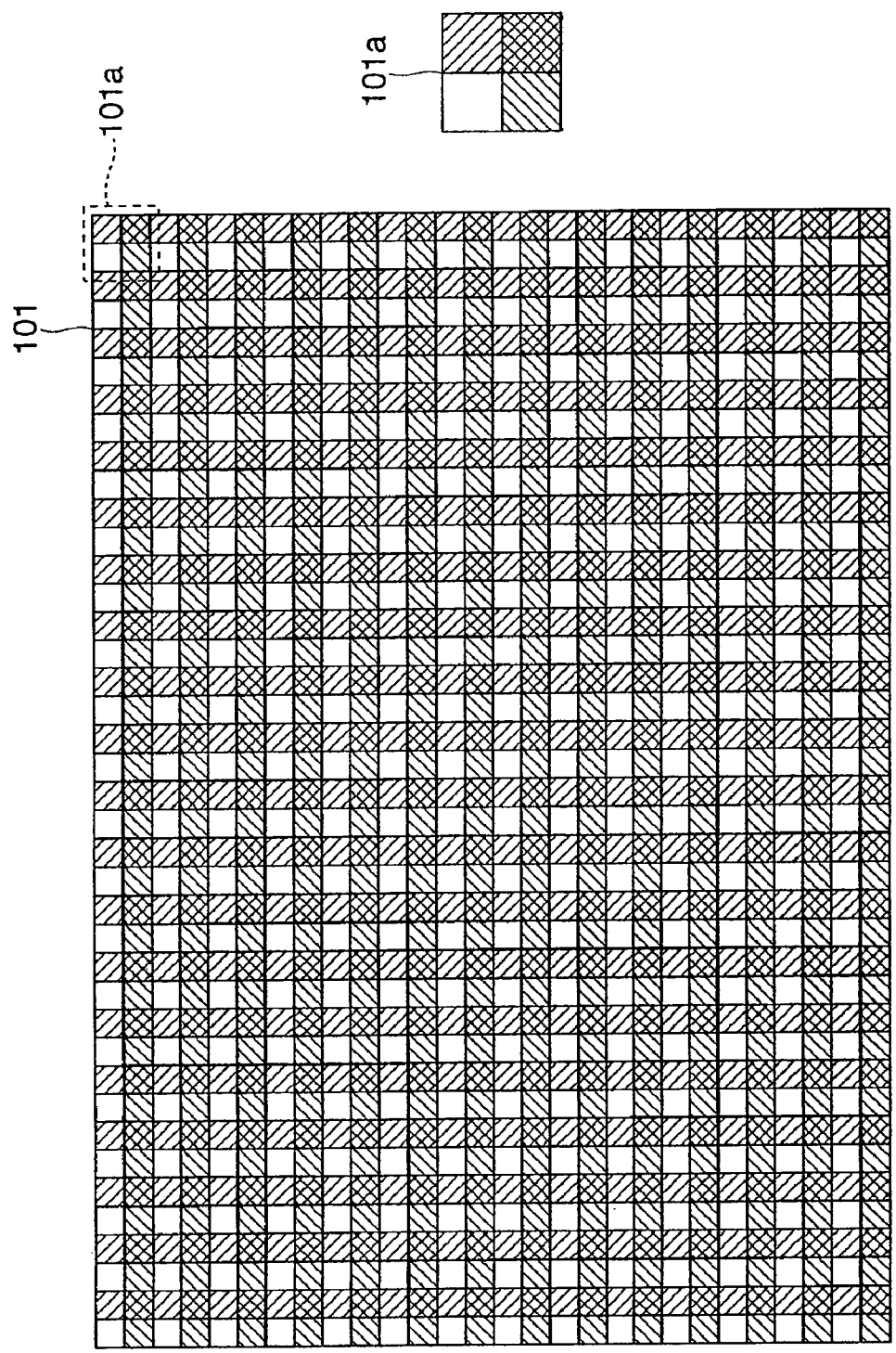
FIG. 28 is a diagram showing the sensitivity distribution in the pixel matrix.

The sensitivity pattern storage 85 stores the data representing the sensitivity that each pixel has in the SVE mode (i.e., the exposure time of each PD 8). Assume that a plan image (an image composed of pixels of the same value) is photographed in the SVE mode. Then, an image 101 shown in FIG. 28 is generated. This image 101 is composed of 2×2 pixel blocks 101a arranged in a predetermined number of rows and a predetermined number of columns. The four pixels constituting each pixel block 101a have four different sensitivities. The sensitivity pattern storage 85 stores the data that represents the four different sensitivities of the pixels that constitute each pixel block 101a. The luminance-corrected pixel data storage 87 stores the pixel data Im (x, y) output from the luminance-correcting section 84.

A pseudo inverse matrix processing section 88 receives the pixel data Im (x, y) stored in the luminance-corrected pixel data storage 87 and the coordinate data generated by a position generator 89. The section 88 generates an intermediate (luminance) pixel data B (x, y) from the pixel data Im (x, y) and the coordinate data, by using a prescribed interpolation filter. The intermediate pixel data B (x, y) is stored into an intermediate pixel data storage 90.

An interpolation section 91 processes the intermediate pixel data B (x, y) stored in the intermediate pixel data storage 90 and the coordinate position generated by a position generator 92, thus generating a pixel data Io (x, y) of the output image by using the above-mentioned interpolation filter. The pixel data thus generated is stored into the output pixel data storage 93.

Figure 29:
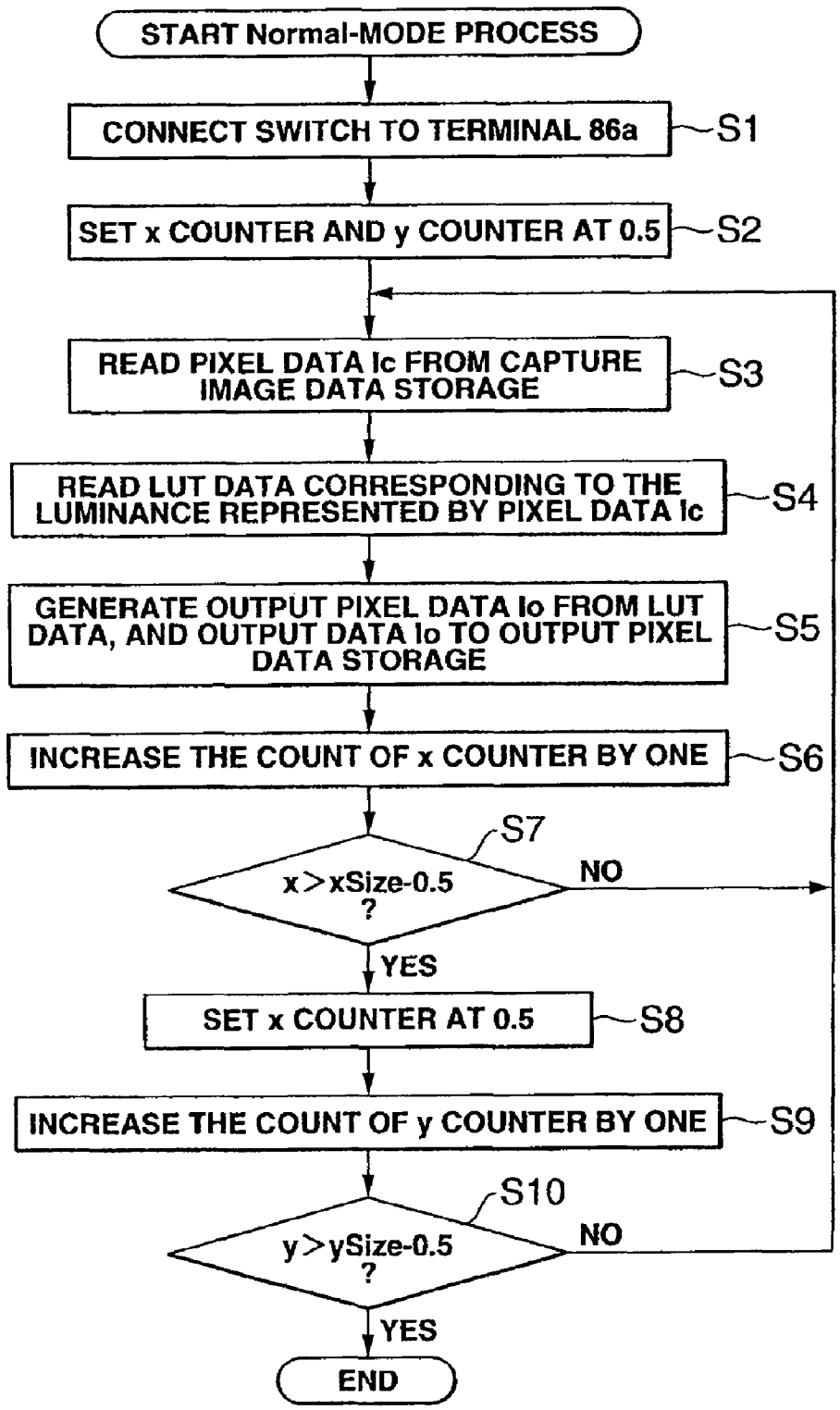
FIG. 29 is a flowchart explaining how the DSP operates in the normal mode.

How the DSP 27 operates in the normal mode will now be explained, with reference to the flowchart of FIG. 29.

In Step S1, the exposure mode switch 43 is set at the "normal" position and the switch 86 is thereby connected to a terminal 86a.

In Step S2, the x counter and the y counter incorporated in the position generator 82 are reset to the value of 0.5. In Step S3, the luminance-correcting section 84 reads the pixel data Ic from the capture image data storage.

In Step S4, the luminance-correcting section 84 refers to the LUT 83, reading the LUT data that corresponds to the luminance represented by the pixel data Ic read from the capture image data storage.

In Step S5, the luminance-correcting section 84 processes the pixel data Ic in accordance with the LUT data, thereby generating output pixel data Io. The output pixel data Io is supplied to the output pixel data storage 93. As a result, the data output first will be the pixel data Io (0.5, 0.5).

In Step S6, the position generator 82 increases the count of the x counter by one. In Step S7, the position generator 82 determines whether the count of the x counter is greater than xSize−05, or x>xSize−0.5. In other words, it determines whether the count of the x counter has exceeded the maximum width of the image. If the count x is found not to have exceeded xSize−0.5, the process returns to Step S3.

If it is determined in Step S7 that the count x has exceeded xSize−0.5, the process goes to Step S8. In Step S8, the position generator 82 sets the count of the x counter back at 0.5. In Step S9, the position generator 82 increases the count of the y counter by one. In Step S10, the position generator 82 determines whether the count of the y counter is greater than ySize−0.5, or y>ySize−0.5. That is, the generator 82 determines whether the count of the y counter has exceeded the maximum height of the image. If the count y is found not to have exceeded ySize−0.5, the process returns to Step S3. Step S3 and the following steps are repeated. If it is determined in Step S7 that the count y has exceeded ySize−0.5, the process is terminated.

Thus, the LUT 83 is used to perform the gamma correction (luminance correction) on each pixel in the DSP while the exposure mode remains "normal."

How the DSP 27 operates in the SVE mode will be described, with reference to the flowchart of FIG. 30.

In Step S21, the exposure mode switch 43 is set at the "SVE" position, whereby the switch 86 is connected to a terminal 86b. In Step S22, the luminance-correcting section 84 performs luminance correction in the SVE mode.

Figure 31:
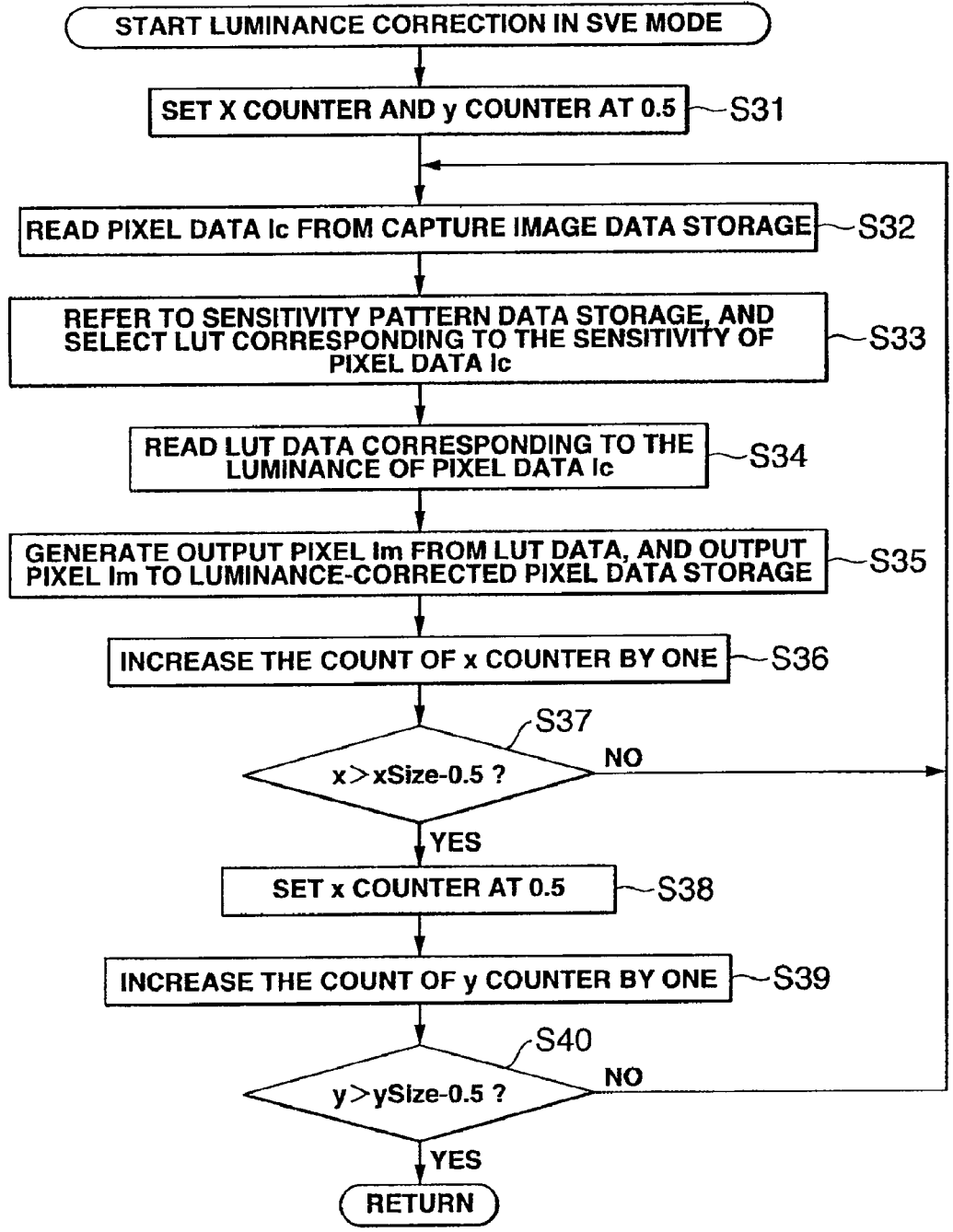
FIG. 31 is a flowchart explaining how luminance correction is effected in the SVE mode.

How the luminance correction is carried out in the SVE mode will be described, with reference to the flowchart of FIG. 31.

In Step S31, the position generator 82 initializes the counts of the x counter and y counter at 0.5. In Step S32, the position generator 82 reads the pixel data Ic from the capture image data storage 81 and generates pixel data Ic (x, y) from the coordinate data the position generator 82 has generated.

In Step S33, the luminance-correcting section 84 refers to the sensitivity pattern storage 85, thereby reading the sensitivity of the PD 8 that has generated the charge corresponding to the pixel data Ic (x, y). The section 84 then selects the LUT data stored in the LUT 83 and corresponding to the sensitivity read from the sensitivity pattern storage 85. In Step S34, the luminance-correcting section 84 reads the LUT data selected, from the LUT 83. In Step S35, the luminance-correcting section 84 performs luminance correction on the pixel data Ic (x, y), thus generating pixel data Im (x, y). The pixel data Im (x, y) is output to the luminance-corrected pixel data storage 87.

In Step S36, the position generator 82 increases the count of the x counter by one. In Step S37, the position generator 82 determines whether the count of the x counter has exceeded xSize−0.5. If the count has not exceeded xSize−0.5, the process returns to Step S32. Steps S32 to S37 are therefore repeated.

If it is determined in Step S37 that the count of the x counter has exceeded xSize−0.5, the process goes to Step S38. In Step S38, the position generator 82 resets the x counter at a count value of 0.5. In Step S39, the position generator 82 increases the count of the y counter by one. In Step S40, the position generator 82 determines whether the count of the y counter has exceeded ySize−0.5. If the count has exceeded ySize−0.5, the process is terminated. If it is determined in Step S40 that the count has not exceeded ySize−0.5, the process returns to Step S32. In this case, Steps S32 to S40 are repeated.

That is, in the luminance correction in the SVE mode, any pixel data undergoes gamma correction that accords with the sensitivity of the pixel represented by the pixel data.

Figure 30:
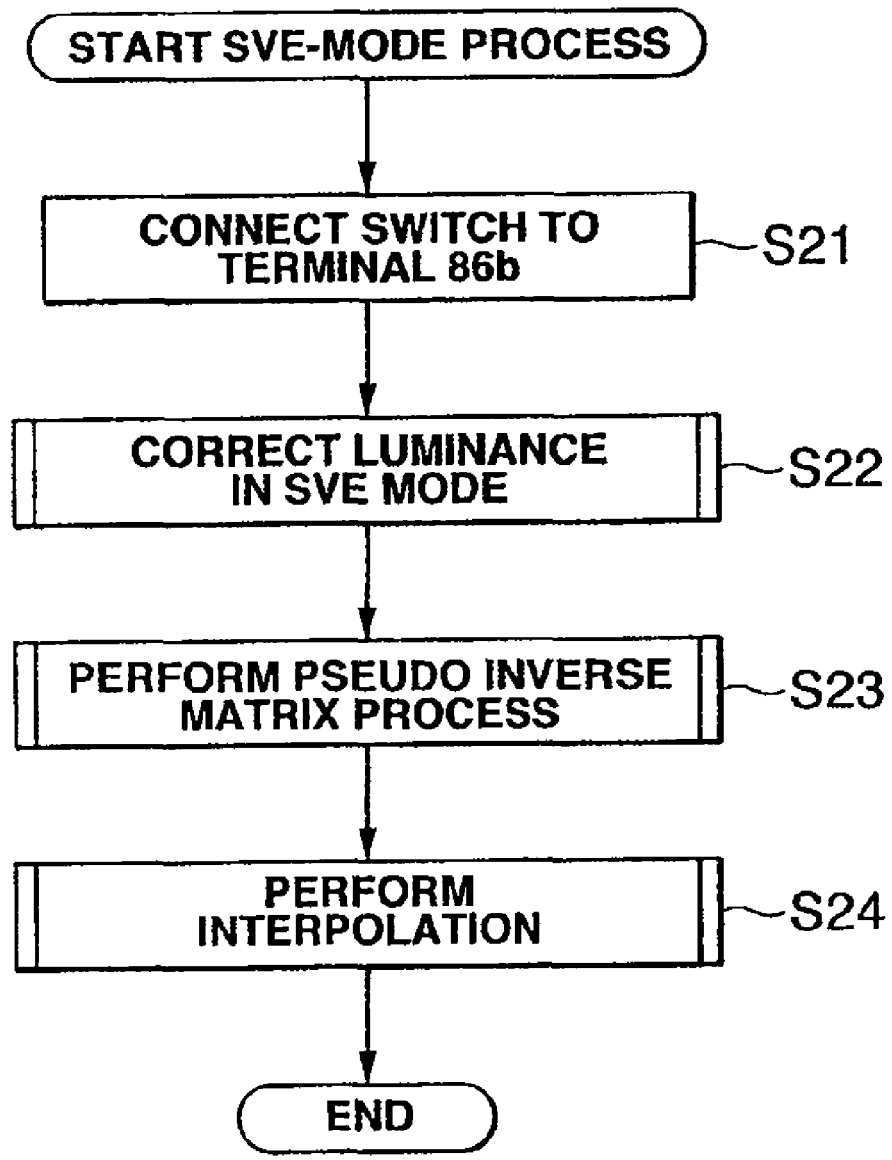
FIG. 30 is a flowchart explaining how the DSP operates in the SVE mode.

The flowchart of FIG. 30 will be referred to, again.

In Step S32, the DSP 27 executes pseudo inverse matrix process.

Figure 32:
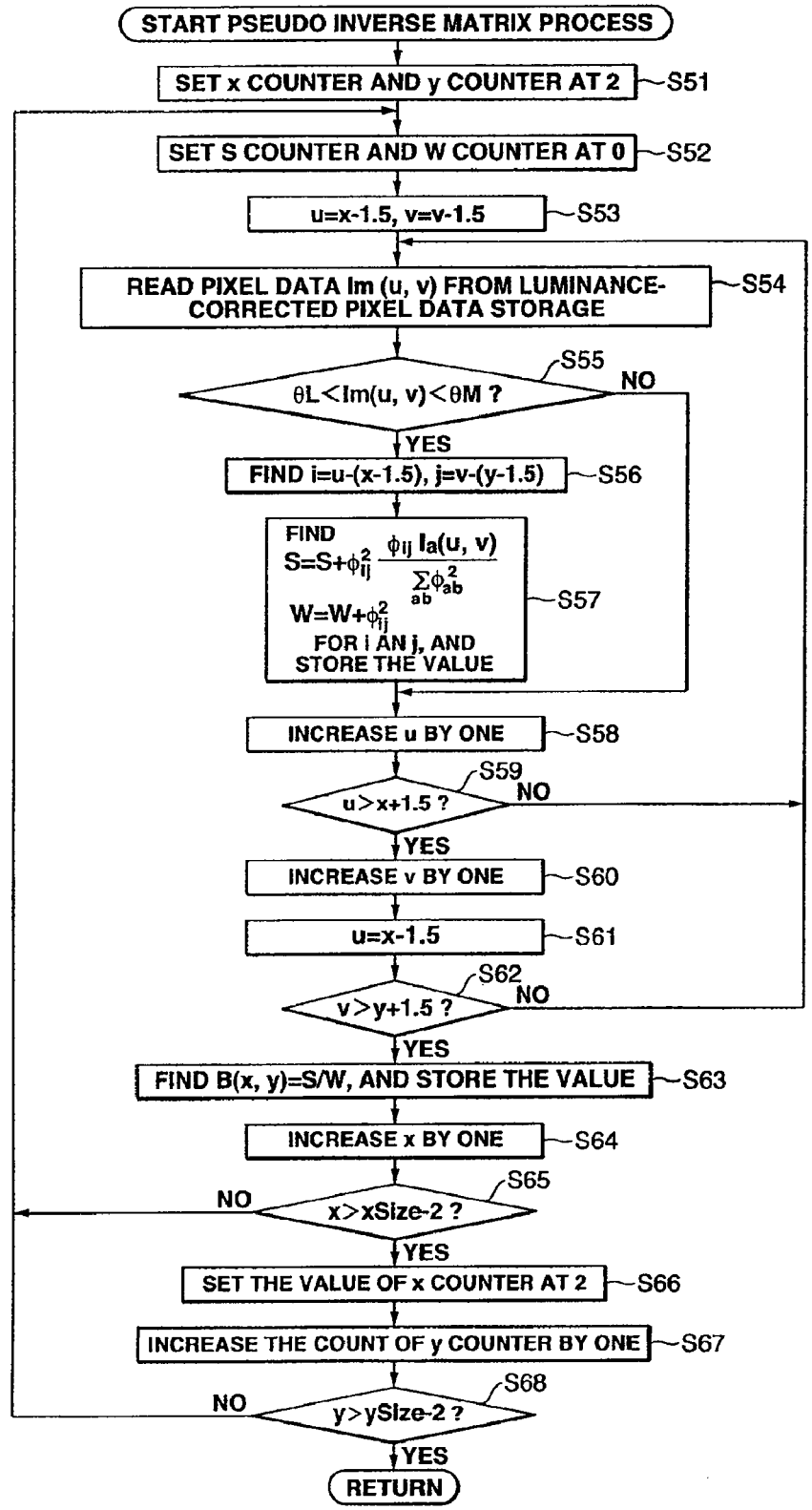
FIG. 32 is a flowchart explaining how a pseudo inverse matrix is processed.

The pseudo inverse matrix process will be described, with reference to the flowchart of FIG. 32.

In Step S51, the position generator 89 sets the counts of the x counter and y counter, which represent the coordinates of the intermediate pixel, at 2. In Step S52, the position generator 89 sets counter values S and W at 0. The counter values S and W will be described later.

In Step S53, the position generator 89 calculates counter values u and v. The counter values u and v represent the position of the pixel corresponding to luminance-corrected pixel data Im (u, v), where u=x−1.5 and v=y−1.5. Here, u=0.5 and v 0.5 because x=y=2.

Figure 33:
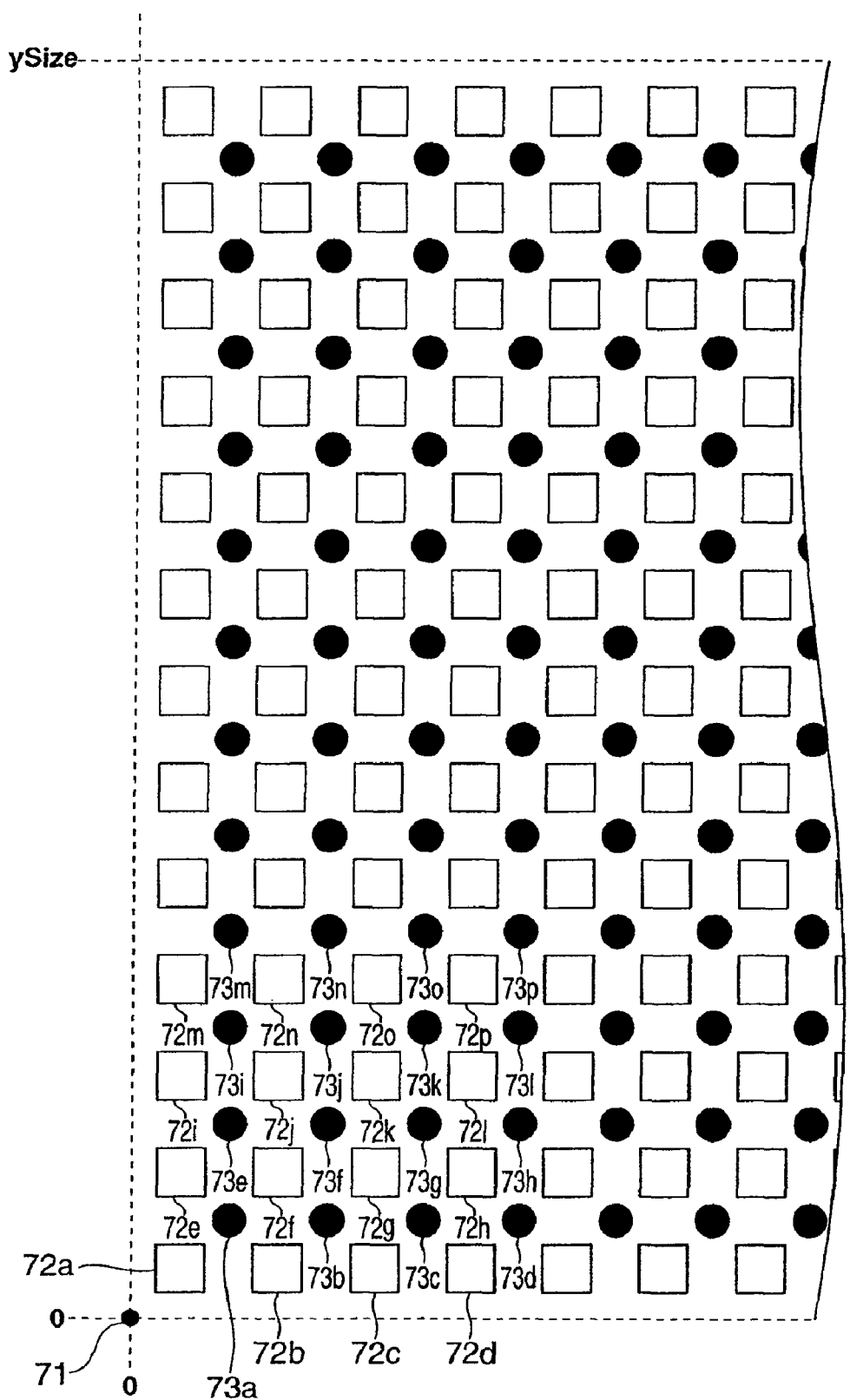
FIG. 33 is a diagram representing the relation between the pixels, on the one hand, and the intermediate pixels, on the other.

In Step S54, the pseudo inverse matrix processing section 88 reads the pixel data Im (u, v) that is stored in the luminance-corrected pixel data storage 87. The pixel data read is Im (0.5, 0.5), which represents the pixel 72a shown in FIG. 33. It should be noted that FIG. 33 illustrates the luminance-corrected pixel data.

In Step S55, the section 88 determines whether the pixel data Im (u, v) (i.e., luminance value) is greater than the noise-level threshold (L of the PD 8) and less than the saturation-level threshold (H of the PD 8). In other words, the section 88 determines whether the luminance value of the pixel data Im (0.5, 0.5) (i.e., the luminance of the pixel 72a) falls within an appropriate range.

In Step S56, the pseudo inverse matrix processing section 88 calculates counter values i and j as follows. Note that the values i and j indicate the position of a matrix element of the interpolation filter.

$$i = u - (x - 1.5)$$

$$j = v - (y - 1.5)$$

Thus, i=0(=0.5−(2−0.5)), J=0(=0.5−(2−0.5)).

In Step S57, the pseudo inverse matrix processing section 88 finds counter values S and W, using the following equations (1) and (2). The results of the operations into the memory are stored into the memory incorporated in the pseudo inverse matrix processing section 88.

$$S = S + \Phi_{ij}^2 \frac{\Phi ij \, \text{Im}(u, v)}{\sum_{ab} \Phi_{ab}^2} \quad (1)$$

$$W = W + \Phi_{ij}^2 \quad (2)$$

where Φij is an interpolation filter of the ordinary type illustrated in FIG. 34. More specifically, the counter values S and W are calculated as follows. In FIG. 34, "i" indicates the x-axis coordinate, and "j" the y-axis coordinate.

$$S = 0 + (\emptyset_{00}^2 \times \emptyset_{00} \times \text{Im}(0.5, 0.5)) / (\emptyset_{00}^2 + \emptyset_{01}^2 + \ldots \emptyset_{32}^2 + \emptyset_{33}^2) =$$

$$((0.043)^2 \times 0.043 \times \text{Im}(0.5, 0.5)) /$$

$$((0.043)^2 + (-0.661)^2 + \ldots (-0.661)^2 + (0.043)^2$$

$$W = \phi_{00}^2 = (0.043)^2$$

In Step S58, the position generator 89 increases the counter value u by one. Thus, the value u increases to 1.5. In Step S59, the position generator 89 determines whether the counter value u is greater than x+1.5. In this case, x+1.5 =3.5. Therefore, the counter value u (=1.5) is found to be less than x+1.5. The process returns to Step S54.

In Step S54, the pseudo inverse matrix processing section 88 reads the pixel data Im (u, v) from the luminance-corrected pixel data storage 87. In this case, the section 88 reads the data Im (1.5, 0.5) of the pixel 72b shown in FIG. 33.

Steps S56, S57 and S58 are repeated as described above. In Step S59, the position generator 89 may determine that the counter value u is greater than x+1.5. That is, it may be determined that the pixels 72a to 72d, all shown in FIG. 33, have been processed. If so, the position generator 89 increases the value v by one in Step S60. The counter value v therefore increases to 1.5. In Step S61, the position generator 89 changes the counter value u to x−1.5. In Step S62, the position generator 89 determines whether the counter value v has exceeded y+1.5. If the value v has not exceeded y+1.5, the process returns to Step S54.

In Step S62 the counter value v may be found to be greater than y+1.5. If so, in Step S63, the pseudo inverse matrix processing section 88 calculates S/W. The ratio S/W is stored, as intermediate pixel data, into the intermediate pixel data storage 90. In this instance, the least-squares method (=S/W) is applied to the data items Im about the pixels 72a to 72p that constitute a 4×4 matrix block. Intermediate pixel data B (2, 2) is thereby generated for the intermediate pixel 73f that lies at the center of the matrix block.

In Step S64, the position generator 89 increases the count of the x counter by one. In Step S65, the pseudo inverse matrix processing section 88 determines whether the count of the x counter is greater than xSize−2, or whether the value x represents a position outside the right side of the image. If the count of the x counter is found not to be greater than xSize−2, the process returns to Step S52. Steps S52 et seq. are repeated. If the count of the x counter is found to be greater than xSize−2, the process advances to Step S66.

In Step S66, the position generator 89 changes the count of the x counter back to 2. In Step S67, the position generator 89 increases the count of the y counter by one. In Step S68, the generator 89 determines whether the count of the y counter has exceeded ySize−2, or whether the value y represents a position outside the upper side of the image. If the count of the y counter is found to have exceeded ySize−2, the process is terminated. If it is determined in Step S68 that the count of the y counter has not exceeded ySize−2, the process returns to Step S52.

Thus, the data B (x, y) of the intermediate pixel 73 lying at the center of each 4×4 matrix block is generated in the pseudo inverse matrix process, by processing the image data Im (x, y) that is stored in the luminance-corrected pixel data storage 87.

To be more specific, the data B (2, 2) about the intermediate pixels 73f that lies at the center of the image consisting of pixels 72a to 72p (FIG. 33) is generated by the least-squares method (=S/W) from the pixel data items Im representing the block composed of pixels 72a to 72p. Each 4×4 pixel block is repeatedly moved to the right (in the x-axis direction), each time by the unit distance to generate the pixel data B (3, 2) representing the intermediate pixel 73g. When this process is performed for the pixel at the right side of the image, the 4×4 pixel block is moved in the x-axis direction, back to the left side (x=2), and then moved in the y-axis direction by the unit distance. The data B (2, 3) is thereby obtained for the intermediate pixel 73j. A similar sequence of operations is repeated, generating data items B for all intermediate pixels 73 of the entire image data. These data items B are stored into the intermediate pixel data storage 90.

The flowchart of FIG. 30 will be referred to again.

In Step S24, the DSP 27 carries out interpolation.

Figure 35:
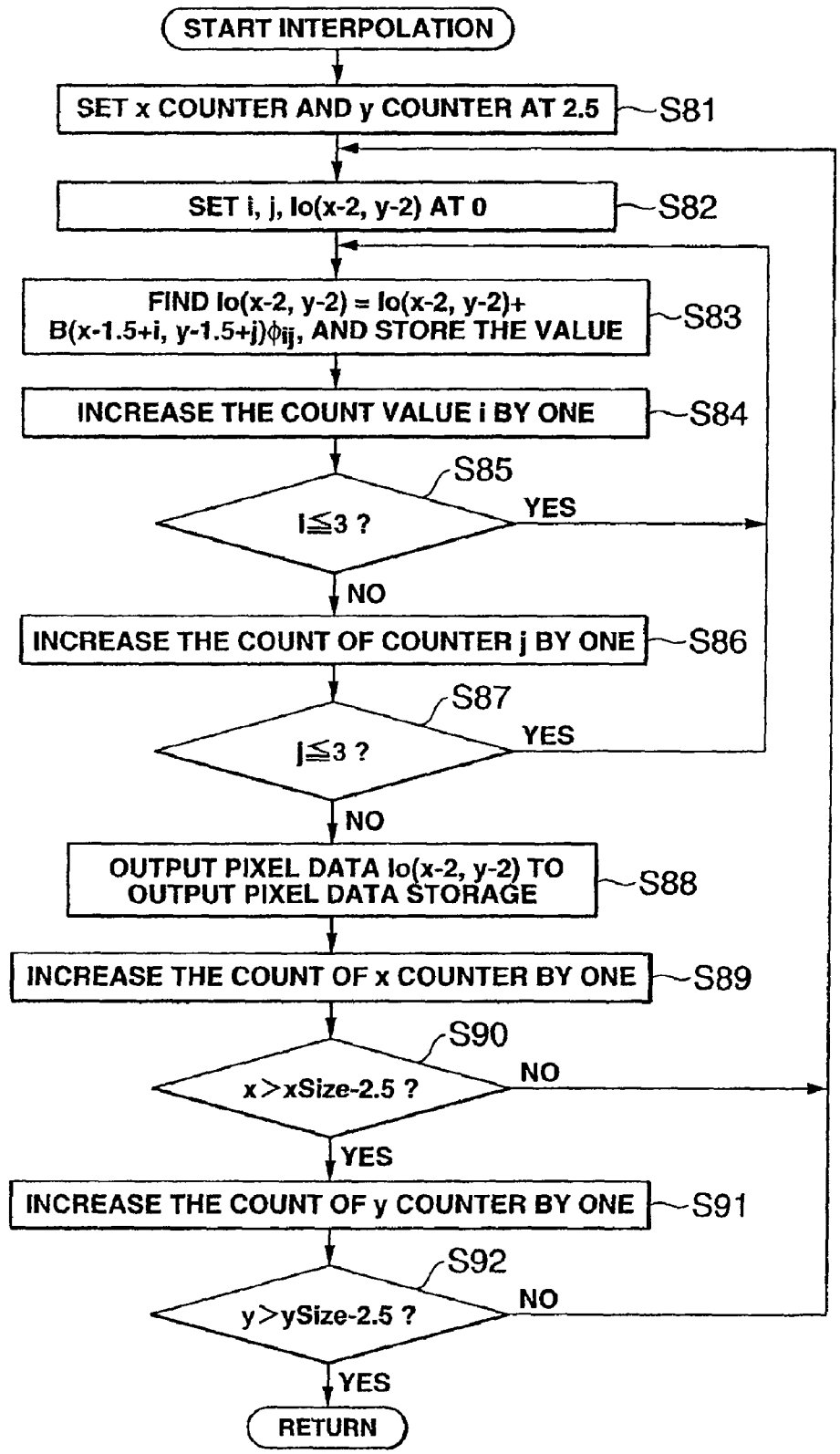
FIG. 35 is a flowchart explaining how the interpolation is carried out.

The interpolation will be described with reference to the flowchart of FIG. 35.

In Step S81, the position generator 92 sets the x counter and the y counter at a count value of 2.5. In Step S82, the position generator 92 sets the counter values i and j and the output pixel data Io (x−2, y−2) at "0." Note that the counter values i and j define the position that the interpolation filter Φ (FIG. 34) takes in the pixel matrix.

In Step S83, the interpolation section 91 reads the intermediate pixel data B (x−1.5+i, y−1.5+j) from the intermediate pixel data storage 90 and performs the following operation on the intermediate pixel data B:

$$Io(x-2,y-2)=Io(x-2,y-2)+B(x-1.5+i,y-1.5+j)\Phi ij$$

More precisely, the section 91 finds the output pixel data Io as follows:

$$Io(0.5,0.5)=0+B(1,1)\times 0.043$$

In Step S84, the position generator 92 increases the counter value i by one. In Step S85 the position generator 92 determines whether the value i is 3 or less. Since i=1, or less than 3, the process returns to Step S83.

In Step S83, the interpolation section 91 effects the following operation:

$$Io(0.5,0.5)=B(1,1)0.043+B(2,1)(-0.661)$$

In Step S84, the position generator 92 increases the counter value i by one. In Step S85, the interpolation section 91 determines whether i is equal to or less than 3 Since i 2, it is less than 3. Thus, the process returns to Step S83.

Steps S83 to S85 are repeated until it is determined in Step S85 that i is not equal to nor less than 3.

If it is determined in Step S85 that i is found not to be equal to nor less than 3, the process goes to Step S86. In Step S86, the position generator 92 increases the counter value j by one and changes the counter value i back to 0.

In Step S87, the position generator 92 determines whether the counter value j is equal to or less than 3. If the counter value j is found to be equal to or less than 3, the process returns to Step S83. If it is determined in Step S87 that the counter value j is not equal to nor less than 3, the process goes to Step S88. In Step S88, the interpolation section 91 outputs the image data Io (x−2, y−2) to the output pixel data storage 93. The image data is thereby stored into the data storage 93.

In Step S89, the position generator 92 increases the count of the x counter by one. In Step S90, the position generator 92 deteimines whether the count of the x counter has exceeded xSize−2.5. If the count of the x counter is found not to have exceeded xSize−2.5, the process returns to Step S82.

If it is determined in Step S90 that the count of the x counter has exceeded xSize−2.5, the process goes to Step S91. In Step S91, the position generator 92 increases the counter value y by one. In Step S92, the position generator 92 determines whether the count of the y counter has exceeded ySize−2.5. If the count of the y counter is found not to have exceeded ySize−2.5, the process returns to Step S82. If the value y is found to have exceeded ySize−2.5, the process is terminated.

As Steps S83 to S87 are repeated, the interpolation filter (shown in FIG. 34) processes, for example, the pixel data B representing the intermediate pixels 73a to 73p that are illustrated in FIG. 33. In this case, there is output the pixel data Io (2.5, 2.5) of the entire image, which corresponds to the pixel 72k shown in FIG. 33.

result, the coordinate position for the data Io has an offset of 2. (For example, Io (2.5, 2.5) is changed to Io (2.5−2, 2.5−2).

The pixels differ in sensitivity in the "SVE mode" as described above. It is therefore necessary to normalize the luminance value (pixel data) of each pixel in accordance with the sensitivity of the pixel. However, each pixel has but unstable sensitivity. Its luminance value may be greatly influenced by the noise level or may be by the saturation level. The normalization alone may not impart the initial luminance to the pixel in some cases. Therefore, pseudo inverse matrix processing is carried out, inferring the pixel value from the data about the neighboring pixels.

As indicated above, an electric charge is read from each PD 8 (light-receiving element) at any given time when the PD 8 accumulates the charge generated from the light the PD 8 has received. The light-receiving elements can, therefore, be set at different sensitivities. In addition, the light-receiving elements can accumulate charges at the same time. This makes it possible to photograph images of a broad dynamic range; i.e., dynamic scenes.

A read pulse can be supplied to each pixel in the horizontal direction, independently of a read pulse supplied to the pixel in the vertical direction. Freedom can be ensured, therefore, for the spatial pattern of sensitivity of the pixels. This makes it possible to photograph, at low cost, dynamic scenes reliably in a broad dynamic range.

A photographing device and a photographing method will be described, which can photograph, at a broad dynamic range, an image whose brightness changes from moment to moment like a moving picture.

The digital still camera used here and the CCD image sensor incorporated in this digital still camera have the same electrode arrangement as those of the digital still camera and the CCD image sensor that have been described above. The electrode arrangement will not be described in detail.

The camera and the CCD image sensor operate in the same way as those described above, when the exposure mode is "normal." They operate in a specific way when the exposure mode is "SVE." How this embodiment performs the exposure process in the SVE mode will be described below.

How the "exposure process" is carried out in the SVE mode will be described with reference to FIG. 36, on the assumption that the CCD image sensor 24 is of OR type. FIG. 36A explains how the CCD image sensor 24 operates. FIG. 36B shows a vertical sync pulse output from the timing generator 36. FIG. 36C depicts horizontal sync pulses output from the timing generator 36. FIG. 36D shows a substrate-voltage control signal. FIG. 36E illustrates the timing of opening and closing the shutter 21. FIG. 36F to 36K show the read pulses and transfer pulses output from the first-phase power supply 1, second-phase power supplies 2a, 2b and 2c and third-phase power supplies 3a and 3b. The following description is based on the assumption that, for brevity of explanation, the exposure process lasts for a period that corresponds to 16 horizontal sync pulses and each PD 8 accumulates an electric charge of 1Q during one interval of a horizontal sync pulse. It is also assumed that the light applied to the PDs 8 does not change in intensity.

When the exposure process starts at time t33, all PDs 8 start accumulating charges. FIG. 37 shows how the charge in each PD 8 accumulates. FIG. 37A shows the operation that the CCD image sensor 24 performs. FIG. 37B depicts the vertical sync pulse output from the timing generator 36. FIG. 37C depicts the horizontal sync pulse output-from the timing generator 36. FIG. 37D illustrates a substrate-voltage control signal. FIG. 37E shows the electric charges that the PDs 8*a* to 8*d* accumulate. FIG. 37F. shows the electric charges that the PDs 8*e* to 8*h* accumulate. The thick solid lines shown in FIG. 37 indicate the charges to be output from the PDs 8 to the vertical-transfer CCDs 7.

As FIG. 36K shows, the third-phase power supply 3*b* may output read pulses at time $t_{131}$, immediately before the second horizontal sync pulse is output. In this case, the PDs 8*e* to 8*h*, which are connected to the third-phase electrodes 6*a'* to 6*d'*, output charges, and the PDs 8*a* to 8*d*, which are connected to the third-phase electrodes 6*a* to 6*d*, do not output charges. Hence, the vertical-transfer CCDs 7 read charges of 2Q from the PDs 8*e* to 8*h*. Since no transfer pulses are output at this time, the charges output from the PDs 8*e* to 8*h* are accumulated in the registers that are associated with the PDs 8 provided on the vertical-transfer CCDs 7.

Thereafter, the third-phase power supply 3*b* outputs read pulses as shown in FIG. 36K, immediately before time $t_{132}$ when the fourth horizontal sync pulse is output and immediately before time $t_{133}$ when the sixth horizontal sync pulse is output. As FIG. 37F shows, a charge of 6Q is accumulated in the vertical-transfer CCD 7*b*.

As shown in FIGS. 36J and 36K, the third-phase power supplies 3*a* and 3*b* output read pulses immediately before time $t_{134}$ when the eighth horizontal sync pulse is output. Thus, the charges accumulated in all PDs 8*a* to 8*h* are supplied to the vertical-transfer CCDs 7. Since the PDs 8*a* to 8*d* have received no read pulses since time $t_{33}$, the charges of 8Q accumulated from $t_{33}$ to time $t_{134}$ are output to the vertical-transfer CCD 7*a*. Meanwhile, the PDs 8*e* to 8*h* output charges of 2Q to the vertical-transfer CCD 7*b*.

As FIG. 36J illustrates, the third-phase power supply 3*a* outputs a read pulse immediately before time $t_{135}$ when the tenth horizontal sync pulse is output. The PDs 8*a* to 8*d* connected to the third-phase electrodes 6*a* to 6*d* therefore output electric charges. Hence, as shown in FIG. 37E, charges of 2Q are applied from the PDs 8*a* to 8*d* to the vertical-transfer CCDs 7. No transfer pulses are output at this time. The charges output from the PDs 8*a* to 8*d* are therefore accumulated in the registers that are associated with the PDs 8 of the vertical CCDs 7.

Thereafter, as shown in FIG. 36J, the third-phase power supply 3*a* outputs read pulses immediately before time $t_{136}$ and time $t_{137}$ when the 12th horizontal sync pulse and the 14th horizontal sync pulse are output. The same process as described above is repeated.

As FIGS. 36J and 36K show, the third-phase power supplies 3*a* and 3*b* output read pulses immediately before time $t_{138}$ when the sixteenth horizontal sync pulse is output. The charges accumulated in all PDs 8*a* to 8*h* are therefore applied to the vertical-transfer CCDs 7. The PDs 8*a* to 8*d* output charges of 2Q to the vertical-transfer CCDs 7*a*. The PDs 8*e* to 8*h* have not received read pulses since time $t_{134}$ and therefore output to the vertical-transfer CCDs 7*b* the charges of 8Q they have accumulated during the period between time $t_{134}$ and time $t_{138}$. The charges accumulated between time $t_{33}$ and $t_{138}$ are added together in the vertical-transfer CCDs 7. Each vertical-transfer CCD 7 must have a charge-accumulating capacity that is n times as large as that of each PD 8, where n is the number of PDs 8 from which charges are applied to the vertical-transfer CCD 7.

As a result, the PDs 8*a* to 8*d* forming the left column in FIG. 16 perform photographing at high sensitivity between the time $t_{33}$ and time $t_{134}$. Hence, photographing is achieved at low sensitivity during the period from time $t_{134}$ to time $t_{138}$ On the other hand, the PDs 8*e* to 8*h* forming the right column in FIG. 16 perform photographing at low sensitivity between the time $t_{33}$ and time $t_{134}$. Hence, photographing is achieved at high sensitivity during the period from time $t_{134}$ to time $t_{138}$.

Thus, the PDs 8*a* to 8*h* serve to photograph the object 15 at high sensitivity if the object 15 is moving and, therefore, looks dark as a whole. The PDs 8*a* to 8*d* photograph the object 15 moving from the position 15*a'* to the position 15*c'* as shown in FIG. 38A during the period between the time $t_{33}$ and time $t_{134}$ (see FIG. 37E). The PDs 8*e* to 8*h* photograph the object 15 moving from the position 15*c'* to the position 15*b'* as shown in FIG. 38A during the period between the time t134 and time t138 (see FIG. 37F). The image photographed by the adjacent PDs 8*a* to 8*d* and the image photographed by the adjacent PDs 8*e* to 8*h* are combined to provide such an image as is illustrated in FIG. 38B.

If the object 15 is bright as a whole, the PDs 8*a* to 8*h* photograph the object 15 at low sensitivity. More precisely, the PDs 8*a* to 8*d* photograph the object 15 moving from the position 15*a"* to the position 15*c"* as shown in FIG. 39A during the period between the time $t_{33}$ and time $t_{134}$ (see FIG. 37F). The PDs 8*e* to 8*h* photograph the object 15 moving from the position 15*c"* to the position 15*b"* as shown in FIG. 39A during the period between the time $t_{134}$ and time $t_{138}$ (see FIG. 37E). In this case, too, the image photographed by the adjacent PDs 8*a* to 8*d* and the image photographed by the adjacent PDs 8*e* to 8*h* are combined. Thus, such an image as is illustrated in FIG. 39B is provided.

This photographing technique can provide a moving picture of an object that changes in brightness from moment to moment.

The CCD image sensor 24 hitherto described is an OR-type one. The OR-type CCD image sensor may be replaced by an AND-type one in the present invention. Additionally, the read pulses that control the accumulation of charges in the PDs 8 may be replaced by the pulses of the substrate-voltage control signal.

The sensitivity (exposure time) of each PD 8 is changed in two patterns in the embodiment described above. The sensitivity may be changed in more patterns, for example, in four patterns.

It will be described how the sensitivity of the PDs 8 is changed in four patterns. FIG. 40 is a timing chart explaining how the sensitivity of each PD 8 is changed in four pattern in the CCD image sensor 24 that is an AND-type and operated in the SVE mode.

FIG. 40A illustrates how the CCD image sensor 24 operates. FIG. 40B shows a vertical sync pulse output from the timing generator 36. FIG. 40C shows the horizontal sync pulses output from the timing generator 36. FIG. 40D depicts a substrate-voltage control signal. FIG. 40E represents the timing of opening and closing the shutter 21. FIGS. 40F to 40K show the read pulses and transfer pulses output from the first-phase power supply 1, second-phase power supplies 2*a*, 2*b* and 2*c* and third-phase power supplies 3*a* and 3*b*.

When the exposure process starts at time $t_{33}$, all PDs 8 begin to accumulate charges. FIG. 41 shows how the charge in each PD 8 accumulates in this case. FIG. 41A shows the operation that the CCD image sensor 24 performs. FIG. 41B depicts the vertical sync pulse output from the timing generator 36. FIG. 41C depicts the horizontal sync pulse output from the timing generator 36. FIG. 41D illustrates a substrate-voltage control signal. FIGS. 41E to 41H shows the electric charges that the PDs 8a, 8e, 8b and 8f accumulate.

As FIGS. 40I and 40J show, the second-phase power supply 2c and the third-phase power supply 3a may output read pulses at time $t_{151}$, immediately before the first horizontal sync pulse is output. In this case, the PD 8b, which is connected to the second-phase electrodes 5b and the third-phase electrodes 6b, outputs a charge. Thus, the PD 8b applies a charge of 1Q to the vertical-transfer CCDs 7 as is illustrated in FIG. 41G.

As FIGS. 40O, 40H and 40K show, the second-phase power supplies 2a and 2b and the third-phase power supply 3b output read pulses at time t152, immediately before the second horizontal sync pulse is output. Then, the PD 8e, which is connected to the second-phase electrodes 5a and the third-phase electrodes 6a', outputs a charge. As a result, the PD 8e applies a charge of 2Q to the vertical-transfer CCDs 7 as is illustrated in FIG. 41F.

Thereafter, the PD 8b outputs charges of 2Q, 4Q and 9Q at time $t_{153}$, time $t_{156}$ and time $t_{18}$, respectively, when the second-phase power supplies 2c and the third-phase power supply 3a output read pulses. The PD 8e outputs charges of 4Q, 9Q and 1Q at time $t_{155}$, time $t_{162}$ and time $t_{18}$, when the second-phase power supplies 2b and the third-phase power supply 3b output read pulses. Further, the PD 8a outputs charges of 4Q, 9Q, 1Q and 2Q at time $t_{154}$, time $t_{160}$, time $t_{161}$ and time $t_{18}$, when the second-phase electrodes 2b and the third-phase electrode 3a output read pulses. Moreover, the PD 8f outputs charges of 9Q, 1Q, 2Q and 4Q at time $t_{157}$, time $t_{158}$, time $t_{159}$ and time $t_{18}$, when the second-phase electrode 2c and the third-phase electrode 3b output read pulses.

The changes in the charges output from the PDs 8 have been explained in conjunction with the PDs 8a, 8b, 8e and 8f only. Nonetheless, all PDs 8 are controlled in the same way as the PDs 8a, 8b, 8e and 8f that constitute a 2×2 matrix. Therefore, the PDs 8c, 8d, 8g and 8h constituting another 2×2 matrix are controlled in the same manner as the PDs 8a, 8b, 8e and 8f, in terms of the charges they accumulate.

Figure 42:
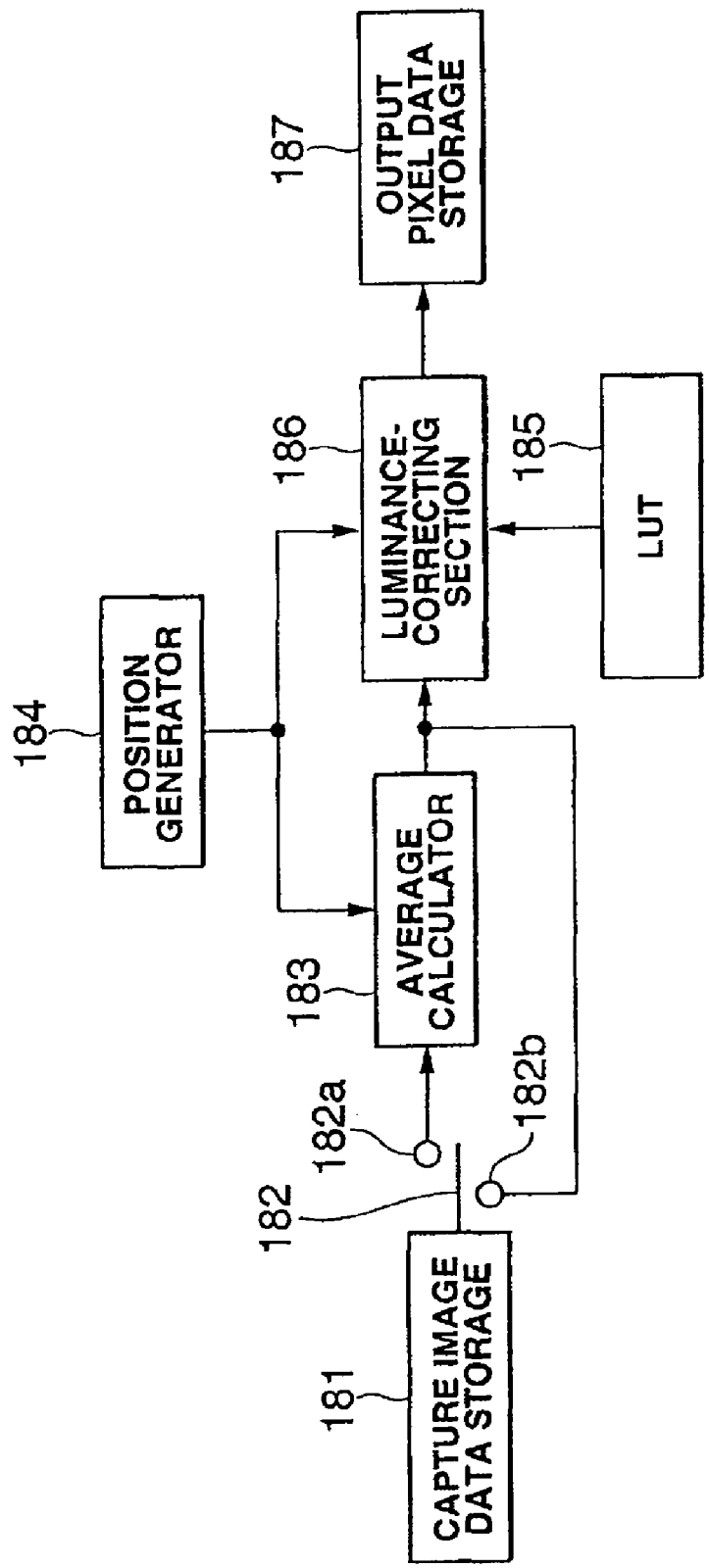
FIG. 42 is a block diagram showing the DSP provided in a digital still camera according to the present invention.

The DSP 27 that processes the image signals generated by the CCD image sensor 24 will be described with reference to FIG. 42.

The DSP 27 has a capture image data storage 181 and a switch 182. The capture image data storage 181 stores the pixel data Ic generated by the CCD image sensor 24 and processed by the CDS circuit 25 and the A/D converter circuit 26. The switch 182 is controlled by the CPU 34. The switch 182 is connected to a terminal 182a in the SVE mode. Since the terminal 182a is connected to an average calculator 183, the image data Ic stored in the capture image data storage 181 is therefore output to the average calculator 183 through the switch 182 in the SVE mode. In the normal mode, the switch 182 is connected to a terminal 182b, which is connected to a luminance-correcting section 186. Hence, in the normal mode, the image data, Ic stored in the capture image data storage 181 is output to the luminance-correcting section 186.

In the SVE mode, the average calculator 183 receives adjacent two of the pixel data items Ic stored in the capture image data storage 181 and finds the average of the two pixel data items. The calculator 183 receives coordinate data from a position generator 184 and generates a pixel data Ii (x, y) from the coordinate data. The pixel data Ii is output to the luminance-correcting section 186. The position generator 184 incorporates counters that count x- and y-axis coordinates of the pixel data Ic read into the DSP 27. The position generator 184 generates data items representing the positions of pixels. These data items are supplied to both the average calculator 183 and the luminance-correcting section.

This is because the pixel data Ic is supplied to the luminance-correcting section 186 in the normal mode, and to the average calculator 183 in the SVE mode.

A LUT (Look-up table) 185 stores data for achieving gamma correction on the pixel image data Ic stored in the capture image data storage or the pixel data Ii generated by the average calculator 183.

The luminance-correcting section 186 refers to the LUT 185 and generates gamma-corrected pixel data Io (x, y) from the pixel data Ic stored in the capture image data storage 181 or the image data Ii supplied from output of the average calculator 183. The pixel data Io (x, y) is stored into an output pixel data storage.

Figure 43:
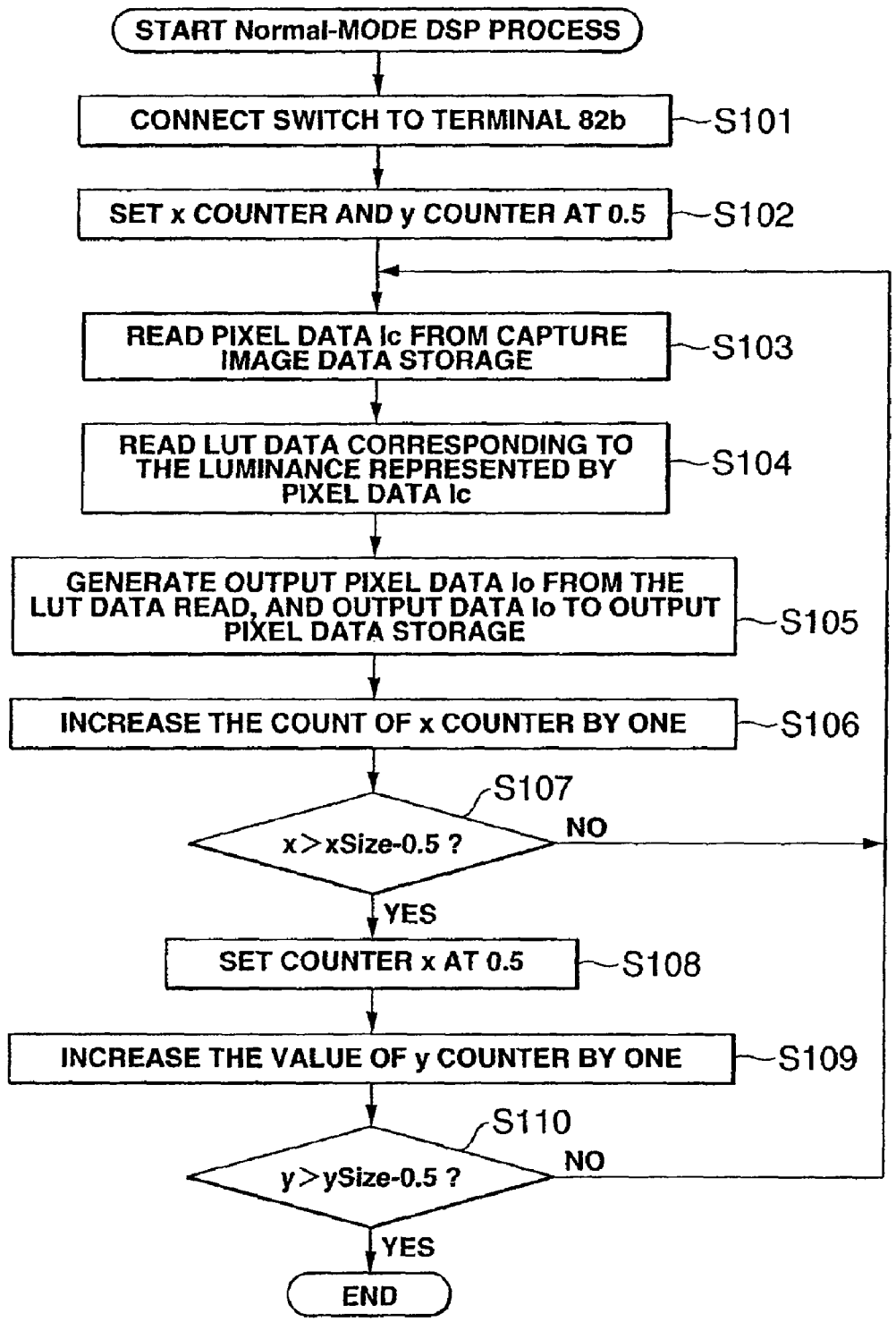
FIG. 43 is a flowchart explaining how the DSP performs in the normal mode.

How the DSP 27 operates in the normal mode will be explained with reference to the flowchart of FIG. 43. The image photographed by the CCD image sensor 24 has a width xSize and a height ySize. The image consists of pixels, each having a width of 1 and a height of 1. The coordinates of each pixel represent the center of the pixel. Thus, if the origin is the lower-left corner of the image, the pixel at the center of the lower-left corner is represented by coordinates (0.5, 0.5).

The pixel data items have been acquired in the PDs 8 that are provided in the CCD image sensor 24.

In Step S101, the switch 182 is connected to the terminal 182b when the exposure mode switch 43 is set at the "normal" position.

In Step S102, the position generator 184 initializes the counts of the x counter and y counter at 0.5. In Step S103, the luminance-correcting section 186 reads the pixel data Ic stored in the capture image data storage 181. The luminance-correcting section combines the pixel data with the coordinate data generated by the position generator 184, thus generating pixel data Ic (x, y). The first data that the section 186 outputs is pixel data Ic (0.5, 0.5).

In Step S104, the luminance-correcting section 186 reads, from the LUT 185, the gamma-correction data that corresponds to the luminance of the pixel data Ic (x, y). In Step S105, the luminance-correcting section 186 performs gamma correction on the pixel data Ic (x, y) in accordance with the gamma-correction data read from the LUT 185, thereby generating output pixel data to (x, y). The pixel data Io (x, y) is output to the output pixel data storage 187.

In Step S106, the position generator 184 increases the count of the x counter by one. In Step S107, the position generator 184 determines whether x is greater than xSize−0.5, or x>xSize−0.5. In other words, it determines whether the count of the x counter has exceeded the maximum value in the width direction of the image. If the count has not exceeded xSize−0.5, the process returns to Step S103.

If it is determined in Step S107 that the count has exceeded xSize−0.5, the process goes to Step S108. In Step S108, the position generator 184 changes the count of the x counter back to 0.5. In Step S109, the position generator 184 increases the count of the y counter by one. In Step S110, the position generator 184 determines whether the count of the y counter is greater than ySize−0.5, or y>ySize−0.5. In other words, the position generator 184 determines whether the count of the y counter has exceeded the maximum value in the height direction of the image. If the count has not exceeded ySize−0.5, the process returns to Step S103, and Step S103 et seq. are repeated. If it is determined in Step S110 that the count of the y counter has exceeded ySize−0.5, the process is terminated.

As indicated above, the DSP operates in the normal mode, performing gamma correction on each pixel by using the LUT 185, and outputting the pixel data thus corrected.

Figure 44:
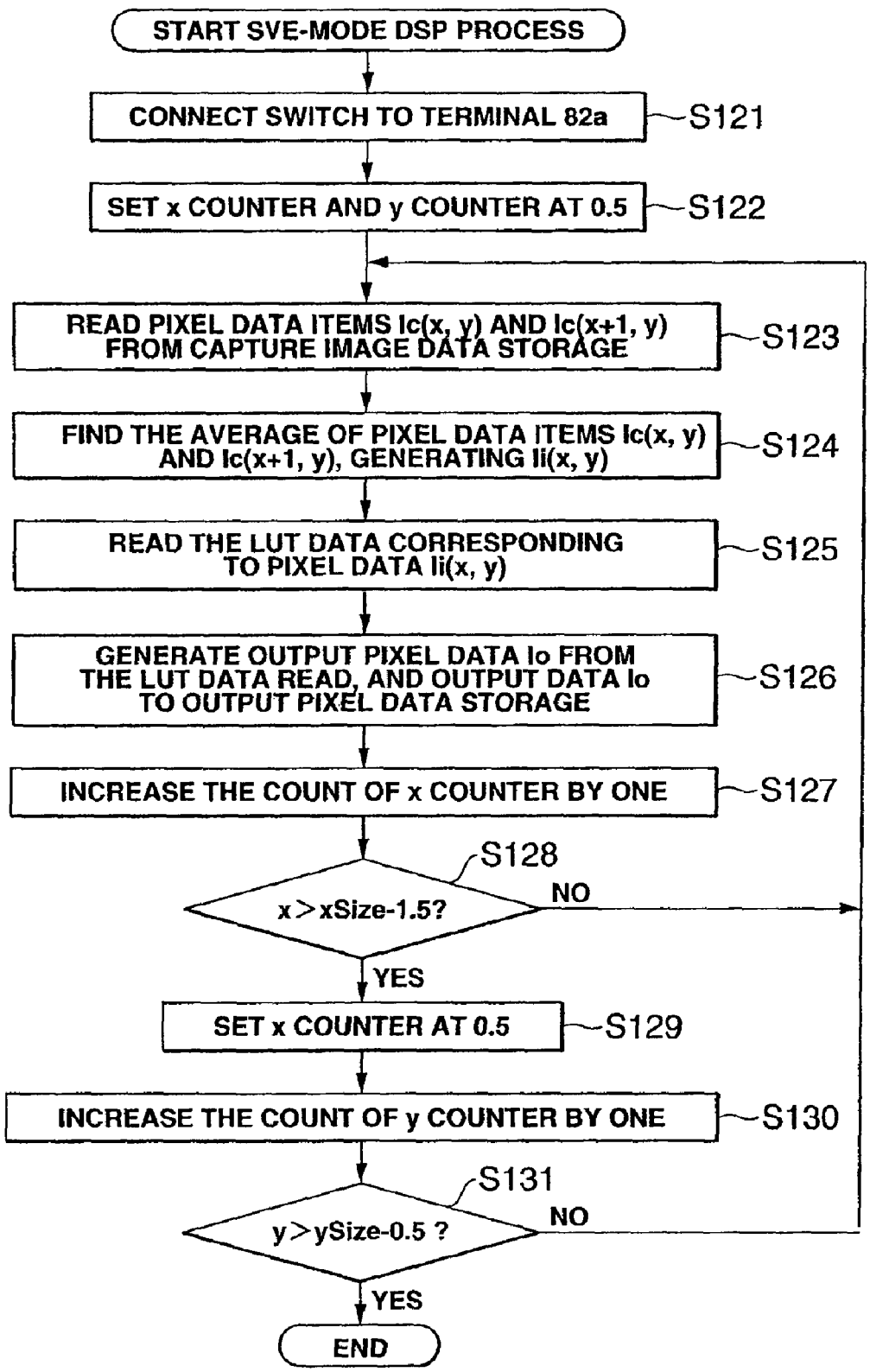
FIG. 44 is a flowchart explaining how the DSP performs in the SVE mode.

It will be described how the DSP 27 operates in the SVE mode, with reference to the flowchart of FIG. 44.

In Step S121, the switch 182 is connected to the terminal 182a when the exposure mode switch 43 is set at the "SVE" position.

In Step S122, the position generator 184 initializes the counts of the x counter and y counter at 0.5. In Step S123, the average calculator 183 reads the pixel data Ic (x, y) and the adjacent pixel data Ic (x+1, y), both stored in the capture image data storage 181.

In Step S124, the average calculator 183 finds the average of the pixel data Ic (x, y) and pixel data Ic (x+1, y), generating new pixel data Ii (x, y) (=1/2{Ic (x, y)+Ic (x+1, y)}). The new pixel data Ii (x, y) is output to the luminance-correcting section 186.

In Step S125, the luminance-correcting section 186 reads, from the LUT 185, the gamma-correction, LUT data that corresponds to the luminance of the pixel data Ii (x, y). In Step S126, the luminance-correcting section 186 performs gamma correction on the pixel data Ii (x, y) in accordance with the gamma-correction, LUT data read from the LUT 185, thereby generating output pixel data Io (x, y). The output pixel data Io (x, y) is supplied to the output pixel data storage 187.

In Step S127, the position generator 184 increases the count of the x counter by one. In Step S128, the position generator 184 determines whether x is greater than xSize−1.5, or x>xSize−1.5. In other words, it determines whether the count of the x counter has exceeded the maximum value in the width direction of the image. (The maximum value for the count x is not xSize−0.5; it is the coordinates that represents the position of the pixel adjacent to the pixel in question). If the count has not exceeded xSize−1.5, the process returns to Step S123.

If it is determined in Step S128 that the count x has exceeded xSize−1.5, the process goes to Step S129. In Step S129, the position generator 184 changes the count of the x counter, back to 0.5. In Step S130, the position generator 184 increases the count of the y counter by one. In Step S131, the position generator 184 determines whether the count of the y counter is greater than ySize−0.5, or y>ySize−0.5. In other words, the position generator 184 determines whether the count of the y counter has exceeded the maximum value in the height direction of the image. If the count has not exceeded ySize−0.5, the process returns to Step S123, and Step S123 et seq. are repeated. If it is determined in Step S131 that y has exceeded ySize−0.5, the process is terminated.

Thus, the DSP operates in the "SVE mode," obtaining the average of the adjacent pixels, and performing gamma correction on each pixel by using the LUT 185, and outputting the pixel data thus corrected.

As described above, three second-phase electrodes are provided, and two third-phase electrodes are provided. Nonetheless, more second-phase electrodes may be used, and more third-phase electrodes may be used, so that the sensitivity of each PD 8 may be changed in more patterns.

Furthermore, since the exposure timing may be changed for adjacent pixels (PDs 8) in the photographing process, it is possible to photograph an image that changes in brightness from moment to moment, like a moving picture.

In the present invention, the charges accumulated in the light-receiving elements are read at any given time while the light-receiving elements are receiving light. Hence, it is possible to impart different sensitivities to the light-receiving elements. Dynamic scenes can, therefore, be photographed in a broad dynamic range.

In the present invention, a number of vertical-transfer registers transfer the charges accumulated in light-receiving elements, and a first drive-voltage applying electrode arranged parallel to the vertical-transfer registers and second drive-voltage applying electrode arranged perpendicular to the vertical-transfer registers applies a drive voltage to specified ones of the vertical-transfer registers. Read pulses can, therefore, be supplied to each pixel, independently in the horizontal direction and the vertical direction. Thus, freedom is ensured for the spatial pattern of sensitivity of the pixels, in both the horizontal direction and the vertical direction. This makes it possible to photograph dynamic scenes reliably in a broad dynamic range.

In the present invention, the charges accumulated in light-receiving elements are read. More precisely, the charges accumulated in the light-receiving elements are read at any given time while the light-receiving elements are receiving light. The adjacent pixels can, therefore, be exposed to light at different times to photograph an object. Hence, it is possible to photograph images that change in light intensity every moment, like moving pictures.

Although the present invention has been described with reference to specific embodiments, those of skill in the art will recognize that changes may be made thereto without departing from the spirit and scope of the present invention as set forth in the hereafter appended claims.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An imaging system comprising:
   an array of pixels;
   a controller configured to:
      operate a first group of pixels in the array via a first set of readout pixels using a first integration time to generate a first image;
      operate a second group of pixels in the array via a second set of readout pixels using a second integration time to generate a second image;
      operate a third group of pixels in the array via a third set of readout pixels using a third integration time to generate a third image;
      operate a fourth group of pixels in the array via a fourth set of readout pixels using a fourth integration time to generate a fourth image; and
      read out the first, second, third, and fourth images from the pixel array,
   wherein the first, second, third, and fourth groups of pixels are arranged in blocks, each block including a pixel from each of the first, second, third, and fourth groups of pixels.

2. The imaging system according to claim 1, wherein each block is a 2×2 matrix of adjacent pixels.

3. The imaging system according to claim 1, wherein the first, second, third, and fourth integration times are different pixel exposure times.

* * * * *